(12) United States Patent
Brask et al.

(10) Patent No.: US 7,105,390 B2
(45) Date of Patent: Sep. 12, 2006

(54) NONPLANAR TRANSISTORS WITH METAL GATE ELECTRODES

(75) Inventors: Justin K. Brask, Portland, OR (US); Brian S. Doyle, Portland, OR (US); Mark L. Doczy, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/750,061

(22) Filed: Dec. 30, 2003

(65) Prior Publication Data

US 2005/0148137 A1 Jul. 7, 2005

(51) Int. Cl.
*H01L 21/00* (2006.01)
*H01L 21/84* (2006.01)
*H01L 21/8238* (2006.01)
*H01L 21/336* (2006.01)

(52) U.S. Cl. .................. 438/149; 438/199; 438/283

(58) Field of Classification Search ................ 438/149, 438/199, 197, 157, 283, 303, 231, 275
See application file for complete search history.

(56) References Cited

U.S. PATENT DOCUMENTS

| | | | |
|---|---|---|---|
| 5,338,959 A | 8/1994 | Kim et al. |
| 5,346,839 A | 9/1994 | Sundaresan |
| 5,545,586 A | 8/1996 | Koh |
| 5,563,077 A | 10/1996 | Ha |
| 5,578,513 A | 11/1996 | Maegawa |
| 5,658,806 A | 8/1997 | Lin et al. |
| 5,716,879 A | 2/1998 | Choi et al. |
| 6,376,317 B1 | 4/2002 | Forbes et al. |
| 6,413,802 B1 | 7/2002 | Hu et al. |
| 6,475,869 B1 | 11/2002 | Yu |
| 6,475,890 B1 | 11/2002 | Yu |
| 6,483,156 B1 | 11/2002 | Adkisson et al. |
| 6,525,403 B1 | 2/2003 | Inaba et al. |
| 6,562,665 B1 | 5/2003 | Yu |
| 6,611,029 B1 | 8/2003 | Ahmed et al. |
| 6,635,909 B1 | 10/2003 | Clark et al. |
| 6,645,797 B1 | 11/2003 | Buynoski et al. |

(Continued)

FOREIGN PATENT DOCUMENTS

EP 0 623 963 A1 11/1994

(Continued)

OTHER PUBLICATIONS

V. Subramanian et al., "A Bulk-Si-Compatible Ultrathin-body SOI Technology for Sub-100m MOSFETS" Proceeding of the 57th Annual Device Research Conference, pp. 28-29 (1999).

(Continued)

*Primary Examiner*—Walter L. Lindsay, Jr.
(74) *Attorney, Agent, or Firm*—Blakely, Sokoloff, Taylor & Zafman LLP

(57) ABSTRACT

A semiconductor device comprising a semiconductor body having a top surface and a first and second laterally opposite sidewalls as formed on an insulating substrate. A gate dielectric is formed on the top surface of the semiconductor body and on the first and second laterally opposite sidewalls of the semiconductor body. A gate electrode is then formed on the gate dielectric on the top surface of the semiconductor body and adjacent to the gate dielectric on the first and second laterally opposite sidewalls of the semiconductor body. The gate electrode comprises a metal film formed directly adjacent to the gate dielectric layer. A pair of source and drain regions are uniformed in the semiconductor body on opposite sides of the gate electrode.

36 Claims, 30 Drawing Sheets

U.S. PATENT DOCUMENTS

| | | | |
|---|---|---|---|
| 6,680,240 | B1 | 1/2004 | Maszara |
| 6,706,571 | B1 | 3/2004 | Yu et al. |
| 6,709,982 | B1 | 3/2004 | Buynoski et al. |
| 6,716,684 | B1 | 4/2004 | Krivokapic et al. |
| 6,730,964 | B1 | 5/2004 | Horiuchi |
| 6,764,884 | B1 | 7/2004 | Yu et al. |
| 6,858,478 | B1 * | 2/2005 | Chau et al. .................. 438/149 |
| 6,921,982 | B1 | 7/2005 | Joshi et al. |
| 2002/0011612 | A1 | 1/2002 | Hieda |
| 2002/0036290 | A1 | 3/2002 | Inaba et al. |
| 2002/0081794 | A1 | 6/2002 | Ito |
| 2002/0166838 | A1 | 11/2002 | Nagarajan |
| 2002/0167007 | A1 | 11/2002 | Yamazaki et al. |
| 2003/0057486 | A1 | 3/2003 | Gambino et al. |
| 2003/0098488 | A1 | 5/2003 | O'Keeffe et al. |
| 2003/0122186 | A1 | 7/2003 | Sekigawa et al. |
| 2003/0151077 | A1 | 8/2003 | Mathew et al. |
| 2003/0201458 | A1 | 10/2003 | Clark et al. |
| 2004/0036118 | A1 | 2/2004 | Adadeer et al. |
| 2004/0036127 | A1 | 2/2004 | Chau et al. |
| 2004/0092062 | A1 | 5/2004 | Ahmed et al. |
| 2004/0092067 | A1 | 5/2004 | Hanafi et al. |
| 2004/0094807 | A1 | 5/2004 | Chau et al. |
| 2004/0110097 | A1 | 6/2004 | Ahmed et al. |
| 2004/0126975 | A1 | 7/2004 | Ahmed et al. |
| 2004/0132567 | A1 * | 7/2004 | Schonnenbeck ............. 474/69 |
| 2004/0166642 | A1 | 8/2004 | Chen et al. |
| 2004/0180491 | A1 | 9/2004 | Arai et al. |
| 2004/0191980 | A1 | 9/2004 | Rios et al. |
| 2004/0198003 | A1 | 10/2004 | Yeo et al. |
| 2004/0238887 | A1 | 12/2004 | Nihey |
| 2004/0256647 | A1 | 12/2004 | Lee et al. |
| 2004/0262683 | A1 | 12/2004 | Nihey |
| 2004/0262699 | A1 | 12/2004 | Rios et al. |
| 2005/0127362 | A1 | 6/2005 | Zhang et al. |
| 2005/0145941 | A1 | 7/2005 | Bedell et al. |

FOREIGN PATENT DOCUMENTS

| | | |
|---|---|---|
| EP | 1 202 335 A | 5/2002 |
| JP | 2002298051 | 10/2003 |
| WO | WO 02/43151 A | 5/2002 |
| WO | WO 2004/059726 A1 | 7/2004 |

OTHER PUBLICATIONS

Hisamoto et al., "A Folded-channel MOSFET for Deepsub-tenth Micron Era", 1998 IEEE International Electron Device Meeting Technical Digest, pp. 1032-1034 (1998).

Huang et al., "Sub 50-nm FinFET: PMOS", 1999 IEEE International Electron Device Meeting Technical Digest, pp. 67-70 (1999).

Auth et al., "Vertical, Fully-Depleted, Surroundings Gate MOSFETS On sub-0.1um Thick Silicon Pillars", 1996 54th Annual Device Research Conference Digest, pp. 108-109 (1996).

Hisamoto et al., "A Fully Depleted Lean-Channel Transistor (DELTA)—A Novel Vertical Ultrathin SOI MOSFET", IEEE Electron Device Letters, V. 11(1), pp. 36-38 (1990).

Jong-Tae Park et al., "Pi-Gate SOI MOSFET" IEEE Electron Device Letters, vol. 22, No. 8, Aug. 2001, pp. 405-406.

Hisamoto, Digh et al. "FinFET- A Self-Aligned Double-Gate MOSFET Scalable to 20 nm", IEEE Transactions on Electron Devices, vol. 47, No. 12, Dec. 2000, pp. 2320-2325.

International Search Report PCT/US 03/26242.

International Search Report PCT/US 03/39727.

International Search Report PCT/US 03/40320.

Burenkov, A. et al., "Corner Effect in Double and Triple Gate FINFETs", European Solid-State Device Research, 2003 33rd Conference on Essderc '03 Sep. 2003, Piscataway, NJ, USA, IEEE, pp. 135-138, XP010676716.

Chang, S.T. et al, "3-D Simulation of Strainded Si/SiGe Heterojunction FinFETS", Semiconductor Device Research Symposium, 2003 International, Dec. 2003, Piscataway, NJ, USA, IEEE, pp. 176-177, XP010687197.

International Search Report PCT/US2005/033439, mailed Jan. 31, 2006 (7 pgs.).

International Search Report PCT/US2005/035380, mailed Feb. 13, 2006 (14 pgs.).

International Search Report PCT/US2005/037169, mailed Feb. 23, 2006 (11 pgs.).

Sung Min Kim, et al., A Novel Multi-channel Field Effect Transistr (McFET) on Bulk Si for High Performance Sub-80nm Application, IEDM 04-639, 2004 IEEE, pp. 27.4.1-27.4.4.

Yang-Kyu Choi, et al., "A Spacer Patterning Technology for Nanoscale CMOS" IEEE Transactions on Electron Devices, vol. 49, No. 3, Mar. 2002, pp. 436-441.

W. Xiong, et al., "Corner Effect in Multiple-Gate SOI MOSFETs" 2003 IEEE, pp. 111-113.

Weize Xiong, et al., "Improvement of FinFET Electrical Characteristics by Hydrogen Annealing" IEEE Electron Device Letters, vol. 25, No. 8, Aug. 2004, XP-001198998, pp. 541-543.

Fu-Liang Yang, et al., "5nm-Gate Nanowire FinFET" 2004 Symposium on VLSI Technology Digest of Technical Papers, 2004 IEEE, pp. 196-197.

Jing Guo, et al. "Performance Projections for Ballistic Carbon Nanotube Field-Effect Transistors", Applied Physics Letters, vol. 80, No. 17, pp. 3192-3194 (Apr. 29, 2004).

Ali Javey, et al., "High-K Dielectrics for Advanced Carbon-Nanotube Transistors and Logic Gates", Advance Online Publication, Published online, pp. 1-6 (Nov. 17, 2002).

Richard Martel, et al., "Carbon Nanotube Field Effect Transistors for Logic Applications" IBM, T.J. Watson Research Center, 2001 IEEE, IEDM 01, pp. 159-162.

David M. Fried, et al., "High-Performance P-Type Independent-Gate FinFETs, IEEE Electron Device Letters", vol. 25, No. 4, Apr. 2004, pp. 199-201.

David M. Fried, et al., "Improved Independent Gate N-Type FinFET Fabrication and Characterization", IEEE Electron Device Letters, vol. 24, No. 9, Sep. 2003, pp. 592-594.

Charles Kuo, et al. "A Capacitorless Double Gate DRAM Technology for Sub-100-nm Embedded and Stand-Alone Memory Applications", IEEE Transactions on Electron Devices, vol. 50, No. 12, Dec. 2003, pp. 2408-2416.

Charles Kuo, et al., "A Capacitorless Double-Gate DRAM Cell Design for High Density Applications", 2002 IEEE International Electron Devices Meeting Technical Digest, Dec. 2002, pp. 843-846.

Takashi Ohsawa, et al., "Memory Design Using a One-Transistor Gain Cell on SOI", IEEE Journal of Solid-State Circuits, vol. 37, No. 11, Nov. 2002, pp. 1510-1522.

T. Tanaka, et al., "Scalability Study on a Capacitorless 1T-DRAM: From Single-Gate PD-SOI to Double-Gate FinDRAM", 2004 IEEE International Electron Devices Meeting Technical Digest, Dec. 2004, 4 pages.

T. M. Mayer, et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.

* cited by examiner

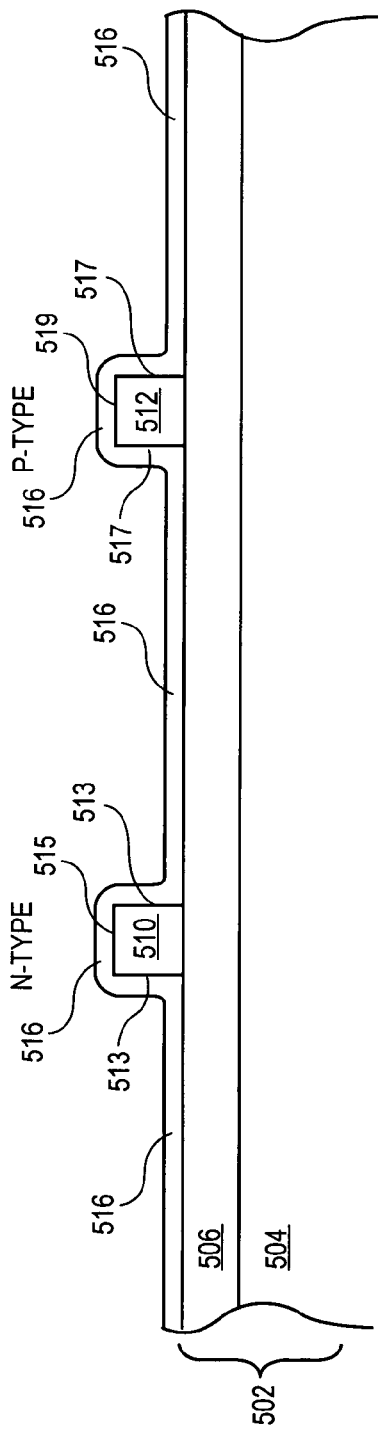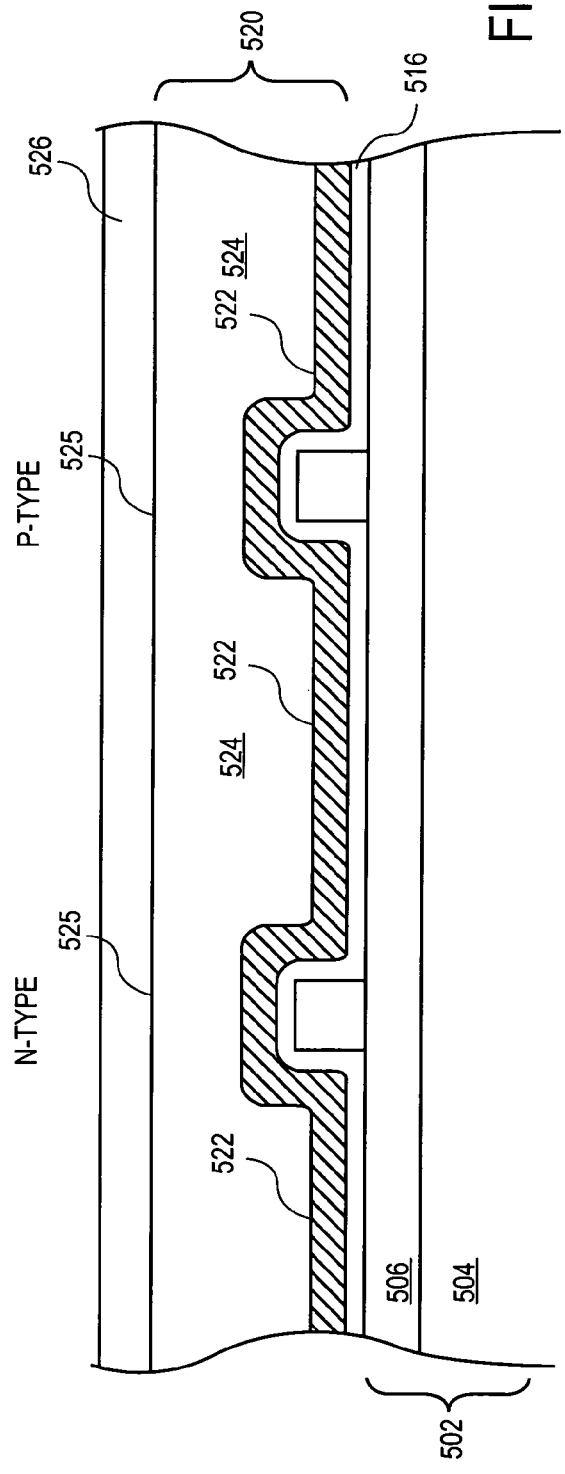

NONPLANAR TRANSISTORS WITH METAL GATE ELECTRODES

BACKGROUND OF THE INVENTION

1. Field of the Invention

The present invention relates to the field of semiconductor integrated circuit manufacturing, and more particularly to CMOS integrated circuits with p type and n type nonplanar transistors with metal gate electrodes and its methods of fabrication.

2. Discussion of Related Art

In order to increase device performance, silicon on insulator (SOI) transistors have been proposed for the fabrication of modern integrated circuits. FIG. 1 illustrates a standard fully depleted silicon on insulator (SOI) transistor 100. SOI transistor 100 includes a single crystalline silicon substrate 102 having an insulating layer 104, such as a buried oxide formed thereon. A single crystalline silicon body 106 is formed on the insulating layer 104. A gate dielectric layer 108 is formed on the single crystalline silicon body 106 and a gate electrode 110 formed on the gate dielectric 108. Source 112 and drain 114 regions are formed in the silicon body 106 along laterally opposite sides of a polysilicon gate electrode 110.

Fully depleted SOI have been proposed as a transistor structure to take advantage of ideal sub-threshold gradients for optimized on current/off current ratios. In order to achieve ideal subthreshold gradients with transistor 100, the thickness of the silicon body 106 must be about ⅓ the size of the gate length (Lg) of the transistor or Tsi=Lg/3. However, as gate lengths scale especially as they approach 30 nm, the need forever decreasing silicon film thickness (Tsi) makes this approach increasingly impractical. At 30 nanometer gate length, the thickness required of the silicon body is thought to need to be less than 10 nanometers, and around 6 nanometer for a 20 nanometer gate length. The fabrication of thin silicon films with thicknesses of less than 10 nanometers, is considered to be extremely difficult. On one hand, obtaining wafer uniformity on the order of one nanometer is a difficult challenge. On the other hand, to be able to contact these thin films to form raised source/drain regions to decrease junction resistance, becomes almost impossible since the thin silicon layer in the source/drain regions becomes consumed during the gate etch and various cleans following the gate etch and spacer etch leaving insufficient silicon 106 for silicon to grow on.

A double gate (DG) device, such as shown in FIGS. 2A and 2B, have been proposed to alleviate the silicon thickness issue. The double gate (DG) device 200 includes a silicon body 202 formed on an insulating substrate 204. A gate dielectric 206 is formed on two sides of the silicon body 202 and a polysilicon gate electrode 208 is formed adjacent to the gate dielectric 206 formed on the two sides of the silicon body 202. A sufficiently thick insulating layer 209, such as silicon nitride, electrically isolates the gate electrode 208 from the top of silicon body 202. Double gate (DG) device 200 essentially has two gates, one on either side of the channel of the device. Because the double gate device 200 has a gate on each side of the channel, thickness ($T_{si}$) of the silicon body can be double that of a single gate device and still obtain a fully depleted transistor operation. That is, with a double gate device 200 a fully depleted transistor can be formed where $T_{si}=(2 \times Lg)/3$. The most manufacturable form of the double gate (DG) device 200, however, requires that the body 202 patterning be done with photolithography that is 0.7× smaller than that used to pattern the gate length (Lg) of the device. In order to obtain high density integrated circuits, it is generally desirable to have the most aggressive lithography occur with respect to the gate length (Lg) of the gate electrode 208. Although, double gate structures double the thickness of the silicon film (since there now is a gate on either side of the channel) these structures, however, are hideously difficult to fabricate. For example, silicon body 202 requires a silicon body etch which can produce a silicon body 202 with an aspect ratio (height to width) of about 5:1.

Another problem associated with transistors 100 and 200 shown in FIG. 1 and FIGS. 2A and 2B, is that the gate electrodes are typically formed from a doped polycrystalline silicon film. Polysilicon gate electrodes suffer from the formation of charge carrier depletion regions also known as "poly depletion". That is, when a voltage is applied to the polycrystalline gate electrode, a depletion region 120 and 220 forms in the lower part of the polycrystalline gate electrode adjacent to the gate dielectric layer 108 and 206 respectively. The result in affect is an increase in the electrical thickness of the gate dielectric layer. For example, in order to fabricate a transistor, such as shown in FIG. 1, with a 90 nanometer gate length, a 14 Å thick silicon oxide dielectric layer is necessary for optimal electrical performance. However, in such a device, the poly depletion region 120 can be on the order of 5 Å thereby essentially increasing the electrical thickness (Tox) of the gate dielectric layer by 33%. Such an increase in the gate dielectric electrical thickness dramatically reduces the performance of the fabricated transistor. It is to be appreciated, that as device dimensions are scaled down, in order to integrate an ever larger number of transistors into a single integrated circuit in the electrical thickness of the gate oxide layer must also be proportionally scaled down. Poly depletion effects hinder the ability to further scale down transistor dimensions.

BRIEF DESCRIPTION OF THE DRAWINGS

FIGS. 5A–5L illustrate a method of fabricating a CMOS integrated circuit having a n type nonplanar transistor with a metal gate electrode and a p type nonplanar transistor with a metal gate electrode utilizing a subtractive fabrication process.

DETAILED DESCRIPTION OF THE PRESENT INVENTION

Figure 1:
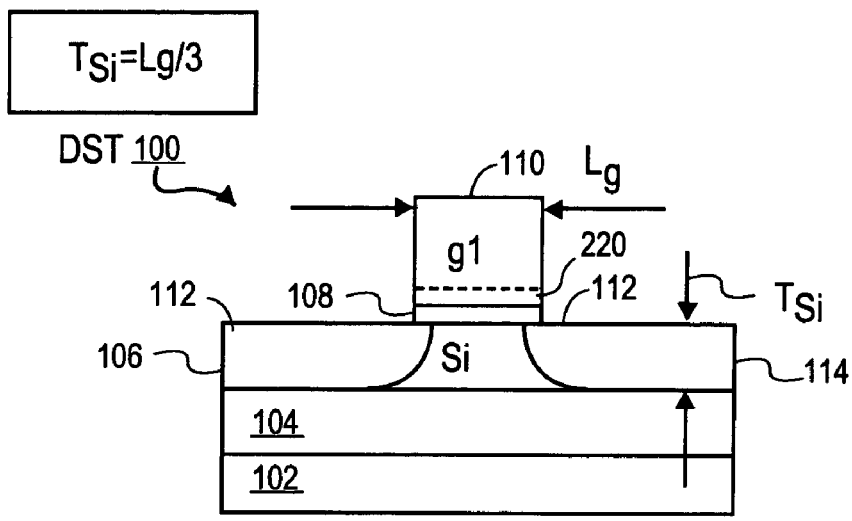
FIG. 1 is an illustration of a cross-sectional view of a depleted substrate transistor
Figure 2A:
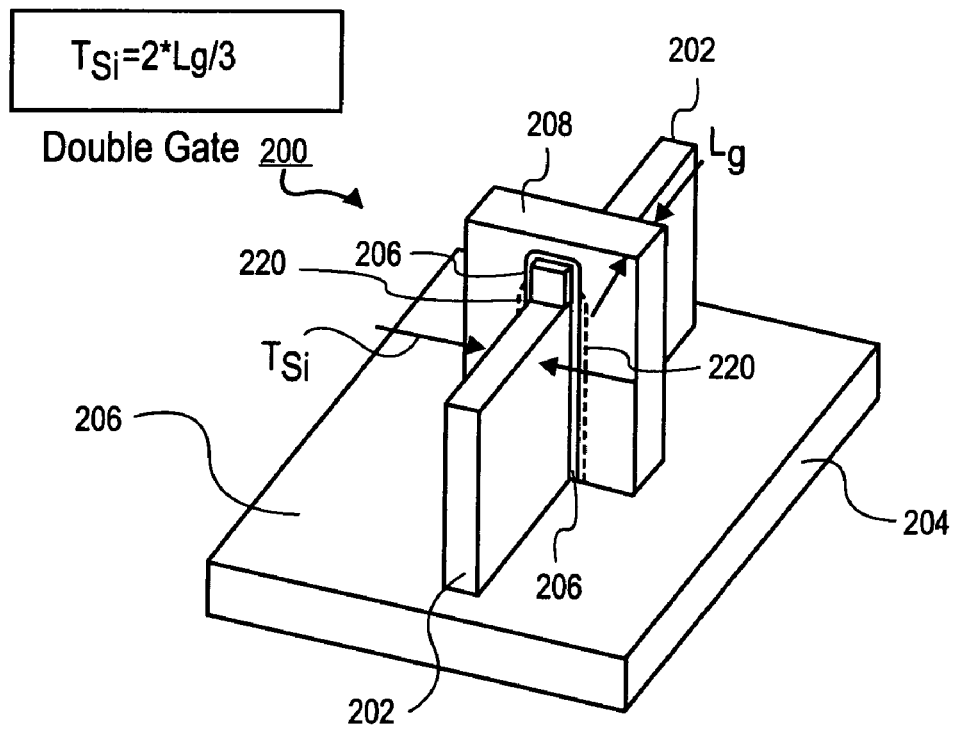
FIGS. 2A and 2B illustrate a double gate depleted substrate transistor.
Figure 2B:
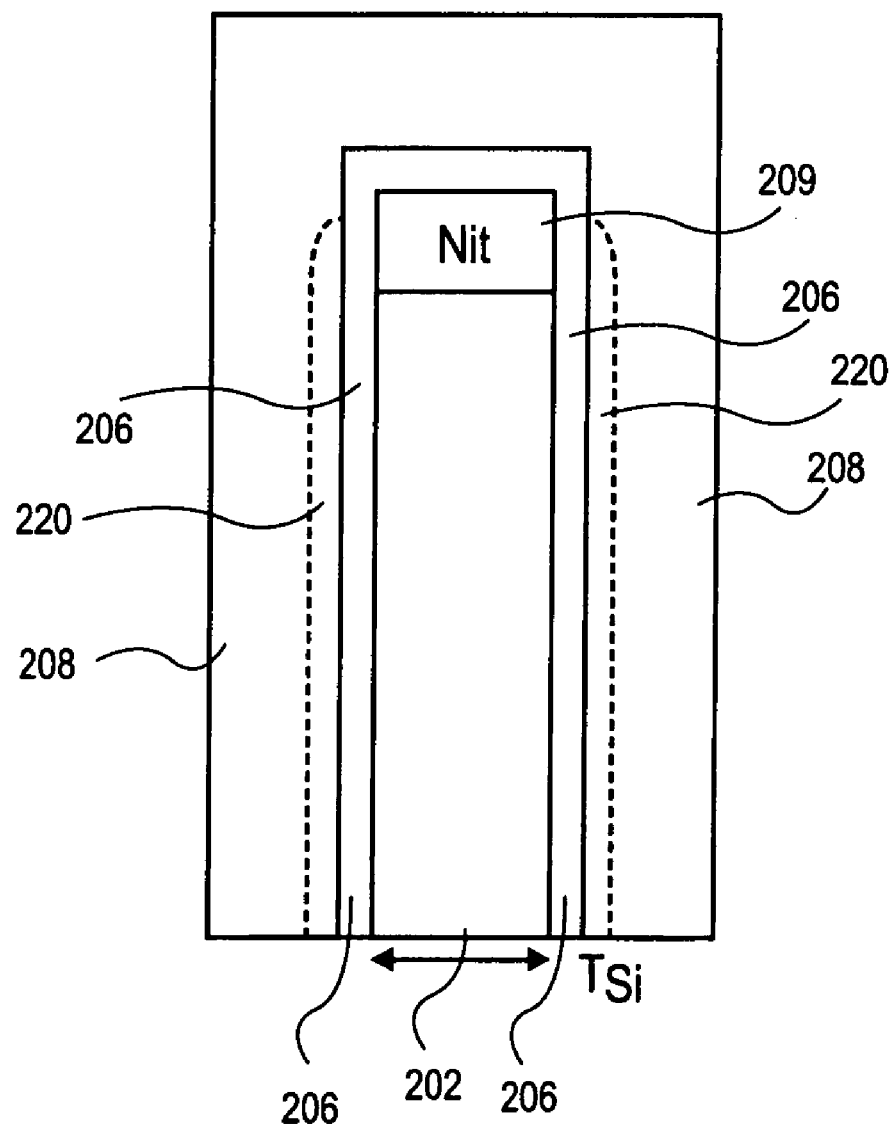

A nonplanar transistor having a gate electrode comprising a lower metal layer is described. In the following description numerous specific details are set forth in order to provide a thorough understanding of the present invention. In other instances, well known semiconductor processing techniques and features have not been described in particular detail in order to not unnecessarily obscure the present invention.

The present invention is a novel nonplanar transistor having a metal gate electrode. A nonplanar device includes a semiconductor body having a top surface and laterally opposite sidewalls formed on a substrate. A gate dielectric is formed on the top surface and on the sidewalls of the channel region of the semiconductor body. A metal gate electrode is then formed around the semiconductor body so that it covers the top surface and two sides of the semiconductor body. Since the gate electrode covers the semiconductor body on three sides the transistor essentially has three gate electrodes, one on the top of the semiconductor body and one on each of the sidewalls of the semiconductor body. Such a nonplanar transistor can be referred to as a trigate transistor since it essentially has three gate electrodes. Because the channel region of the semiconductor body is covered by the gate electrode on three sides, the electrical field provided by the gate electrode can easily fully deplete the channel region of the device. Fully depleted transistors have advantageous electrical characteristics, such as increased drive current as well as low leakage current. The nonplanar device of the present invention has a metal gate electrode. A metal gate electrode prevents charge carrier depletion phenomenon associated with conventional polysilicon gate electrodes. The use of a metal gate electrode reduces the $T_{ox}$ or electrical thickness of the effective gate dielectric which thereby improves the electrical performance of the device.

A nonplanar transistor with a metal gate electrode in accordance with the present invention can be fabricated with a subtractive approach or a replacement gate approach. In a subtractive approach, the gate electrode material including a lower metal film is blanket deposited over the insulating substrate and semiconductor body. The gate electrode material is then patterned into a gate electrode utilizing standard photolithography and etching techniques. A disadvantage of the subtractive approach is that when forming both PMOS and NMOS device on the same insulating substrate, the gate electrode for each of the devices will be formed from the gate electrode material which is typically a material having a midgap work function. Utilizing a single material for both the PMOS and NMOS devices as opposed to a material tailored for the NMOS device and a material tailored for the PMOS device is a compromise in that it does not optimize the overall electrical performance of each of the devices.

In an alternative embodiment of the present invention, a replacement gate technique is utilized to form the gate electrodes. A replacement gate technique allows different metal films to be used for the gate electrodes for the PMOS and NMOS transistors. In this way, the PMOS device can have a gate electrode with a work function that is tailored for the PMOS device and the NMOS transistor can have a gate electrode with a work function tailored for the NMOS device. In this way, both the NMOS and PMOS electrical characteristics and performance are optimized. In a replacement gate technique a sacrificial gate electrode and gate dielectric is formed over the semiconductor body. Standard source and drain doping and formation techniques including sidewall spacers can then be formed. A dielectric layer is then blanket deposited over the sacrificial gate electrode and the semiconductor body. The dielectric layer is then polished back to expose the top surface of the gate electrode. The sacrificial gate electrode can then be removed to form a trench or opening which defines where the gate electrode is to be formed. A metal film is then blanket deposited over the insulating substrate and into the trench and over the semiconductor body in the trench. The metal film is then polished back to form the gate electrode for the device.

In an embodiment of the present invention, the sacrificial gate electrode for the NMOS device and/or the PMOS device is altered so that one of the sacrificial gate electrode can be removed or etched away without removing the other sacrificial gate electrodes. In this way, the sacrificial gate electrode for one device (e.g., NMOS) can be removed without removing the sacrificial gate electrode for the second device (e.g., PMOS device) and then replaced with the gate electrode designed for the first device (e.g., NMOS device). The sacrificial gate electrode over the other device (i.e., PMOS device) can then be removed and replaced with a metal film tailored to the electrical characteristics desired for the PMOS device. In this way, NMOS and PMOS devices with different gate electrodes can be formed on the same insulating substrate and thereby enable high performance CMOS integrated circuits to be fabricated.

Figure 3:
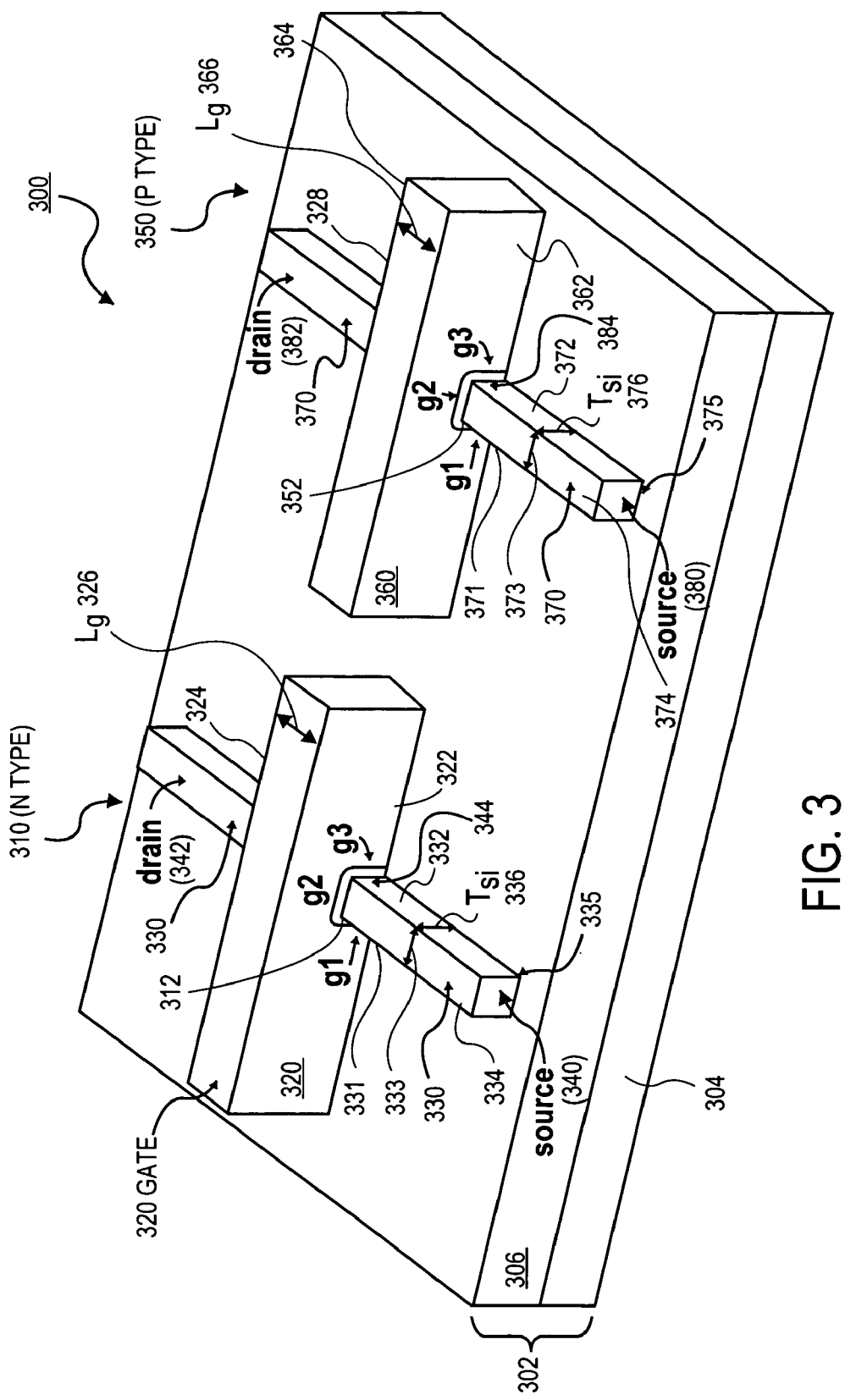
FIG. 3 is an illustration of a CMOS integrated circuit comprising a nonplanar n type transistor having a metal gate electrode and a nonplanar p type transistor having a metal gate electrode.

An example of a nonplanar transistors in accordance with the present invention are illustrated in FIG. 3. FIG. 3 shows a portion of a complimentary metal oxide semiconductor (CMOS) integrated circuit 300 which includes both an n type nonplanar transistor 310 with a metal gate electrode 320 and p type nonplanar transistor 350 with a metal gate electrode formed on an insulating substrate 302. An n type transistor 310 is a field effect transistor where the carriers are electrons and a p type transistor 350 is a transistor where the carriers are holes. N type transistor 310 and p type transistor 350 coupled together through higher levels of metallization into a functional CMOS circuit. According to the present invention, n type transistor 310 has a metal gate electrode 312 and p type transistor 350 has metal gate electrode 352. Although, a CMOS integrated circuit 300 is shown and described with respect to FIG. 3, the present invention is not limited to a CMOS integrated circuit and can include circuits which include only p type non-planar transistors with a metal gate electrodes or only n type nonplanar transistors with metal gate electrodes.

CMOS integrated circuit 300 can be formed on an insulating substrate 302. In an embodiment of the present invention, insulating substrate 302 includes a lower monocrystalline silicon substrate 304 upon which formed in insulating layer 306, such as a silicon dioxide film. Integrated circuit 300, however, can be formed on any suitable insulating substrate, such as substrates formed from silicon dioxide, nitrides, oxides, and sapphires.

Additionally, in an embodiment of the present invention, substrate 302 need not necessarily be an insulating substrate can be a well known semiconductor substrate, such as but not limited to a monocrystalline silicon substrate and gallium arsenide substrate.

N type nonplanar transistor 310 includes a semiconductor body 330 formed on insulating layer 306 of insulating substrate 302 and p type nonplanar transistor 350 includes a semiconductor body 370 formed on insulating layer 306 of insulating substrate 302. Semiconductor bodies 330 and 370 can be formed of any well known semiconductor material, such as but not limited to silicon, germanium, silicon germanium ($Si_xGe_y$), gallium arsenide (GaAs), InSb, GaP, GaSb, and carbon nanotubes. Semiconductor bodies 330 and 370 can be formed of any well know material which can be reversely altered from an insulating state to a conductive state by applying external electrical controls. Semiconductor bodies 330 and 370 are ideally a single crystalline film when the best electrical performance of transistors 310 and 350 is desired. For example, semiconductor bodies 330 and 370 are single crystalline films when CMOS integrated circuit 300 is used in high performance applications, such as in high density circuits, such as a microprocessor. Semiconductor bodies 330 and 370, however, can be a polycrystalline films when CMOS integrated circuit 300 is used in applications requiring less stringent performance, such as in liquid crystal displays. Insulating layer 306 insulates semiconductor bodies 330 and 370 from the monocrystalline silicon substrate 302. In an embodiment of the present invention, semiconductor bodies 330 and 370 are single crystalline silicon films.

Semiconductor body 330 has a pair of laterally opposite sidewalls 331 and 332 separated by distance which defines a semiconductor body width 333. Additionally, semiconductor body 330 has top surface 334 opposite a bottom surface 335 formed on substrate 302. The distance between the top surface 334 and the bottom surface 335 defines the body height 336. In an embodiment of the present invention. The body height 336 is substantially equal to the body width 335. In an embodiment of the present invention, the body 330 has a width 333 and a height 336 less than 30 nanometers and ideally less than 20 nanometers. In an embodiment of the present invention, the body height 336 is between one half the body width 333 to two times the body width 333.

Similarly, semiconductor body 370 has a pair of laterally opposite sidewalls 371 and 372 separated by a distance 373 which defines a semiconductor body width 373. Additionally, semiconductor body 370 has a top surface 374 opposite a bottom surface 375 formed on substrate 302. The distance between the top surface 374 and the bottom surface 375 defines the body height 376. In an embodiment of the present invention, the body height 376 is substantially equal to the body width 373. In an embodiment of the present invention, the body 376 is substantially equal to the body width 373. In an embodiment of the present invention, the body 370 has a width 373 and a height 376 less than 30 nanometers and ideally less than 20 nanometers. In an embodiment of the present invention the body height 376 is between one half the body width 373 to two times the body width 373.

N type nonplanar transistor 310 has a gate dielectric layer 312. Gate dielectric layer 312 is formed on and around three sides of semiconductor body 330 as shown in FIG. 3. Gate dielectric layer 312 is formed on or adjacent to sidewall 331, on the top surface 334, and on or adjacent to sidewall 332 of body 330 as shown in FIG. 3. Similarly, nonplanar p type transistor 350 has a gate dielectric layer 352. Gate dielectric layer 352 is formed on and around three sides of semiconductor body 370 as shown in FIG. 3. Gate dielectric layer 352 is formed on or adjacent to sidewall 371, on the top surface 374 and on or adjacent to sidewall 372 of body 370 as shown in FIG. 3. Gate dielectric layers 312 and 352 can be formed from any well known gate dielectric films. In an embodiment of the present invention, the gate dielectric layers are silicon dioxide ($SiO_2$), silicon oxynitride ($SiO_xN_y$), or a silicon nitride ($Si_3N_4$) dielectric layer or combinations thereof. In an embodiment of the present invention, the gate dielectric layer 312 and 352 are a silicon oxynitride film formed to a thickness between 5–20 Å. In an embodiment of the present invention, the gate dielectric layer 312 and 352 are a high K gate dielectric layer, such as a metal dielectric, such as but not limited to tantalum oxide, titanium oxide, hafnium oxide, zirconium oxide, aluminum oxide, and silicate thereof. In an embodiment of the present invention, dielectric layer 312 and 352 can be other types of high K dielectric layers, such as but not limited to PZT and BST. In an embodiment of the present invention, the gate dielectric layers 312 and 352 are formed of different materials and to the same thickness. In an embodiment of the present invention, gate dielectric layer 312 is formed from a different material than the gate dielectric layer 352 and/or to a different thickness than gate dielectric layer 352 in order to provide electrical characteristics optimized for each type of transistor.

N type nonplanar device 310 has a gate electrode 320. Gate electrode 320 is formed on and around gate dielectric layer 312 as shown in FIG. 3. Gate electrode 320 is formed on or adjacent to gate dielectric layer 312 formed on sidewall 331 of semiconductor body 330, is formed on gate dielectric layer 312 formed on the top surface 334 of semiconductor body 330, and is formed adjacent to or on gate dielectric layer 312 formed on sidewall 332 of semiconductor body 320. Gate electrode 320 has a pair of laterally opposite sidewalls 322 and 324 separated by a distance which defines the gate length 326 of n type transistor 310. In an embodiment of the present invention, the laterally opposite sidewalls 322 and 324 of the gate electrode 320 run in a direction perpendicular to the laterally opposite sidewalls 331 and 332 of semiconductor body 330. Similarly, p type nonplanar device 350 has a gate electrode 360 formed on and around gate dielectric layer 352 as shown in FIG. 3. Gate electrode 360 is formed on or adjacent to gate dielectric layer 352 formed on sidewall 371 of semiconductor body 370, is formed on gate dielectric layer 352 formed on the top surface 374 of semiconductor body 370 and is formed adjacent to or on gate dielectric layer 352 formed on sidewall 372 of semiconductor body 370. Gate electrode 370 has a pair of laterally opposite sidewalls 362 and 364 separated by a distance which defines a gate length (Lg) 366 of p type transistor 350. In an embodiment of the present invention, the laterally opposite sidewalls 362 and 364 of gate electrode 360 run in a direction perpendicular to laterally opposite sidewalls 371 and 372 of semiconductor body 370.

According to the present invention, either gate electrode 320 or gate electrode 360 is a metal gate electrode wherein at least the lower portion of the gate electrode formed directly adjacent to or directly on the gate dielectric layer is a metal film. In an embodiment of the present invention, gate electrode 320 has a work function tailored for a n type device. In the embodiment of the present invention, gate electrode 360 has a work function tailored for a p type device. In an embodiment of the present invention, the p type nonplanar transistor 350 has a metal gate electrode selected from the group consisting of ruthenium, palladium, platinum, cobalt, nickel, and conductive metal oxides, with a workfunction between about 4.9 eV and 5.2 eV. In an embodiment of the present invention, the n type nonplanar transistor 310 has a metal gate electrode selected from the group consisting of hafnium, zirconium, titanium, tantalum, aluminum, with a workfunction between about 3.9 eV and about 4.2 eV. In an embodiment of the present invention when semiconductor body 330 of the n type device 310 is p type silicon, the gate electrode has a work function between about 3.9 eV and about 4.2 eV. In an embodiment of the present invention when semiconductor body 370 of the p type device 350 is n type silicon, then gate electrode 360 has a work function between about 4.9 eV and about 5.2 eV. It is to be appreciated that gate electrodes 320 and 360 can be a single metal film or can be a composite stack of thin films which include a lower metal film. In an embodiment of the present invention, gate electrodes 320 and/or 360 are metal gate electrodes selected from the group consisting of tungsten, tantalum, titanium, and their nitrides. In an embodimenr of the present invention gate electrode 360 has a work function of approximately 1.0 eV greater than work function of gate electrode 320 of the n type device.

In an embodiment of the present invention, gate electrodes 320 and 360 are formed from the same film or composite stack of films. In an embodiment of the of the present invention, gate electrodes 320 and 360 have a midgap work function or a work function between a n type device and a p type device. In an embodiment of the present invention, when the semiconductor bodies 330 and 370 are silicon bodies, gate electrodes 320 and 360 can have a midgap work function between 4.2–4.8 eV. In an embodiment of the present invention, gate electrodes 320 and 360 include a film selected from the group consisting of nitrides and carbides of titanium, hafnium and tantalum, with a workfunction between 4.2–4.8 eV. In an embodiment of the present invention, gate electrodes 320 and 360 are formed from a composite film comprising a lower metal film and an upper polysilicon film. In an embodiment of the present invention, the lower metal film is kept thin in order help in the patterning of a gate electrode during a subtractive process. In an embodiment of the present invention, the lower metal portion of the gate electrodes 320 and 360 are formed to a thickness between 25–100 Å and the upper polysilicon film is formed to a thickness between 500–3000 Å.

N type nonplanar transistor 310 has a source region 340 and a drain region 342. Source region 340 and drain region 342 are formed in semiconductor body 308 on opposite sides of gate electrode 320 as shown in FIG. 3. Source region 340 and drain region 342 are formed of n type conductivity. In an embodiment of the present invention, source 340 and drain region 342 have a n type dopant concentration between $1\times10^{19}$ to $1\times10^{21}$ atoms/cm$^3$. Source region 340 and drain region 342 can be a uniform concentration or can include subregions of different concentrations or dopant profiles, such as tip regions (e.g., source/drain extensions). In an embodiment of the present invention, when nonplanar n type transistor 310 is a symmetrical transistor, source region 340 and drain region 342 have the same doping concentration and profile. In an embodiment of the present invention, the nonplanar n type transistor 310 is formed as an asymmetrical transistor wherein the doping concentration profile of the source region 340 and drain region 342 may vary in order to obtain particular electrical characteristics.

Similarly, p type nonplanar transistor 350 has a source region 380 and drain region 382. Source region 380 and drain region 382 are formed in semiconductor body 370 on opposite sides of gate electrode 360 as shown in FIG. 3. The source region 380 and the drain region 382 are formed of p type conductivity. In an embodiment of the present invention, the source region 380 and drain region 382 have a p type doping concentration of between $1\times10^{19}$ to $1\times10^{21}$ atoms/cm$^3$. Source region 380 and drain region 382 can be formed of uniform concentration or can include subregions of different concentration dopants profiles, such as tip regions (e.g., source/drain regions extensions). In an embodiment of the present invention, when nonplanar p type transistor 350 is a symmetrical transistor, source region 380 and drain 382 have the same doping concentration and profile. In the embodiment of the present invention, when p type nonplanar transistor 350 is formed as an asymmetrical transistor, then the doping concentration profile of source region 380 and drain region 382 may vary in order to obtain particular electrical characteristics.

The portion of semiconductor body 330 located between source region 340 and drain region 342 defines a channel region 344 of the n type nonplanar transistor 310. The channel region 344 can also be defined as the area of the semiconductor body 330 surrounded by the gate electrode 320. Similarly, the portion 384 of semiconductor body 370 located between source region 380 and drain region 382 defines a channel region 384 of p type nonplanar transistor 350. Channel region 384 can also be defined as the area of the semiconductor body 370 surrounded by gate electrode 360. The source/drain regions typically extend slightly beneath the gate electrodes through, for example, diffusion to define a channel region slightly smaller than the gate electrode length (Lg). In an embodiment of the present invention, the channel regions 344 and 384 are intrinsic or undoped monocrystalline silicon. In an embodiment of the present invention, channel regions 344 or 384 are doped monocrystalline silicon. When channel region 344 is doped, it is typically doped to a p type conductivity level between $1\times10^{16}$ to $1\times10^{19}$ atoms/cm$^3$. When channel region 384 is doped and is typically doped to a n type conductivity level between $1\times10^{16}$ to $1\times10^{19}$ atoms/cm$^3$. Channel regions 344 and 384 can be uniformly doped or can be doped nonunifommly or with different concentrations to provide particular electrical performance characteristics. For example, channel regions 344 and 384 can include well known "halo" regions, if desired.

By providing a gate dielectric 312 and a gate electrode 320 which surrounds the semiconductor body 330 on three sides, the n type nonplanar transistor 310 is characterized in having three channels and three gates, one gate (g1) which extends between the source and drain regions on side 331 of semiconductor body 330, a second (g2) which extends between the source and drain regions on the top surface 334 of semiconductor body 330, and a third (g3) which extends between the source and drain regions on the sidewall 332 of semiconductor body 330. As such, nonplanar transistor 310 can be referred to as a tri-gate transistor. The gate width (Gw) of the transistor 310 is the sum of the width of the three channel regions. That is, gate width of transistor 310 is equal to the height 336 of semiconductor body 330 at sidewall 331, plus the width of semiconductor body 330 at the top surface 334, plus the height 336 of semiconductor body 330 at sidewall 332. Similarly, by providing a gate dielectric 352 and a gate electrode 360 which surrounds a semiconductor body 370 on three sides, nonplanar p type transistor 350 is characterized as having three channels and three gates, one channel and gate (g1) which extends between the source and drain regions on side 371 of semiconductor body 370, a second channel and gate (g2) which extends between the source and drain regions on the top surface 374 of semiconductor body 370, and a third channel and gate (g3) which extends between the source and drain regions on a sidewall 372 of semiconductor body 370. As such, nonplanar transistor 350 can be referred to as a tri-gate transistor. The gate "width" (Gw), a transistor 350 is a sum of the width of the three channel regions. That is, the gate width of the transistor 350 is equal to the height 376 of semiconductor body 370 at sidewall 371, plus the width 373 of semiconductor body 370 at the top surface 374, plus the height 376 of the semiconductor body 370 of sidewall 372. Larger width n type and p type nonplanar transistor can be obtained by using multiple devices coupled together (e.g., multiple silicon bodies 330 surrounded by a single gate electrode 320 or multiple semiconductor bodies 370 surrounded by a single gate electrode 360).

Because the channel regions 344 and 384 are surrounded on three sides by gate electrode 320 and 360, transistors 310 and 350 can be operated in a fully depleted manner wherein when transistors 310 and 350 are turned "on" the channel region 350 fully depletes thereby providing the advantageous electrical characteristics and performance of a fully depleted transistor. That is, when transistors 310 and 350 are turned "ON" a depletion region is formed in the channel region along with an inversion layer at the surfaces of the channel regions 344 and 384 (i.e., an inversion layer is formed on the side surfaces and top surface of the semiconductor body). The inversion layer has the same conductivity type as the source and drain regions and forms a conductive channel between the source and drain regions to allow current to flow therebetween. The depletion region depletes free carriers from beneath the inversion layer. The depletion region extends to the bottom of channel regions 344 and 384, thus the transistor can be said to be a "fully depleted" transistor. Fully depleted transistors have improved electrical performance characteristics over non-fully depleted or partially depleted transistors. For example, operating transistors 310 and 350 in a fully depleted manner, gives the transistors an ideal or very steep subthreshold slope. Nonplanar transistors 310 and 350 can be fabricated with very steep sub-threshold slope of less than 80 mV/decade, and ideally about 60 mV/decade even when fabricated with semiconductor body thicknesses of less than 30 nm. Additionally, operating transistors 310 and 350 in the fully depleted manner, transistors 310 and 350 have improved drain induced barrier (DIBL) lowing effect which provides for better "OFF" state leakage which results in lower leakage and thereby lower power consumption. In an embodiment of the present invention the nonplanar transistors 310 and 350 have a DIBL effect of less than 100 mV/V and ideally less than 40 mV/V. It is to be appreciated that transistor 310 and 350 need not necessarily be operated in a fully depleted manner, if desired (e.g., semiconductor bodies can be made large so they do not fully deplete).

The transistors 310 and 350 of the present invention can be said to be a nonplanar transistor because the inversion layer of the channel regions 344 and 384 are formed in both the horizontal and vertical directions in semiconductor bodies 330 and 370. The semiconductor device of the present invention can also be considered a nonplanar device because the electric field from the gate electrode 320 and 360 are applied from both horizontal (g2) and vertical sides (g1 and g3).

Figure 4A:
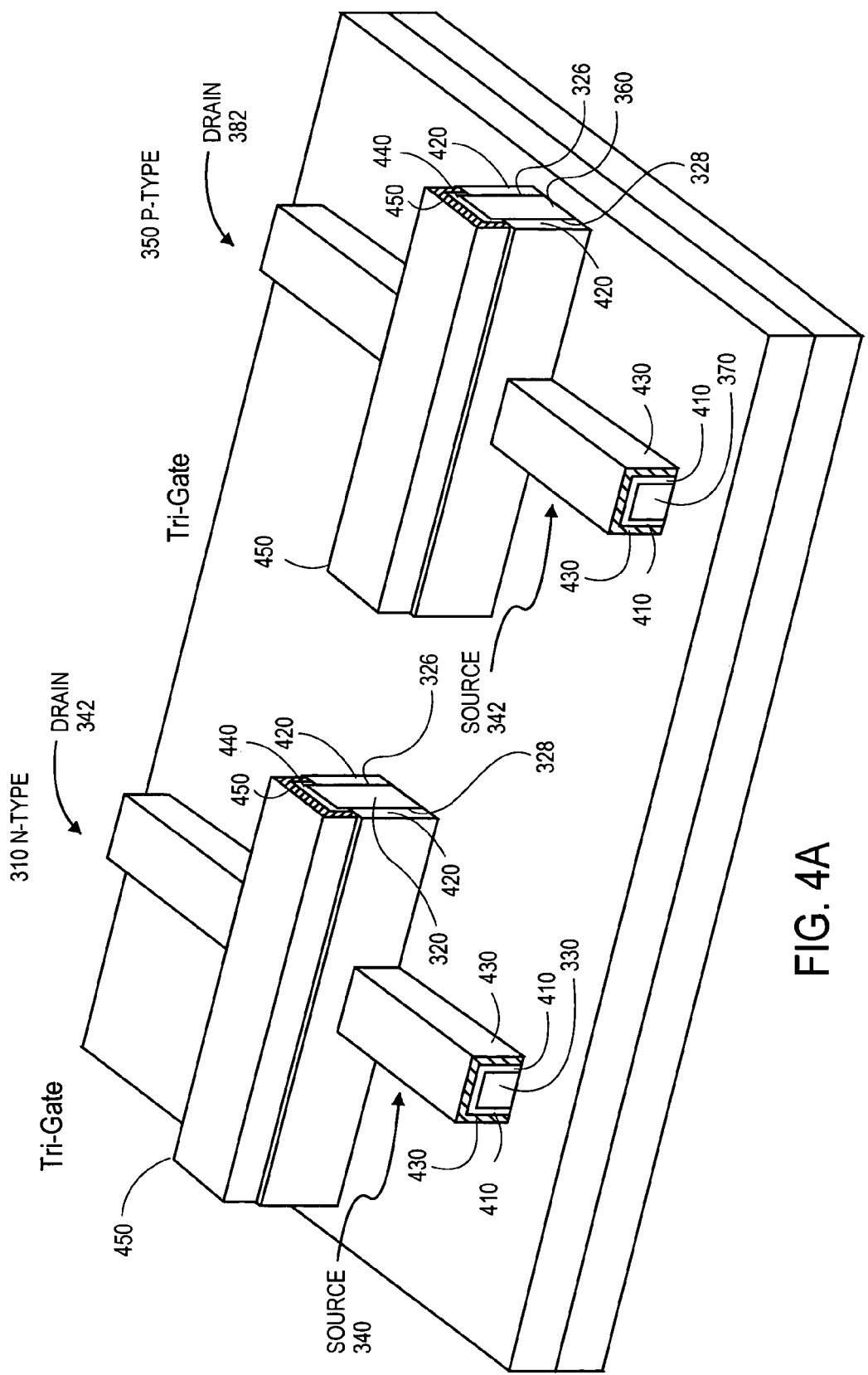
FIG. 4A illustrates a CMOS integrated circuit having an n type nonplanar transistor with a metal gate electrode which includes raised source and drain regions and silicided regions and a nonplanar p type transistor with a metal gate electrode and with raised source and drain regions and silicided regions.

In an embodiment of the present invention, the source and drain regions of the nonplanar transistors 310 and 350 can include a silicon or other semiconductor film 410 formed on and around semiconductor body as shown in FIG. 4A. For example, semiconductor film 410 can be a silicon film or a silicon alloy such as silicon germanium (SixGey). In an embodiment of the present invention the semiconductor film 410 is a single crystalline silicon film formed of the same conductivity type as the source region and drain region. In an embodiment of the present invention the semiconductor film can be a silicon alloy such as silicon germanium where silicon comprises approximately 1 to 99 atomic percent of the alloy. The semiconductor film 410 need not necessarily be a single crystalline semiconductor film and in an embodiment can be a polycrystalline film. In an embodiment of the present invention the semiconductor film 410 is formed on the source region and on the drain region of semiconductor body to form "raised" source and drain regions. Semiconductor film 410 can be electrically isolated from the gate electrode by a pair of dielectric sidewall spacers 420 such as silicon nitride or silicon oxide or composites thereof. Sidewall spacers 420 run along the laterally opposite sidewalls of gate electrodes 320 and 360 as shown in FIG. 4A thereby isolating the semiconductor film 410 from gate electrode as shown in FIG. 4A. An embodiment of the present invention sidewalls spacers 420 have a thickness of between 20–200 Å. By adding a silicon or semiconductor film to the source and drain regions of the semiconductor body and forming "raised" source and drain regions, the thickness of the source and drain regions is increased thereby reducing the source/drain contact resistance to transistors 310 and 350 and improving their electrical characteristics and performance.

In an embodiment of the present invention a silicide film 430, such as, but not limited to, titanium silicide, nickel silicide, and cobalt silicide is formed on the source region and drain regions. In an embodiment of the present invention silicide film 430 is formed on a silicon film 410 on silicon body 330 and silicon body 370 as shown in FIG. 4A. Silicide film 430 however can also be formed directly onto silicon bodies 330 and 370. For example, silicide film 430 can be formed on silicon bodies 330 and 370 by first forming a silicon film such as an undoped silicon film on silicon bodies 330 and 370 and then completely consuming the silicon film during the silicide process. Dielectric spacers 420 enables silicide film 430 to be formed on semiconductor bodies 330 and 370 or on silicon film 410 in a self-aligned process (i.e., a salicide process).

Additionally, in the embodiment of the present invention a semiconductor or silicon film 440 can also be formed on the top of gate electrodes 320 and 360 as can a silicide film 450 on the top surface gate electrodes 320 and 360 when the top portion of the gate electrode is a silicon or semiconductor film. Silicide film 450 and silicon film 440 are typically formed at the same time as silicide film 430 and silicon film 420 on silicon bodies 330 and 370. The formation of a silicon film 440 and a silicide film 450 on the gate electrode can reduce the contact resistance to the gate thereby improving the electrical performance of transistor 300.

Figure 4B:
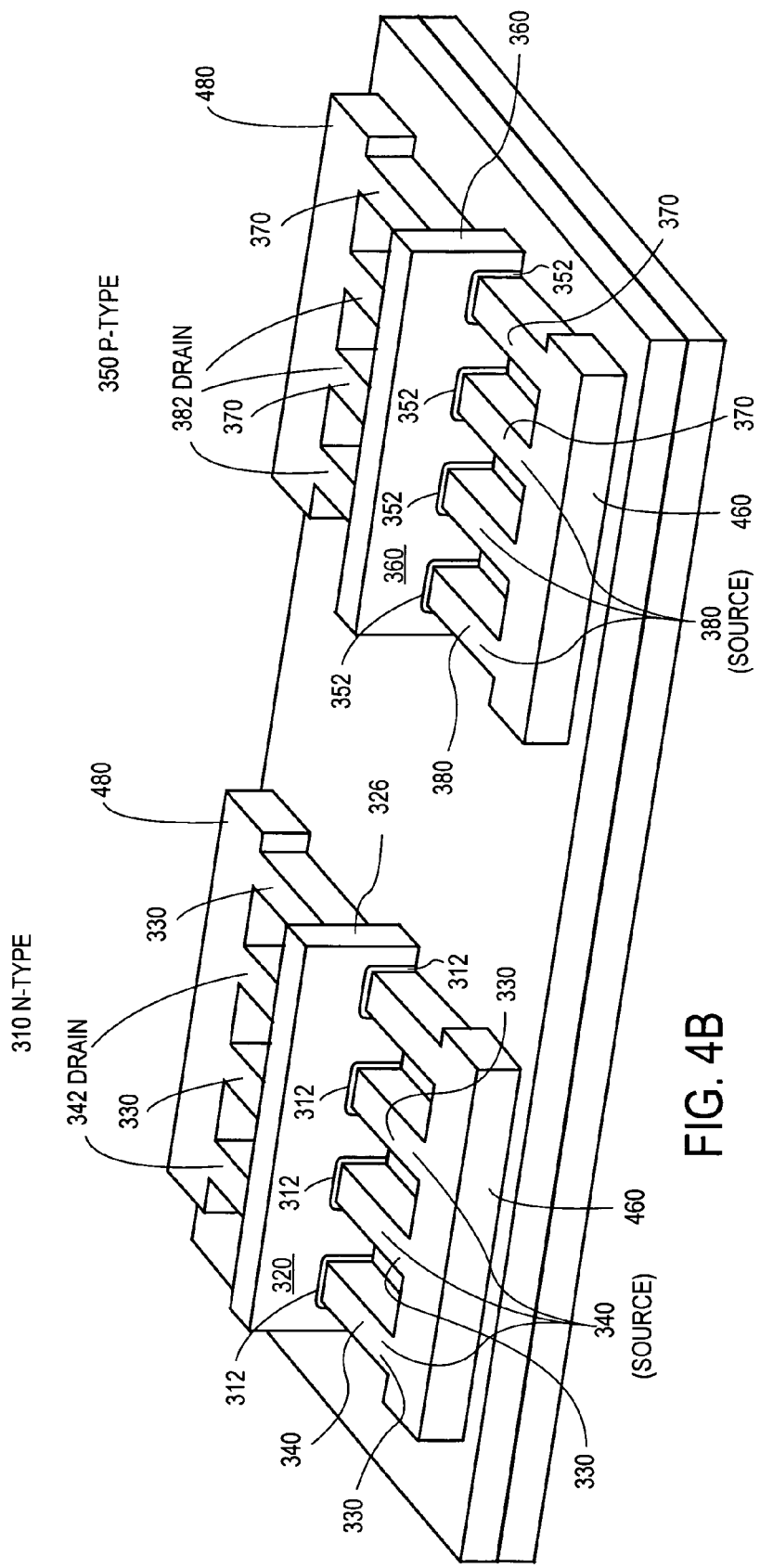
FIG. 4B is an illustration of a CMOS integrated circuit having an n type nonplanar transistor with a metal gate electrode and multiple semiconductor bodies and a p type nonplanar transistor with a metal gate electrode and multiple semiconductor bodies.

As stated above the gate "width" of transistors 310 and 350 are equal to the sum of the three gate width created from semiconductor bodies 330 and 370 respectively. In order to fabricate the transistors with larger gate widths, transistors 310 and 350 can include an additional or multiple semiconductor bodies or fingers 330 and 370 as shown in FIG. 4B. Each semiconductor body 330 and 370 has a gate dielectric layer 312 and 352 formed on its top surface and sidewalls as shown in FIG. 4B. Gate electrode 320 and 360 is formed on and adjacent to each gate dielectric 312 and 352 on each of the semiconductor bodies 330 and 370 as shown in FIG. 4B. Each semiconductor body 330 also includes a source region 340 and drain region 342 formed in each semiconductor body 330 on opposite sides of gate electrode 320 as shown in FIG. 4B. Similarly, each semiconductor body 370 also includes a source region 380 and drain region 382 formed in each semiconductor body 370 on opposite sides of gate electrode 360 as shown in FIG. 4B. In an embodiment of the present invention each semiconductor body 330 is formed with the same width and height (thickness) as the other semiconductor bodies 330. Similarly, in an embodiment of the present invention each semiconductor body 370 is formed with the same width and height (thickness) as the other semiconductor bodies 370. In an embodiment of the present invention each source region 340 and drain region 342 of the semiconductor body 330 are electrically coupled together by the doped semiconductor material used to form semiconductor body 340 to form a source landing pad 460 and a drain landing pad 480 as shown in FIG. 4B. Similarly, in an embodiment of the present invention each source region 380 and drain region 382 of the semiconductor body 370 are electrically coupled together by the doped semiconductor material used to form semiconductor body 380 to form a source landing pad 460 and a drain landing pad 480 as shown in FIG. 4B. The landing pads 460 and 480 are doped to the same conductivity type and levels as the source and drain regions are for each of the transistors 310 and 350. Alternatively, the source region 340 and drain regions 342 can be coupled together by higher levels of metallization (e.g., metal 1, metal 2, metal 3 . . . ) used to electrically interconnect various transistors 310 and 350 together into functional circuits. Similarly, the source region 380 and drain regions 382 can be coupled together by higher levels of metallization (e.g., metal 1, metal 2, metal 3 . . . ) used to electrically interconnect various transistors 310 and 350 together into functional circuits. The gate width of n type nonplanar transistor 310 as shown in FIG. 4B would be equal to the sum of the gate width created by each of the semiconductor bodies 330 and the gate width of p type nonplanar transistor 350 is equal to the sum of the gate widths created by each of the semiconductor bodies 370. In this way, the nonplanar transistors 310 and 350 can be formed with any gate width desired.

Figure 5A:
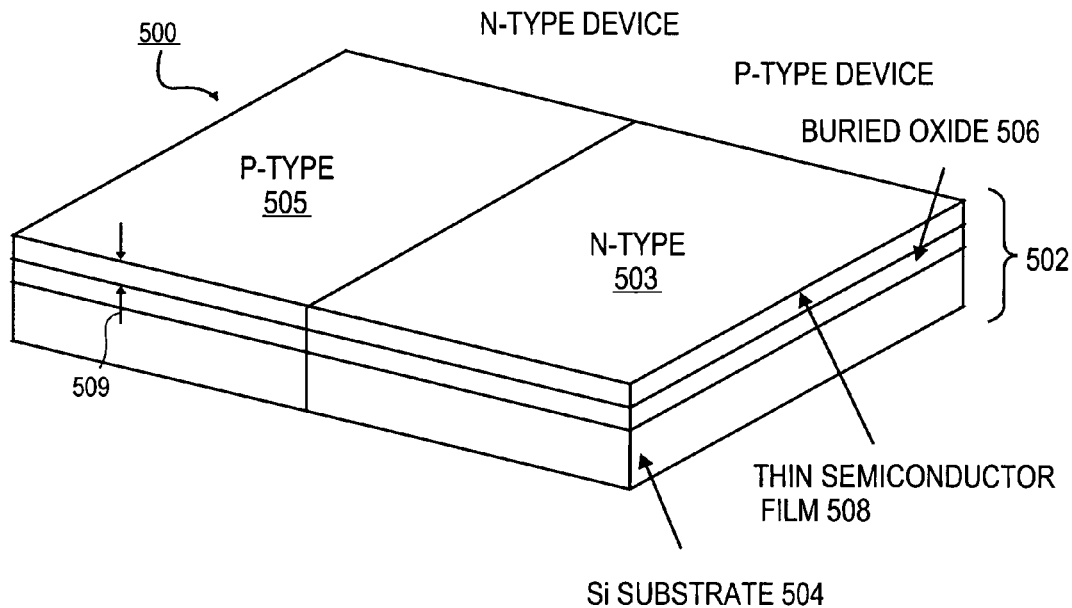

A method of forming a complimentary metal oxide semiconductor integrated circuit having a n type nonplanar transistor with a metal gate electrode and a p type nonplanar transistor with a metal gate electrode utilizing a subtractive fabrication process is illustrated in FIG. 5A–5L. Although a process for forming a CMOS integrated circuit is illustrated in FIGS. 5A–5L, it is to be appreciated that one need not necessarily form a CMOS integrated circuit and one can form an integrated circuit comprising only n type nonplanar devices with a metal gate electrodes or p type nonplanar devices with metal gate electrodes, if desired. In such a case, the processing steps to fabricate the unused transistor type are eliminated. The fabrication of a CMOS integrated circuit in accordance with this embodiment of the present invention, begins with a substrate 502. A silicon or semiconductor film 508 is formed on substrate 502 as shown in FIG. 5A. In an embodiment of the present invention, the substrate 502 is an insulating substrate, such as shown in FIG. 5A. In an embodiment of the present invention, insulating substrate 502 includes a lower monocrystalline silicon substrate 504 and a top insulating layer 506, such as silicon dioxide film or a silicon nitride film. Insulating layer 506 isolates semiconductor film 508 from substrate 504 and in an embodiment is formed to a thickness between 200–2000 Å. Insulating layer 506 is sometimes referred to as a "buried oxide" layer. When a silicon or a semiconductor film 508 is formed on insulating substrate 502, a silicon or semiconductor on insulating (SOI) substrate 500 is created. Although a silicon on insulator (SOI) transistor is desired in embodiments of the present invention, the present invention can be also carried out on standard semiconductor substrates, such as but not limited to monocrystalline silicon substrates and gallium arsenide substrates.

Although semiconductor film 508 is ideally a silicon film, in other embodiments it can be other types of semiconductor films, such as but not limited to germanium (Ge), a silicon germanium alloy ($Si_xGe_y$), gallium arsenide (GaAs), InSb, GaP, GaSb, as well as carbon nanotubes. In an embodiment of the present invention, semiconductor film 508 is an intrinsic (i.e., undoped) silicon film. Typically, however, the semiconductor film 508 is doped to a p type conductivity at locations 505 where n type transistors are desired and is doped to a n type conductivity at locations 503 where a p type transistor is desired. Semiconductor film 508 would typically be doped to a p type or n type conductivity with a concentration level of between $1 \times 10^{16}$ to $1 \times 10^{19}$ atoms/cm$^3$. P type regions 505 and n type regions 503 can be formed in semiconductor film 508 utilizing well known photolithography masking and ion implantation techniques.

Semiconductor film 508 is formed to a thickness 509 which is approximately equal to the height desired for the subsequently formed semiconductor body or bodies of the fabricated nonplanar transistor. In an embodiment of the present invention, semiconductor film 508 has a thickness or height 509 of less than 30 nanometers and ideally less than 20 nanometers. In an embodiment of the present invention, semiconductor film 508 is formed to the thickness approximately equal to the gate "length" desired of the fabricated nonplanar transistor. In an embodiment of the present invention, semiconductor film 508 is formed thicker than desired gate length of the device. In an embodiment of the present invention, semiconductor film 580 is formed to a thickness which will enable the fabricated nonplanar transistor to be operated in a fully depleted manner for its designed gate length (Lg).

Semiconductor film 508 can be formed on insulating substrate 502 in any well-known method. In one method of forming a silicon on insulator substrate, known as the SIMOX technique, oxygen atoms are implanted at a high dose into a single crystalline silicon substrate and then anneal to form the buried oxide 506 within the substrate. The portion of the single crystalline silicon substrate above the buried oxide becomes the silicon film 508. Another technique currently used to form SOI substrates is an epitaxial silicon film transfer technique which is generally referred to as bonded SOI. In this technique a first silicon wafer has a thin oxide grown on its surface that will later serve as the buried oxide 506 in the SOI structure. Next, a high dose hydrogen implant is made into the first silicon wafer to form a high stress region below the silicon surface of the first wafer. This first wafer is then flipped over and bonded to the surface of a second silicon wafer. The first wafer is then cleaved along the high stress plane created by the hydrogen implant. This results in a SOI structure with a thin silicon layer on top, the buried oxide underneath all on top of the single crystalline silicon substrate. Well-known smoothing techniques, such as HCl smoothing or chemical mechanical polishing (CMP) can be used to smooth the top surface of semiconductor film 508 to its desired thickness.

At this time, if desired, isolation regions (not shown) can be formed into SOI substrate 500 in order to isolate the various transistors to be formed therein from one another. Isolation regions can be formed by etching away portions of the substrate film 508 surrounding a nonplanar transistor, by for example well-known photolithographic and etching techniques, and then back filling the etched regions with an insulating film, such as $SiO_2$. Alternatively, isolation regions can be formed prior to forming the n type and/or p type doped regions 503 and 505 respectively.

Figure 5B:
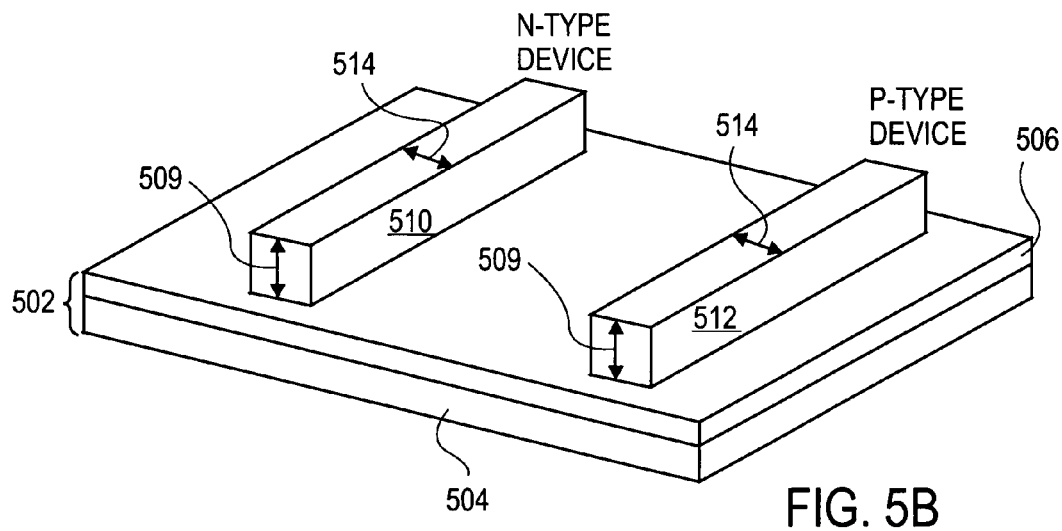

Next, a semiconductor body 510 for the n type device is formed from the p type region 505 of semiconductor film 508 and a semiconductor body 512 for the p type device is formed from the n type region 503 of the semiconductor film 508 as shown in FIG. 5B. It is to be appreciated that although a single semiconductor body is shown for each device type for simplicity of illustration, it is to be appreciated that, if desired, each device type may contain multiple semiconductor bodies 510 or 512 as illustrated in FIG. 4B. Similarly, although source/drain landing pads are not shown in FIG. 5B, source/drain landing pads can be formed at this time in order to connect together various source regions and to connect together various drain regions of the fabricated transistor.

Semiconductor bodies 510 and 512 (and landing pads, if desired) can be formed by well known photolithography and etching techniques. For example, in an embodiment of the present invention, a photoresist film is blanket deposited over semiconductor film 508. The photoresist mask is then patterned into a photoresist mask utilizing well known masking, exposing and developing techniques to define the locations where the semiconductor bodies or fins are desired (and landing pads, if used). The semiconductor film 508 is then etched in alignment with the photoresist mask to form the semiconductor bodies 510 and 512 (and source/drain landing pads if desired) as shown in FIG. 5B. The semiconductor body 508 is etched until the underlying buried oxide layer 506 is exposed. Well known semiconductor etching techniques, such as anisotropic plasma etching or reactive ion etching can be used to etch semiconductor film 508 in alignment with the photoresist mask. In an embodiment of the present invention, the semiconductor bodies 510 and 512 have a width 514 which is equal to or greater than the width desired for the gate length (Lg) of the fabricated transistor. In this way, the most stringent photolithography constraints used to fabricate the transistor are associated with the gate electrode patterning and not the semiconductor body of fin definition. In an embodiment of the present invention, the semiconductor bodies or fins 510 and 512 have a width 514 less than or equal to 30 nanometers and ideally less than or equal to 20 nanometers. In an embodiment of the present invention, the semiconductor bodies or fins 510 and 512 have a width 514 approximately equal to the semiconductor body height 509. In an embodiment of the present invention, the semiconductor bodies 510 and 512 have a width 514 which is between one half the semiconductor body height 509 and two times the semiconductor body height 509. It is to be appreciated that, if desired, semiconductor bodies 510 and 512 need not necessarily be formed to the same width.

Next, as shown in FIG. 5C, a gate dielectric layer 516 is formed on and around semiconductor body 510 and semiconductor body 512. That is, a gate dielectric layer 516 is formed on the top surface 515 of semiconductor body 510 as well on the laterally opposite sidewalls 513 of semiconductor body 510. Additionally, the gate dielectric layer 516 is formed on the top surface 519 as well on the laterally opposite sidewalls 517 of semiconductor body 512 as shown in FIG. 5C. The gate dielectric layer can be a deposited or grown dielectric layer. In an embodiment of the present invention, the gate dielectric layer 516 is a silicon dioxide dielectric film grown with a dry/wet oxidation process. In an embodiment of the present invention, a silicon oxide film is grown to a thickness of between 5–50 Å. In an embodiment of the present invention, the gate dielectric layer 516 is a deposited dielectric, such as but not limited to a high dielectric constant film, such as a metal oxide dielectric, such as tantalum pentaoxide ($Ta_2O_5$) and titanium oxide ($TiO_2$), tantalum oxide, hafnium oxide, zirconium oxide, aluminum oxide, and silicate thereof or other high K dielectrics, such as PZT and BST. A high dielectric constant film can be formed by any well known technique, such as but not limited to chemical vapor deposition (CVD) or atomic layer deposition (ALD). When the dielectric film 516 is a deposited film, it will also form on the exposed surfaces of a buried oxide layer 506 as shown in FIG. 5C.

Next, as shown in FIG. 5D, a gate electrode film 520 is blanket deposited over the substrate shown in FIG. 5C. The gate electrode film 520 is used to form the gate electrodes for the n type and p type nonplanar transistors. The gate electrode film 520 includes at least a lower metal layer formed directly on or adjacent to the gate dielectric layer 516. Gate electrode film 520 can be a single metal film or can be a composite film formed of multiple layers. In an embodiment of the present invention, the gate electrode film 520 produces a midgap work function between a n type device and a p type device. In an embodiment of the present invention, the gate electrode film 520 produces a work function between 4.2–4.8 eV. In an embodiment of the present invention, the gate electrode film 520 comprises a composite stack which includes a lower metal layer 522 formed in direct contact with the gate dielectric layer 516 and an upper silicon or silicon alloy film 524, such as polycrystalline silicon or silicon germanium. In an embodiment of the present invention, a composite polycrystalline silicon/metal film is utilized where the upper polycrystalline silicon film is formed significantly thicker than the lower metal film, such as for example, 5–30 times thicker. Such a thickness ratio aids in the subsequent anisotropic etching of the gate electrode material 520 to form a gate electrode with vertical sidewalls which enable minimum dimension gate lengths to be achieved. In an embodiment of the present invention, the gate electrode has a lower metal film between 25–100 Å thick and an upper metal film between 500–3000 Å thick. In an embodiment of the present invention the lower metal film is a metal selected from the group consisting of the nitrides and carbides of titanium, halfnium and tantalum, with a work function that is between 4.2–4.8 eV. The gate electrode film 520 can be formed by any well known method, such as but not limited to chemical vapor deposition (CVD) and sputtering. In an embodiment of the present invention, the gate electrode material 520 is deposited to a thickness or height of at least three times the height of the semiconductor bodies 510 and 512. In an embodiment of the present invention, the gate electrode material 520 is formed to a thickness between 200–3000 Å. After deposition, the gate electrode material 520 can be planarized by, for example, chemical mechanical planarization in order to form a gate electrode film 520 with a smooth top surface 525. Such a smooth top surface will aid in the subsequent patterning of the gate electrode. Next, if desired, a hard mask film 526, such as but not limited to silicon nitride of silicon oxynitride, can be blanket deposited over the gate electrode material 520 as shown in FIG. 5D. The hard mask layer 526 helps improve the anisotropic patterning of the gate electrode material 520. Additionally, the hard mask layer 526 can be used as a mask to prevent the channel doping during the subsequent formation of the source and drain regions. This is especially important when the gate electrode material 520 comprises a single metal layer or multiple metal layers which are unable to block ions during ion implantation to form the source and drain regions.

Figure 5E:
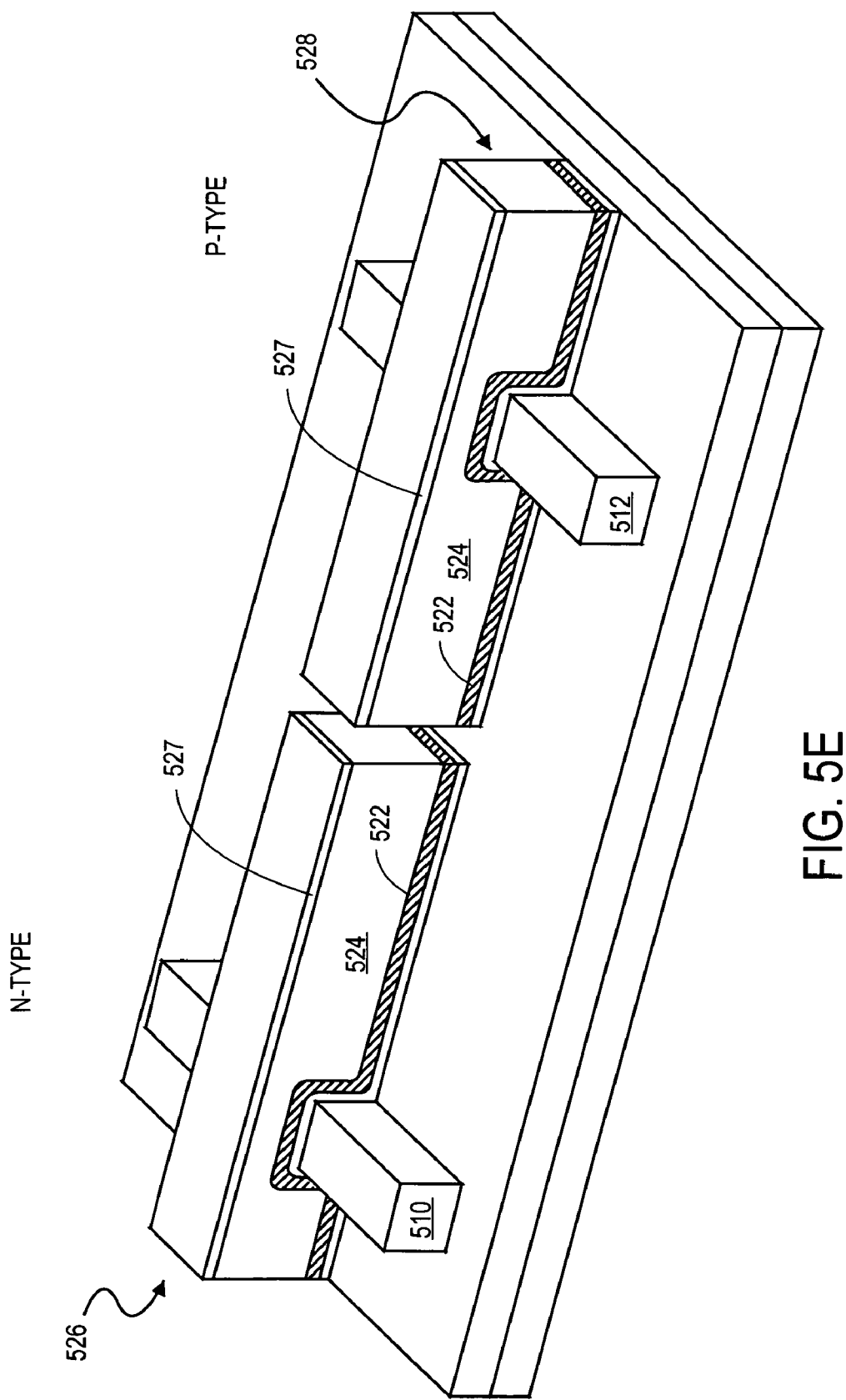

Next, as shown in FIG. 5E, the gate electrode material 520 is patterned into gate electrodes as shown in FIG. 5E. The gate electrode material 520 is patterned into a gate electrode 526 for the n type transistor and gate electrode 528 for the p type transistor. Well known photolithography and etching techniques can be used to pattern the gate electrode material 520 into a gate electrode 526 and 528. In order to pattern the gate electrode material 520, a photoresist material can be blanket deposited over the gate electrode material 520.

Photolithography techniques, such as masking, exposing and developing can then be used to pattern the photoresist material into photoresist mask which defines the location where electrodes 526 and 528 are desired. In an embodiment of the present invention, the photolithography process used to define the gate electrodes, utilizes the minimum or smallest dimension lithography process used to fabricate the nonplanar transistors. Next, the hard mask layer 526 is etched in alignment with the photoresist mask to form the hard mask 527. The hard mask material can be patterned with any technique well known in the industry such as utilizing a reactive ion etching. Next, the polysilicon film 524 is etched in alignment with the photoresist mask and/or hard mask 527. The hard mask is formed of a material which does not significantly etch or erode during the polysilicon or bulk etch, so that the fidelity between a pattern formed in the hard mask is continued into the polysilicon layer 524 during the polysilicon etch. It is to be appreciated that the polysilicon etch can erode the photoresist mask and cause inaccurate etching of the polysilicon film if a hard mask is not utilized. The polysilicon etch is continued until the underlying metal film 522 is reached. The etch chemistry is then switched to an etchant which can etch the lower metal film 522. When the lower metal film 522 is titanium carbide an etch chemistry of comprising HBr and C12 can be utilized. In an embodiment of the present invention, the lower metal film 522 is etched utilizing a wet etchant. Wet etchants are isotropic in nature and therefore require a very thin lower metal film 522 in order to etch the lower metal film without dramatically under cutting the polysilicon film 524. In an embodiment of the present invention, the lower metal film is titanium nitride and it is wet etched with a chemistry comprising sulfuric acid and hydrogen peroxide. The end result is a formation of gate electrodes 526 and 528 having nearly vertical sidewalls and formed to the minimum dimension (critical dimension) allowable by the photolithography process to produce minimum gate length (Lg) gate electrodes.

Figure 5F:
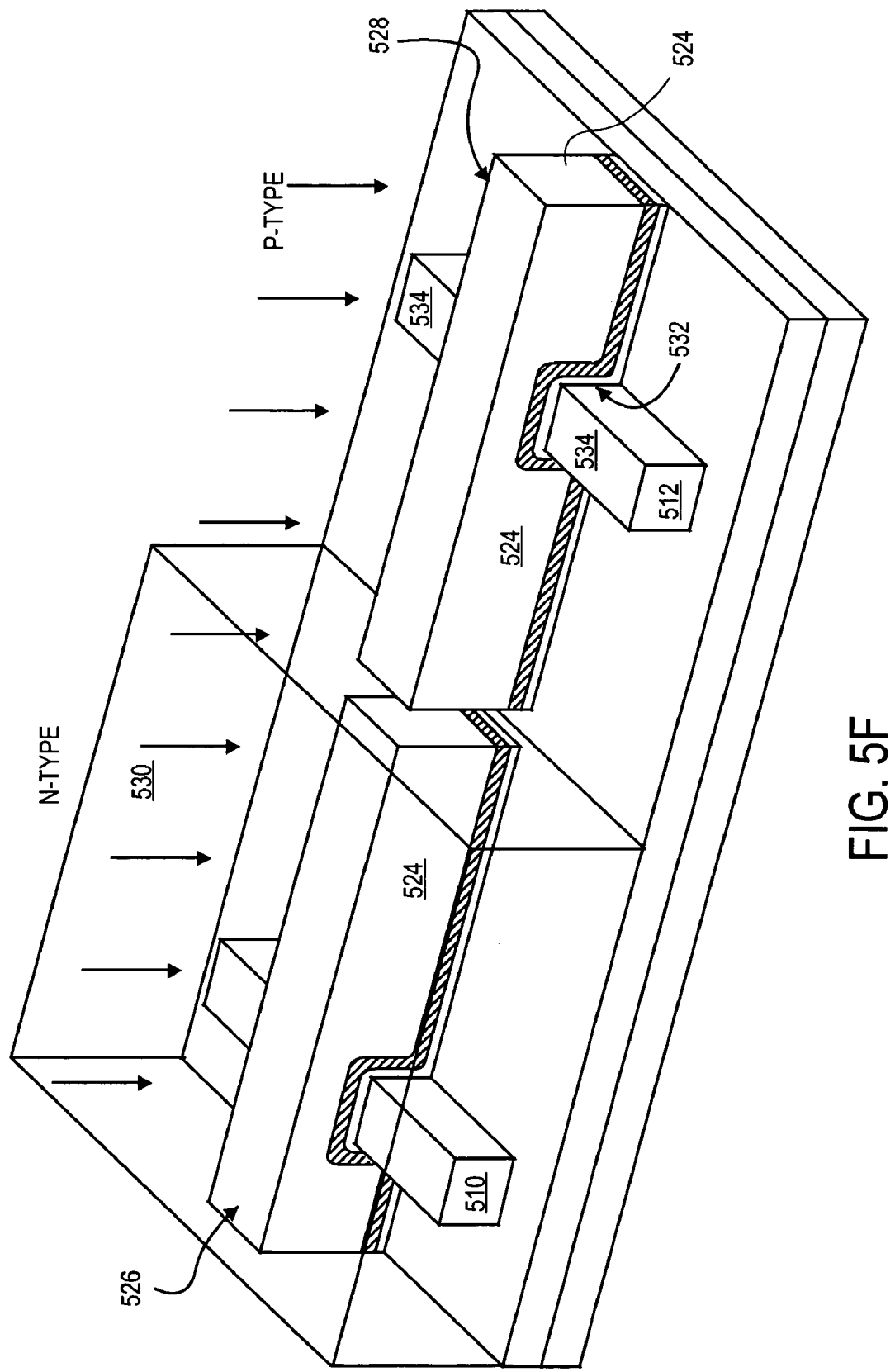

Next, the source and drain regions of the p type and n type transistors are formed in the semiconductor bodies 510 and 512 respectively. In an embodiment of the present invention, the n type and p type transistors include tip or source/drain extensions. In order to fabricate source/drain extensions or tip regions for the p type device a photoresist mask 530 can be formed over the n type transistor and the p type transistor region left masked or exposed as shown in FIG. 5F. Next, dopants are placed within the exposed portions of the semiconductor body 512 which are not covered by gate electrode 528. The semiconductor body 512 is doped in alignment with the outside edges of the gate electrode 528 to p type conductivity, with for example boron, to a concentration between $1 \times 10^{20}$ to $1 \times 10^{21}$ atoms/cm$^3$. In an embodiment of the present invention, the semiconductor film 512 is doped by ion-implantation. In an embodiment of the present invention, the ion-implantation occurs in a vertical direction (i.e., perpendicular to the substrate) as shown in FIG. 5F. The photoresist mask 530 prevents the n type device from being implanted with p type dopants. When the gate electrode comprises a upper polysilicon film 524 it can be doped during the ion-implantation process. In such a case, the hard mask 527 would have been previously removed. Gate electrode 528 acts as a mask to prevent the ion-implantation step from doping the channel region 532 of the p type transistor. The channel region 532 is a portion of the semiconductor body 512 located beneath or surrounded by gate electrode 528. If gate electrode 528 is entirely a metal electrode, the dielectric hard mask 527 can be left on the gate electrode 528 during the ion implantation step in order to mask the channel 532 and prevent the channel region 532 from being doped during the ion-implantation process. It is to be appreciated that other methods, such as solid source diffusion may be used to dope the semiconductor body 512 to form the tip regions 534, if desired. Next, the photoresist mask 530 is removed with well known techniques.

Figure 5G:
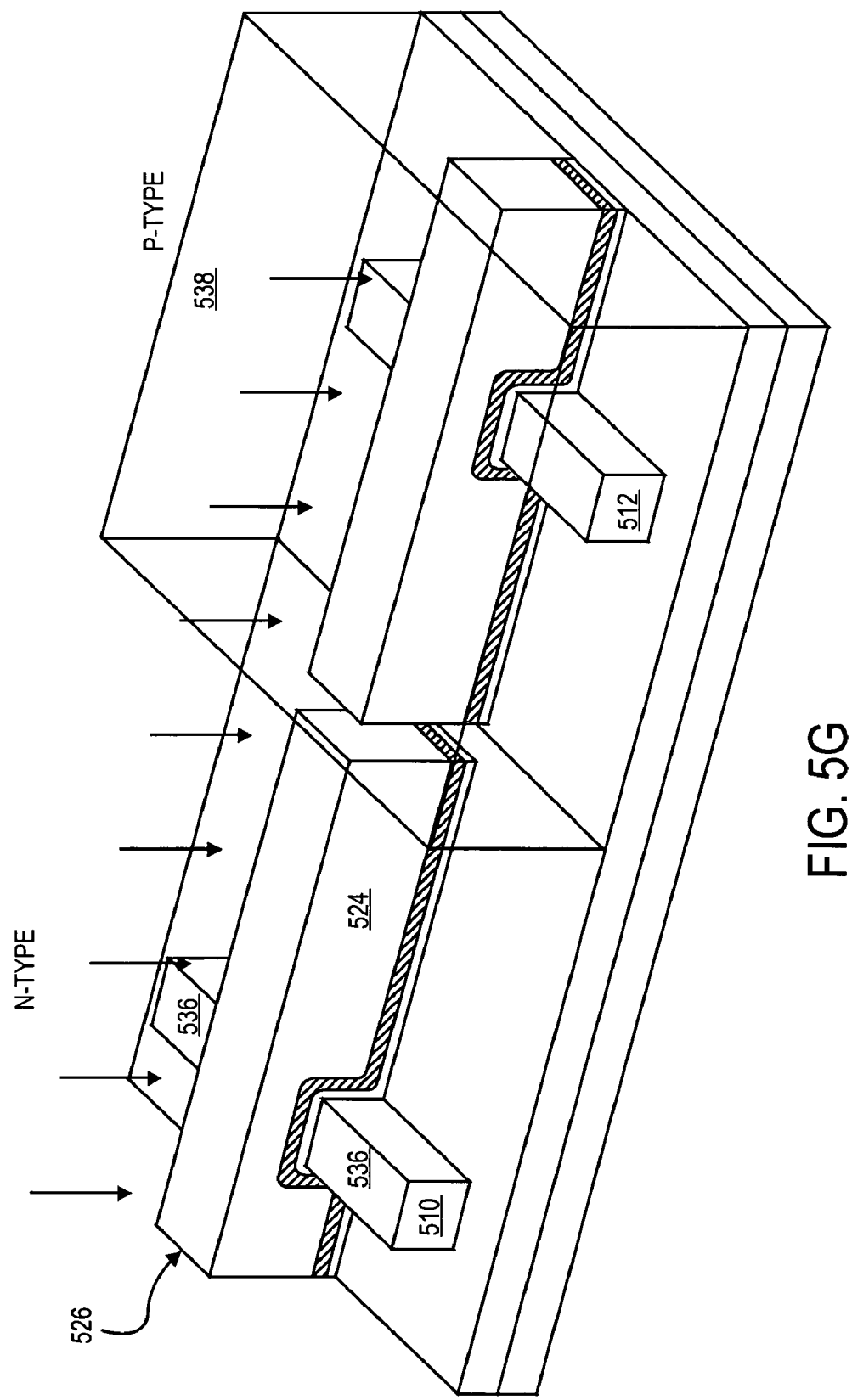

Next, as shown in FIG. 5G, n type source/drain tip region, tip or extension regions 536 can be formed in semiconductor body 510 on opposite sides of gate electrode 526. In order to form n type source/drain extensions 536, a photoresist mask 538 can be formed over the region of the substrate containing the p type device and the n type region left unmasked as shown in FIG. 5G. Next, n type dopants, such as arsenic or phosphorous, can be ion-implanted into the semiconductor body 510 to form the source/drain extensions 536. Photoresist mask 538 prevents the p type device from being implanted with n type dopants. For a n type device, the semiconductor body 510 can be doped with n type conductivity ions to a concentration between $1 \times 10^{21}$ to $1 \times 10^{21}$ atoms/cm$^3$. In an embodiment of the present invention, the ion implantation occurs in a vertical direction (i.e., in a direction perpendicular to substrate 500) as shown in FIG. 5G. If the gate electrode includes an upper polysilicon film 524 it can also be doped at this time also. Gate electrode 526 prevents the channel region of the n type device from becoming implanted with n type impurities. When gate electrode 526 comprises only a metal or multiple metal layers hard mask 527 can be left on to prevent the doping of the channel region. Next, the photoresist mask 538 is removed with well known techniques.

In embodiments of the present invention, (halo) regions can be formed in the semiconductor bodies 510 and 512 prior to the formation of the source/drain regions or source/drain extension regions. Halo regions are doped regions formed in the channel regions 538 and 532 of the device and are of the conductivity but of slightly higher concentration than the dopant of the channel region of the device. Halo regions can be formed by ion implanting dopants beneath the gate electrodes 526 and 528 utilizing large angled ion implantation techniques.

Figure 5H:
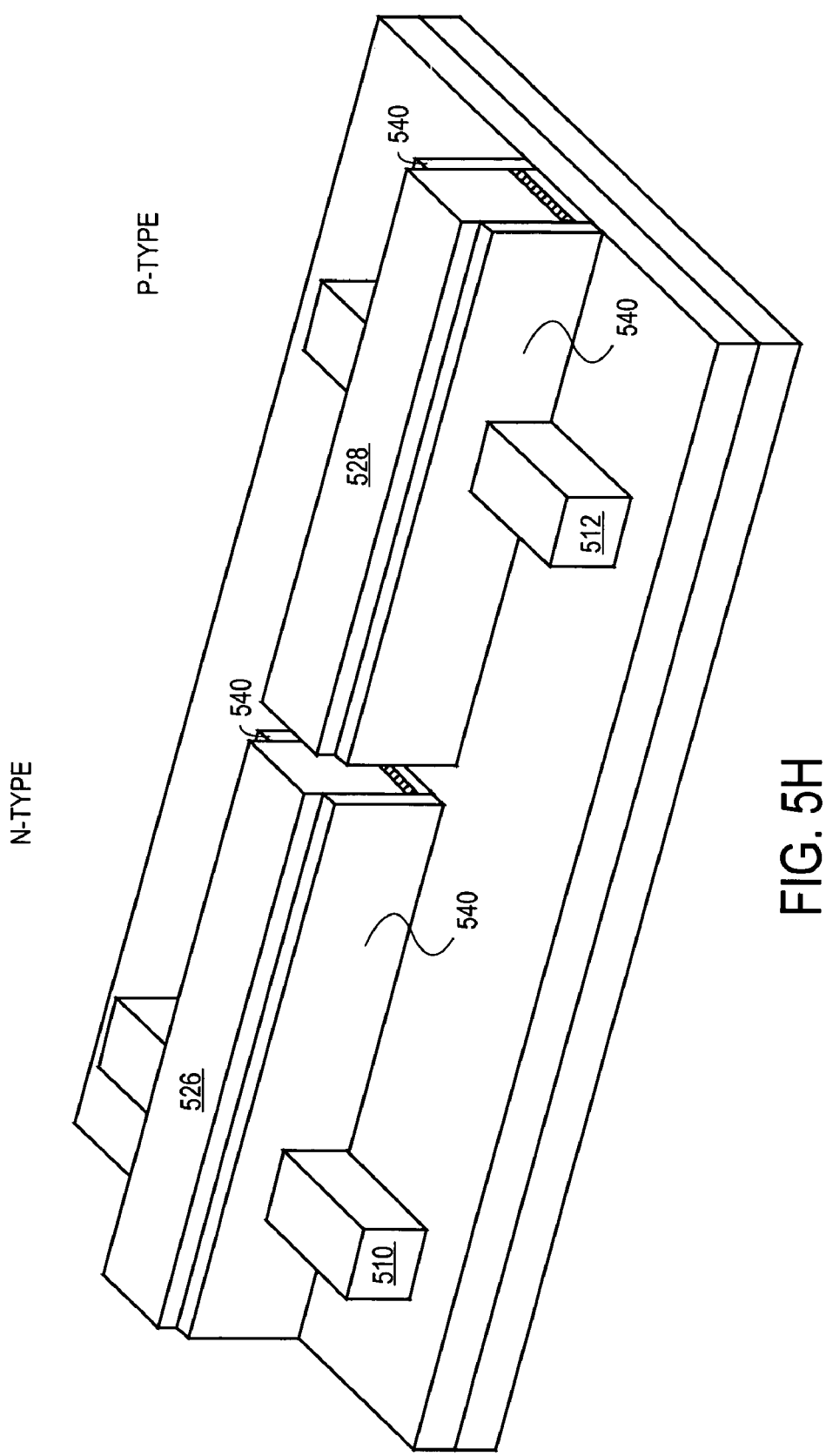
Figure 5I:
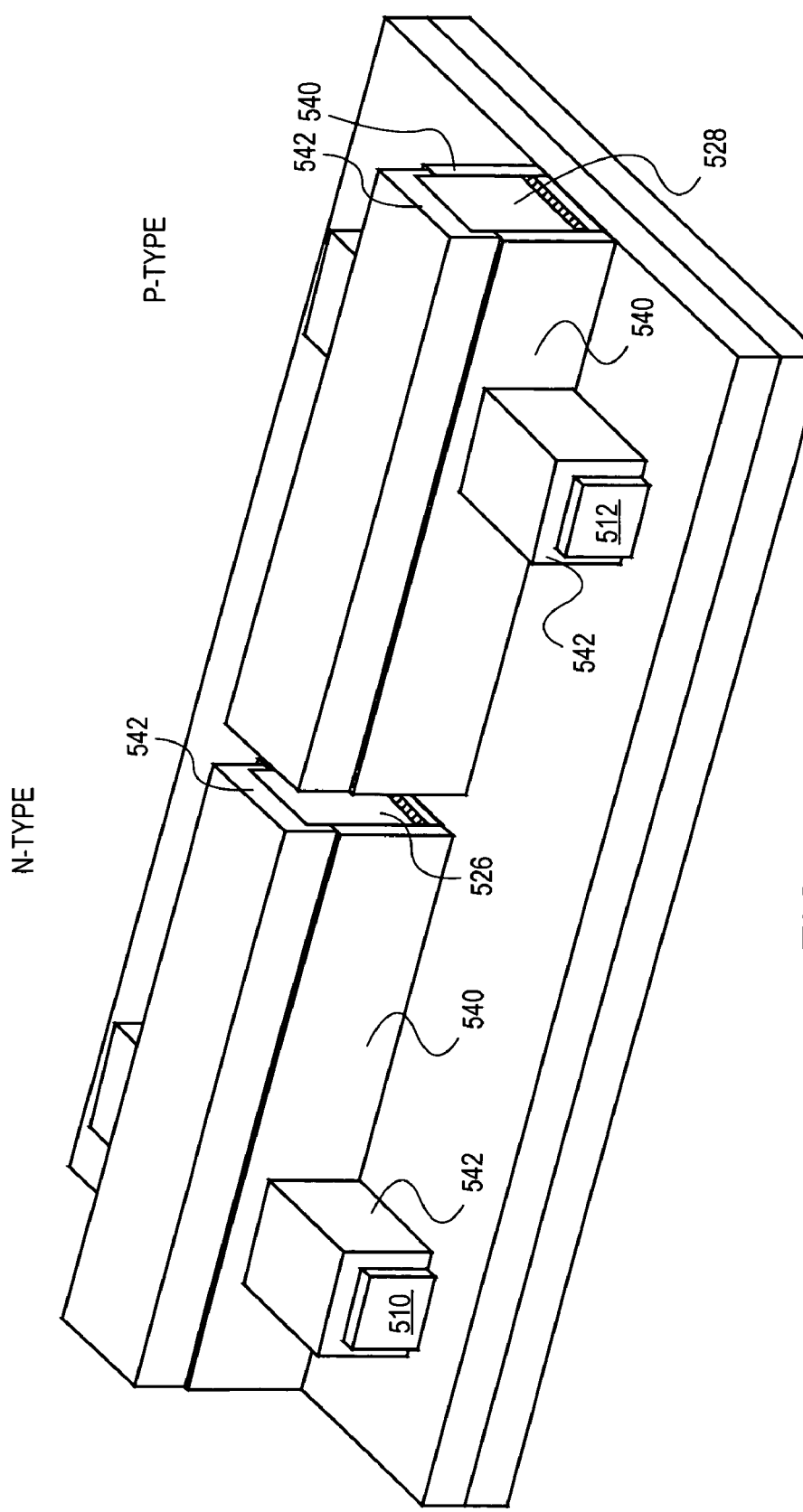
Figure 5J:
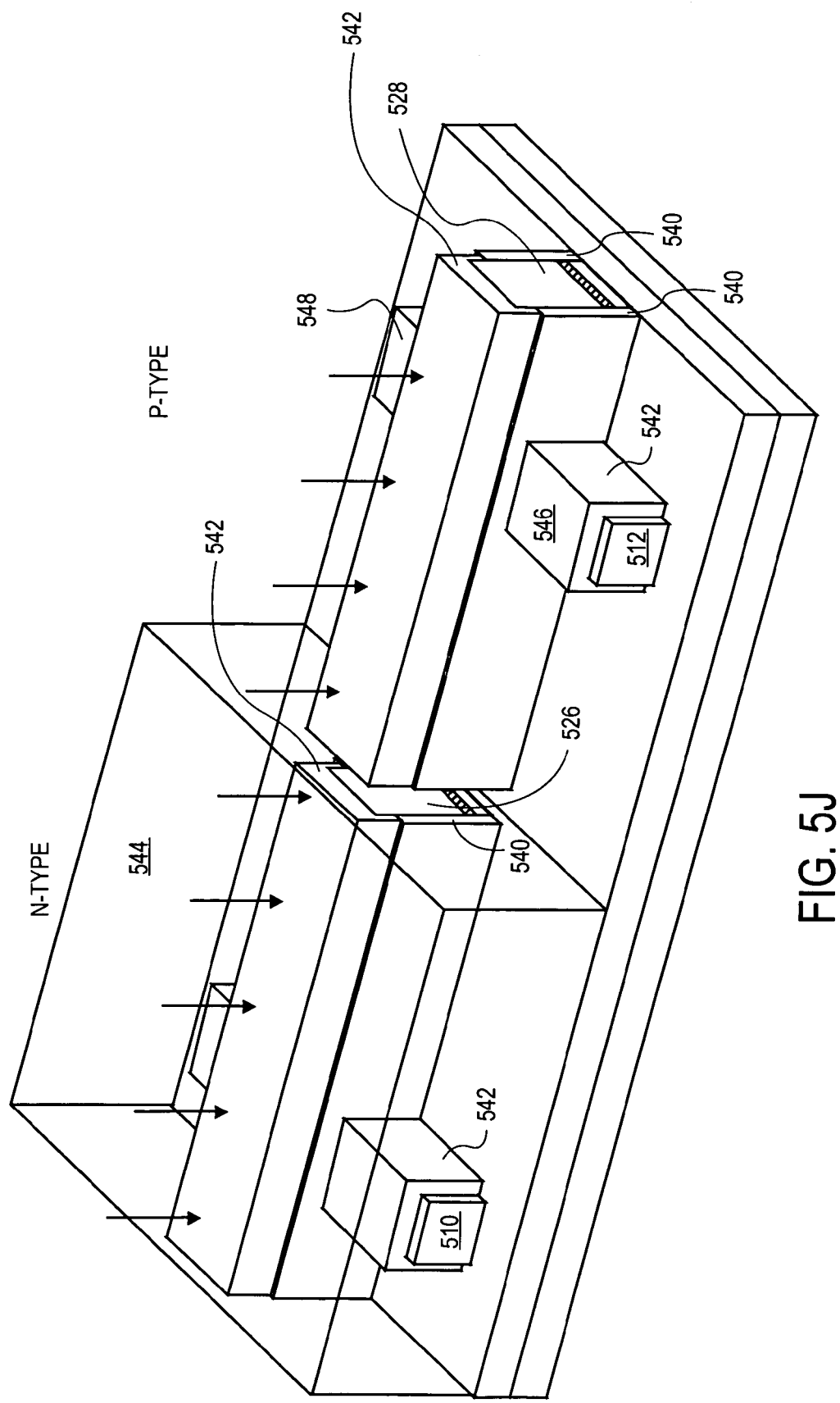

Next, if desired, the substrate shown in FIG. 5G can be further processed to form additional features, such as heavily doped source/drain contact regions, deposited silicon on the source and drain regions as well as the gate electrode and the formation of silicide on the source and drain contact regions as well as the gate electrode, if desired. In an embodiments of the present invention, dielectric sidewalls spacer 540 can be formed on the sidewalls of gate electrodes 526 and 528 as shown in FIG. 5H. Sidewall spacers 540 can be utilized to offset heavy source/drain contact implants and can be used to isolate source/drain regions from the gate electrode during a selective silicon deposition process and can be used in a salicide process to form silicide on the source and drain regions as well as on the top of the gate electrode, if desired. Spacers 540 can be formed by blanket depositing a conformal dielectric film, such as but not limited to silicon nitride, silicon oxide, silicon oxynitride or combination thereof over the substrate including the gate electrodes 526 and 528 and semiconductor bodies 510 and 512. The dielectric film is deposited in conformal manner so that it forms to substantially equal heights on vertical surfaces, such as the sidewalls of the gate electrodes 526 and 528, as well as on horizontal surfaces, such as in the top of the semiconductor bodies and the top of the gate electrode 526 and 528. In an embodiment of the present invention, the dielectric film is a silicon nitride film formed by a hot wall, low pressure chemical vapor deposition (LPCVD) process. The deposited thickness of the dielectric film determines the width or thickness of the formed spacers. In an embodiment of the present invention, the dielectric film is formed to a thickness between 20–200 Å. Next, the dielectric film is anisotropically etched by, for example, plasma etching or reactive ion etching to form the sidewall spacers 540. The anisotropic etch of the dielectric film removes the dielectric film from horizontal surfaces, such as top of gate electrodes 526 and 528 and leaves dielectric sidewalls spacers 540 adjacent to the vertical surfaces, such as the sidewalls of gate electrodes 526 and 528. The etch is continued for sufficient period of time to remove the dielectric film from all horizontal surfaces. In an embodiment of the present invention, an over etch is utilized so that the spacer material on the sidewalls of the semiconductor body 510 and 512 is removed as shown in FIG. 5H. The result is the formation of sidewall spacers 540 which run along and adjacent to the sidewalls of gate electrodes 526 and 528 as shown in FIG. 5H.

Next, if desired, a semiconductor film 542 can be formed on the exposed surfaces of semiconductor body 510 and 520 (as well as on landing pads, if used) as shown in FIG. 5. Additionally, if desired, semiconductor film 542 can be formed on the top of the gate electrodes 526 and 528, if desired. The semiconductor film can be a single crystalline film or a polycrystalline film. In an embodiment of the present invention, the semiconductor film 542 is an epitaxial or (single crystalline) silicon film. In an embodiment of the present invention, the silicon film 542 is formed by a selective deposition process whereby silicon is formed only on exposed regions which contain silicon, such as the exposed top surface and sidewalls of silicon bodies 510 and 512. In a selective deposition process, a silicon film does not form on dielectric areas, such as sidewall spacers 540. When gate electrode 526 and 528 include a top polycrystalline silicon film, silicon can also be selectively formed on the top surface of the gate electrode to form a silicon film 542 thereon. In an embodiment of the present invention, a silicon film 542 is formed to a thickness between 50–500 Å. In an embodiment of the present invention, the silicon film is formed to a thickness sufficient to provide enough silicon to be used or consumed during the formation of a silicide film on the source and drain regions. In an embodiment of the present invention, the deposited silicon film 542 is an intrinsic silicon film (i.e., an undoped silicon film). The deposition of a semiconductor film 542 creates raised source and drain regions which improves the parasitics of the transistors. Next, in an embodiment of the present invention, as shown in FIGS. 5J and 5K, the deposited silicon film 542 is doped to the conductivity and density desired for the source and drain contact regions. For example, as shown in 5J, a photoresist mask 544 is formed over the region of the substrate for the n type device and the p type device left unmasked. Next, an ion implantation step is utilized to implant p type conductivity ions, such as boron, into the deposited semiconductor film 542 as well as into the semiconductor body 512 to form heavily doped source/drain regions. The ion implantation process can dope the deposited silicon film 542 and the silicon body 512 located underneath to a p type conductivity type with a concentration between $1 \times 10^{20}$ to $1 \times 10^{20}$ atoms/cm$^3$ to form a source contact region 546 and a drain contact region 548. Sidewall spacers 540 offset the heavy source/drain implantation step and define the tip regions as the regions of the doped semiconductor body 512 beneath sidewall spacers 540. The above referenced process form a source region and a drain region which each comprise a tip region 534 and a contact regions 546 and 548. The tip region 534 is a region of the semiconductor body 512 located beneath the sidewall spacers 540. The contact regions 546 and 548 are the region of the semiconductor body and deposited silicon film which are adjacent to the outside edge of the sidewall spacers 540. Photoresist mask 544 can then removed.

Figure 5K:
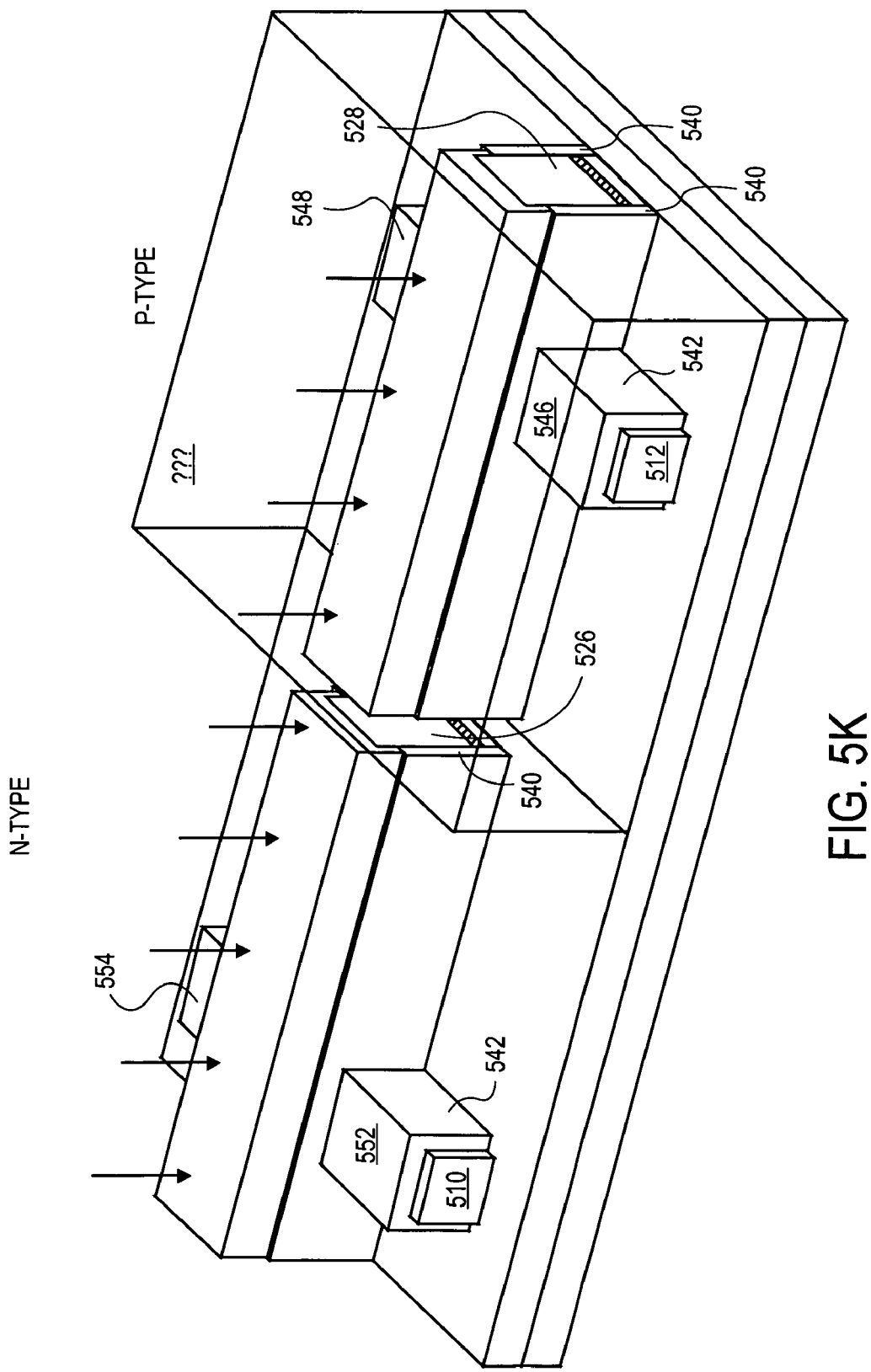

Next, as shown in FIG. 5K, a photoresist mask 550 is formed over the p type region of the substrate and the n type region left unmasked. Next, n type conductivity ions, such as arsenic and phosphorous, are ion implanted into the semiconductor film 546 as well as into the semiconductor body 510 located beneath. The ion implantation process dopes the deposited silicon film 542 and the silicon body 512 located underneath to a concentration between $1 \times 10^{20}$ to $1 \times 10^{21}$ atoms/cm$^3$ to form a source contact regions 552 and a drain contact region 554. The sidewall spacers 540 offset the n type source/drain contact implantation step and define the n type tip regions 536 as a region of the doped semiconductor body 510 located beneath sidewall spacers 540. After forming the source/drain contact regions 550 and 552 the photoresist mask 554 can be removed.

It is to be noted, at this time the implanted dopants which from the tip regions 536 and 534 and the source/drain contacts regions are not yet activated. That is, they have been implanted into the semiconductor material but sit in interstitial sites and have not yet been incorporated into the semiconductor or silicon crystal lattice. A high temperature anneal is required to activate the dopants. In an embodiment of the present invention, the dopants are activated with a rapid thermal anneal process at a temperature between 600–1100° C. for a time between 1–60 seconds in a atmosphere comprising argon and nitrogen. Alternatively, the source/drain dopants can be activated by the anneal used to subsequently form silicide on the transistor as described below.

Figure 5L:
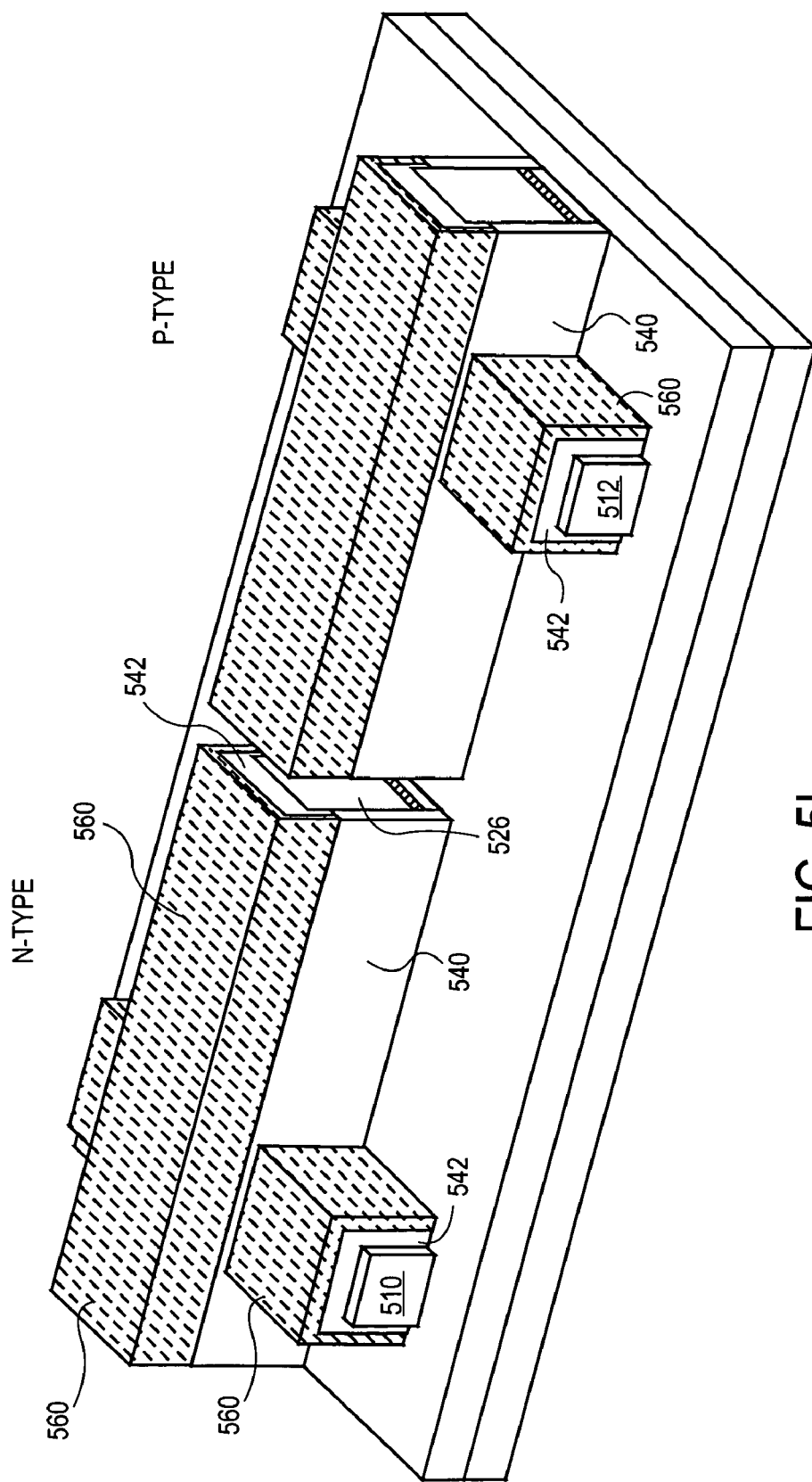

Next, if desired, as shown in FIG. 5La refractory metal silicide layer 560 can be formed on the source and drain contact regions of a p and n type device as well as on the top of the gate electrode 526 and 528, if desired. A refractory metal silicide film 560 can be formed with a self-aligned process, such as a silicide process. In a salicide process, a refractory metal film, such titanium, tungsten, nickel, colbalt or alike are blanket deposited over the substrate and silicon films formed on the semiconductor bodies 510 and 512 and gate electrode 526 and 528. The substrate is then heated to a suitable temperature to cause a refractory metal film to react with silicon portions of the substrate, such as silicon film 542 formed on semiconductor bodies 510 and 512 and semiconductor film 542 formed on the gate electrodes in order to form a refractory metal silicide 560. Locations where silicon is unavailable to react, such as dielectric spacers 540 and exposed portions of buried oxide 506 do not react and remain as refractory metal. As selective etch, such as a wet etch, can then be utilized to remove the unreacted refractory metal and leave refractory metal silicide 560 on the contact areas. In this way, metal silicide films can be self-aligned to the contact regions of the nonplanar transistors. This completes fabrication of the n type and p type nonplanar devices. Well known interconnect technology can then be utilized to electrically couple the n type and p type devices together into functional complimentary metal oxide semiconductor (CMOS) integrated circuits.

Figure 6A:
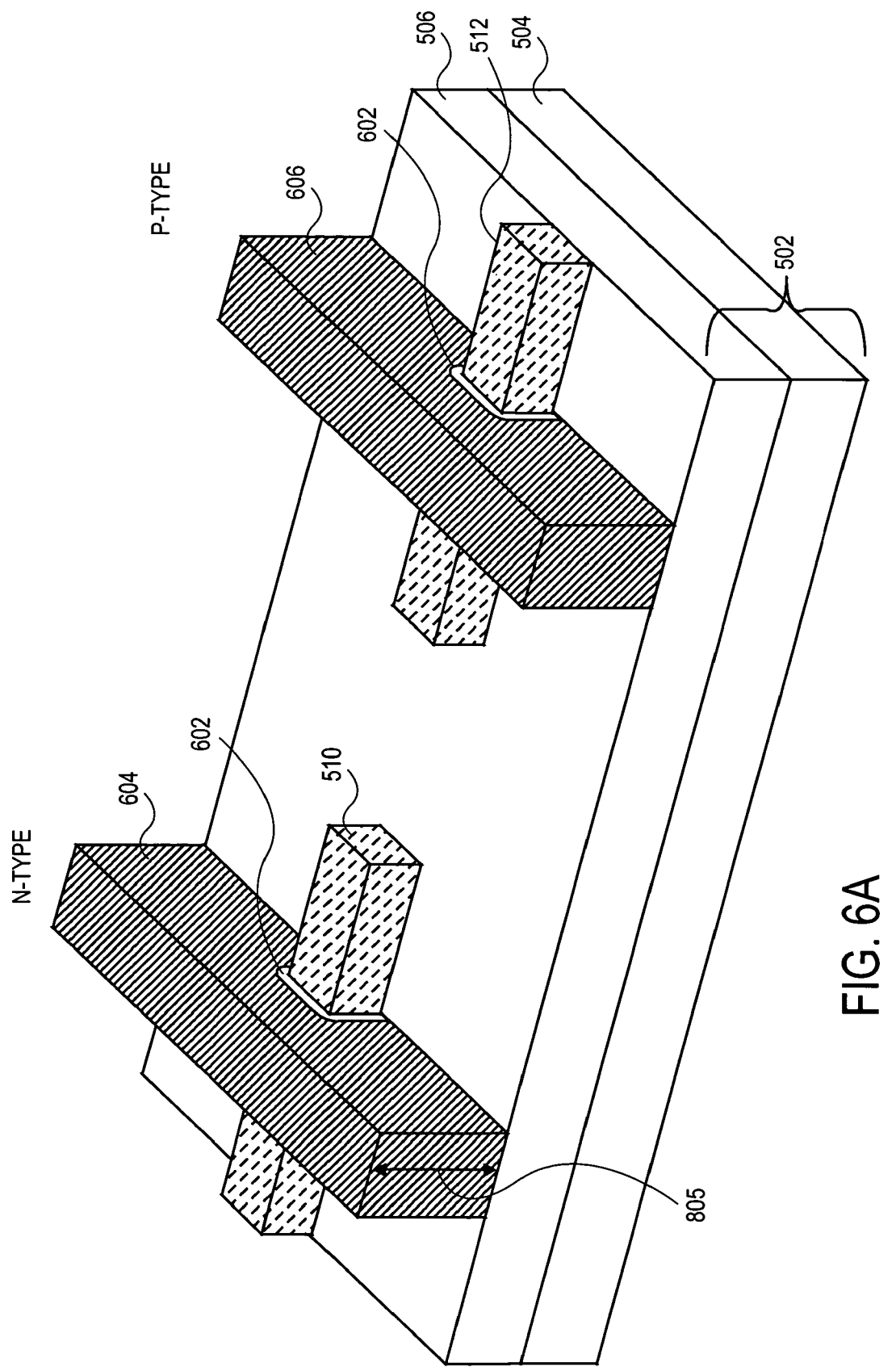
FIGS. 6A–6O illustrate a method of fabricating a CMOS integrated circuit comprising an n type nonplanar transistor with a metal gate electrode and a p type nonplanar transistor with a metal gate electrode utilizing a replacement gate fabrication process.
Figure 6B:
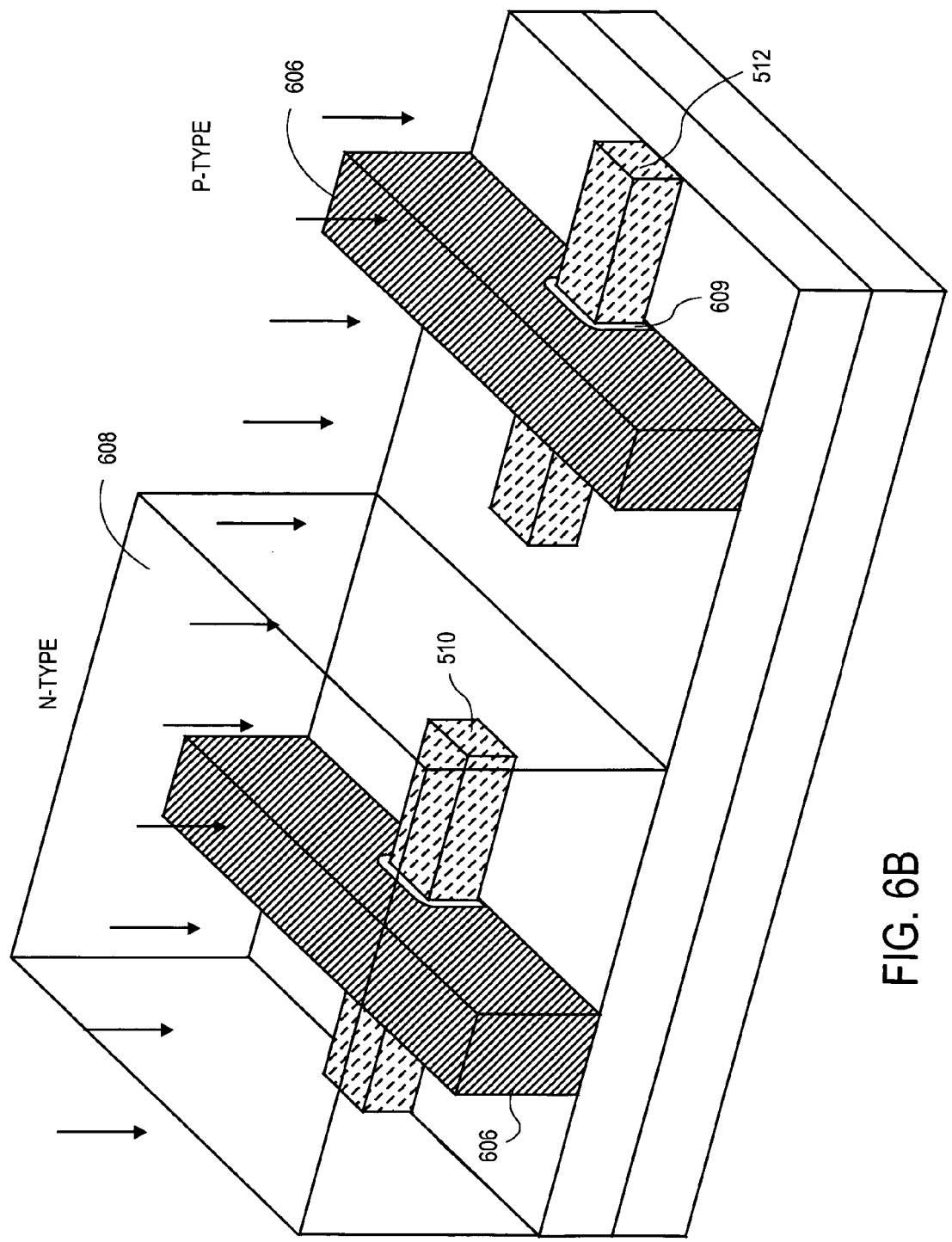
Figure 6C:
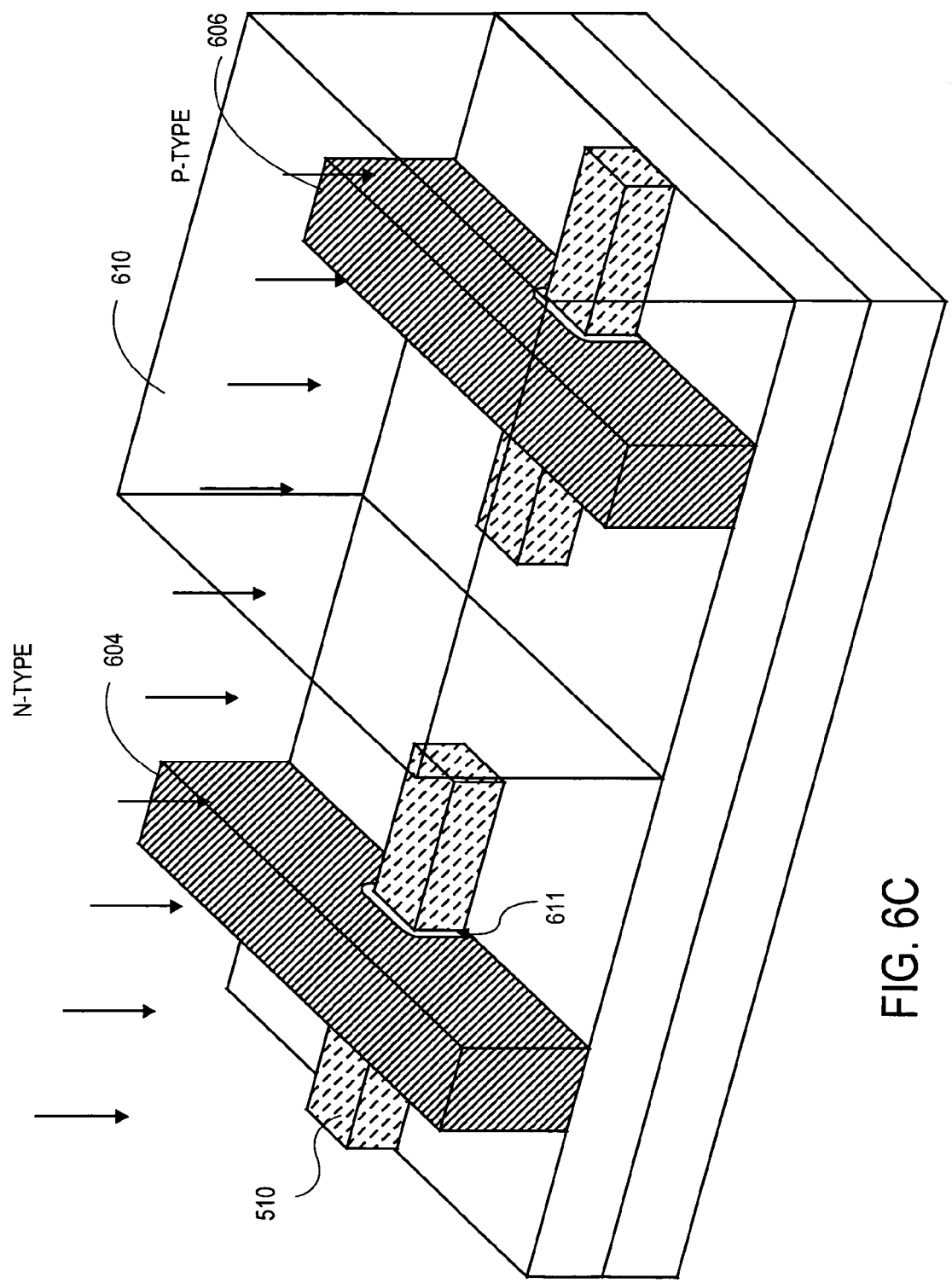
Figure 6D:
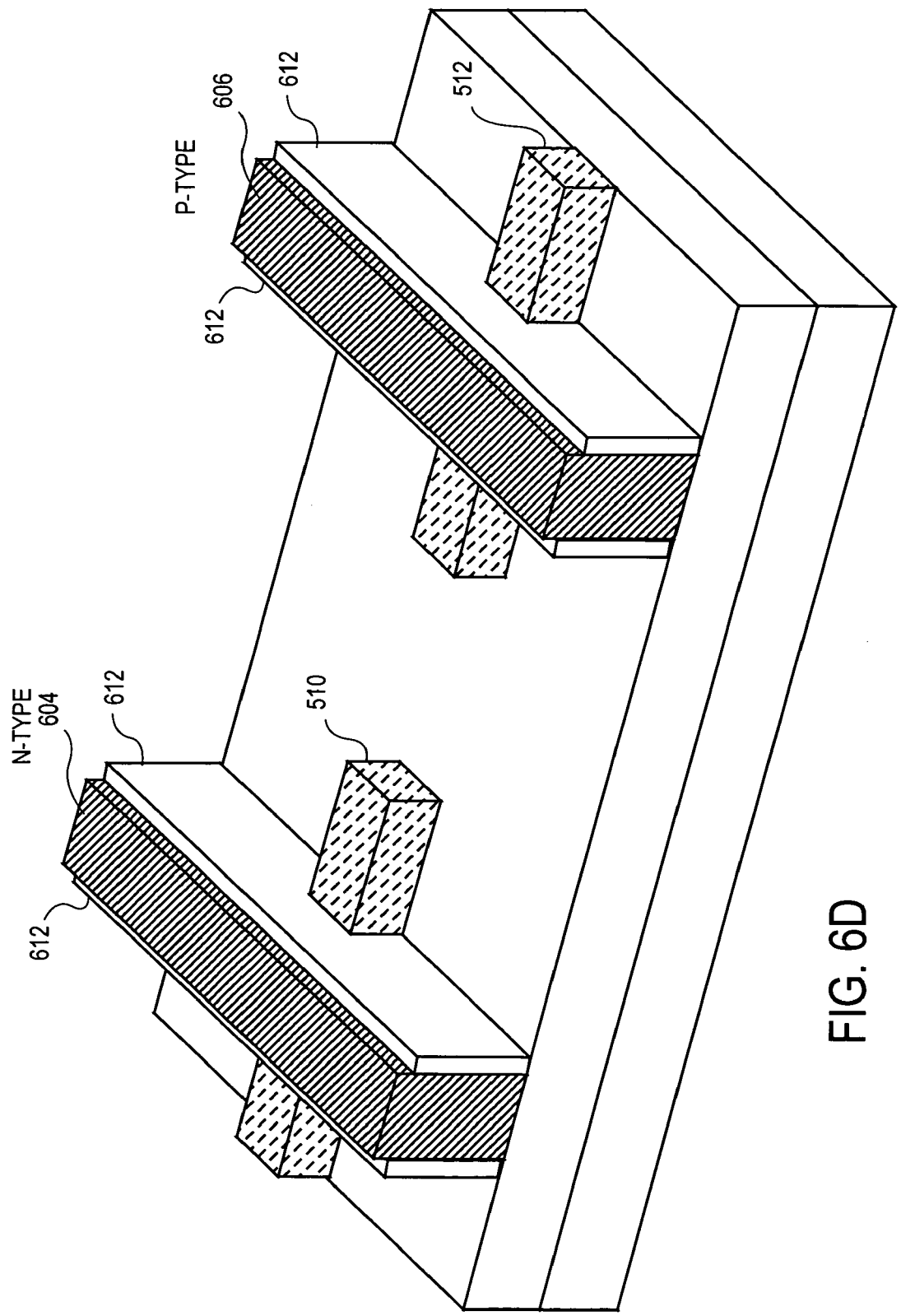
Figure 6E:
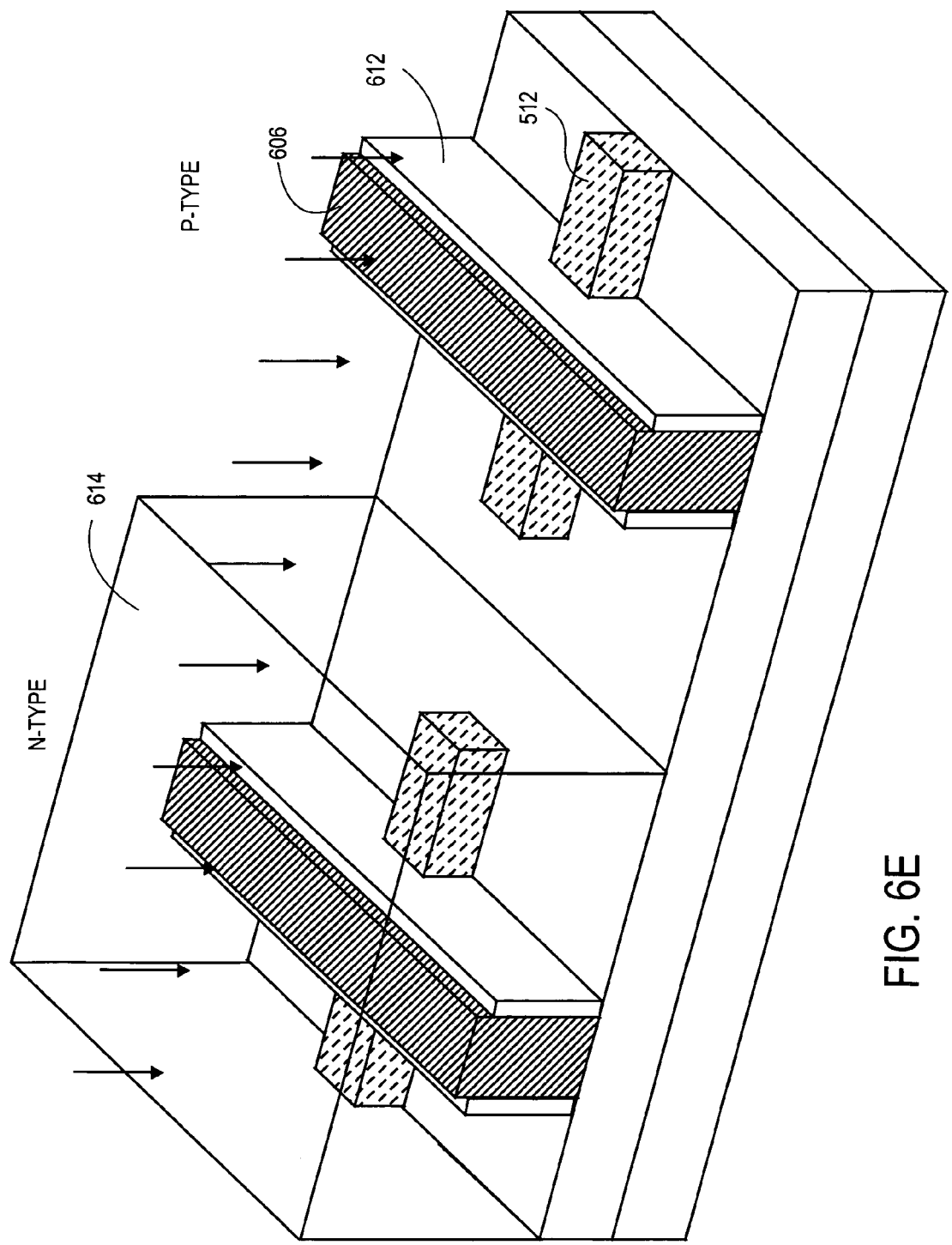
Figure 6F:
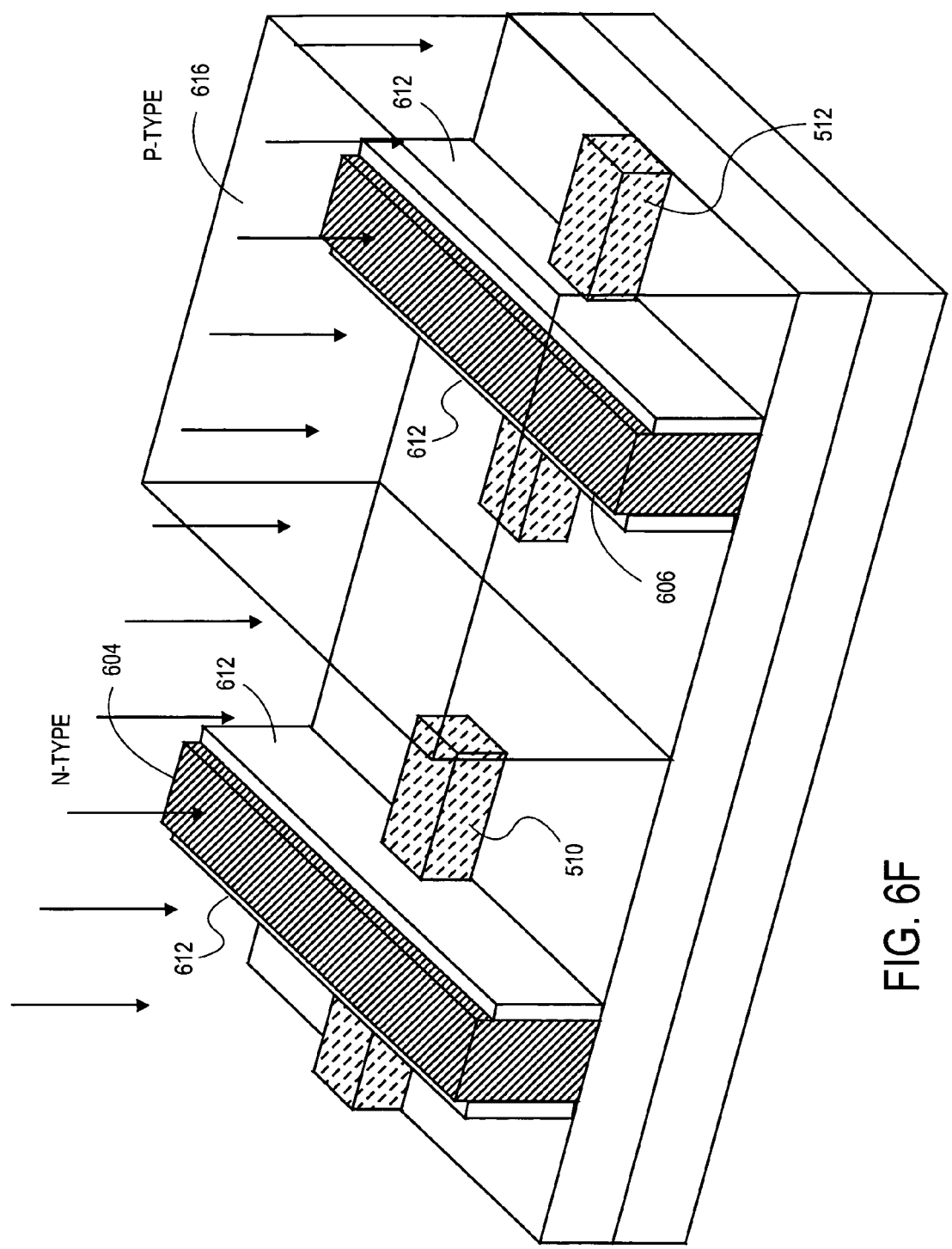
Figure 6G:
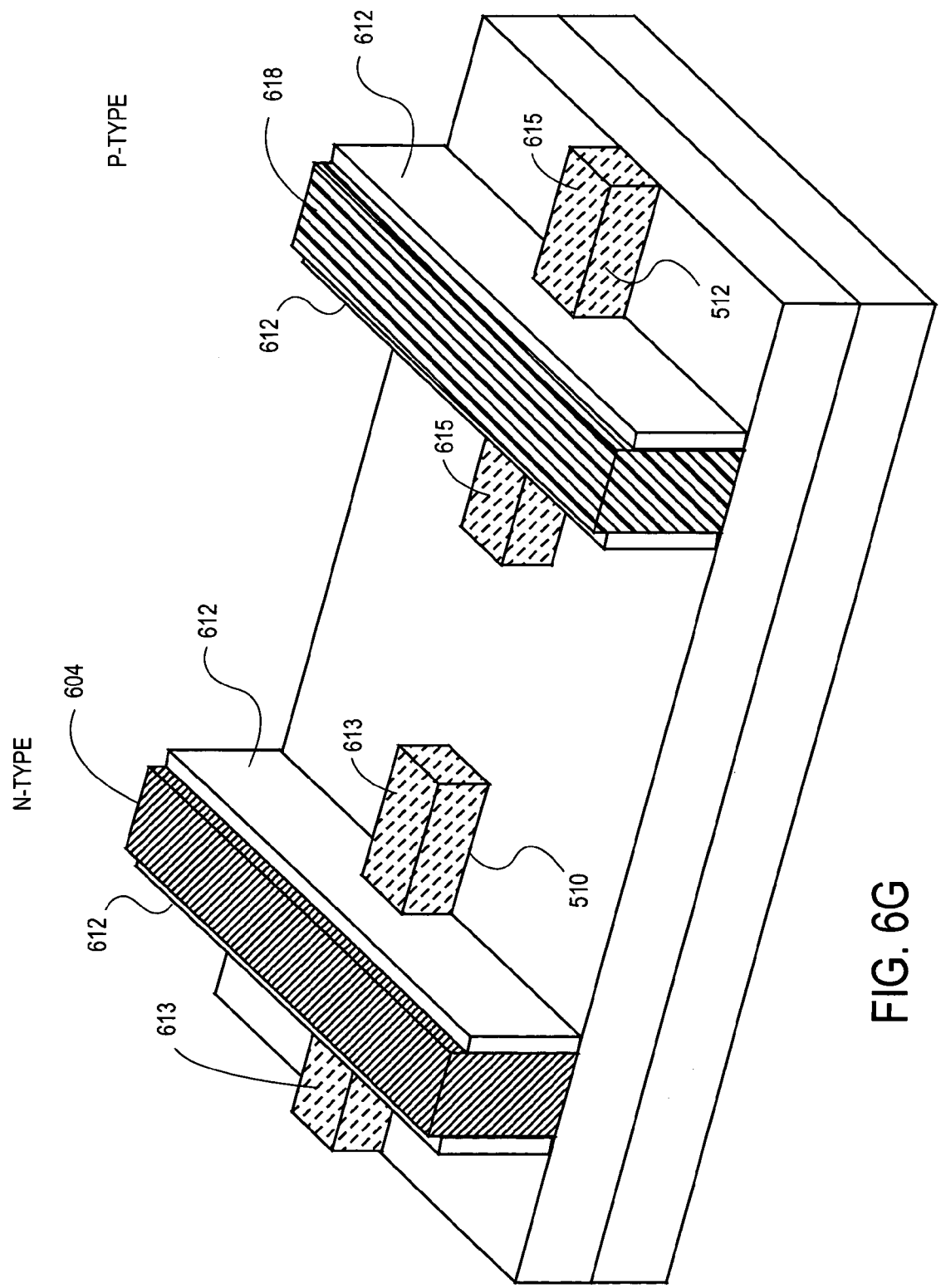
Figure 6H:
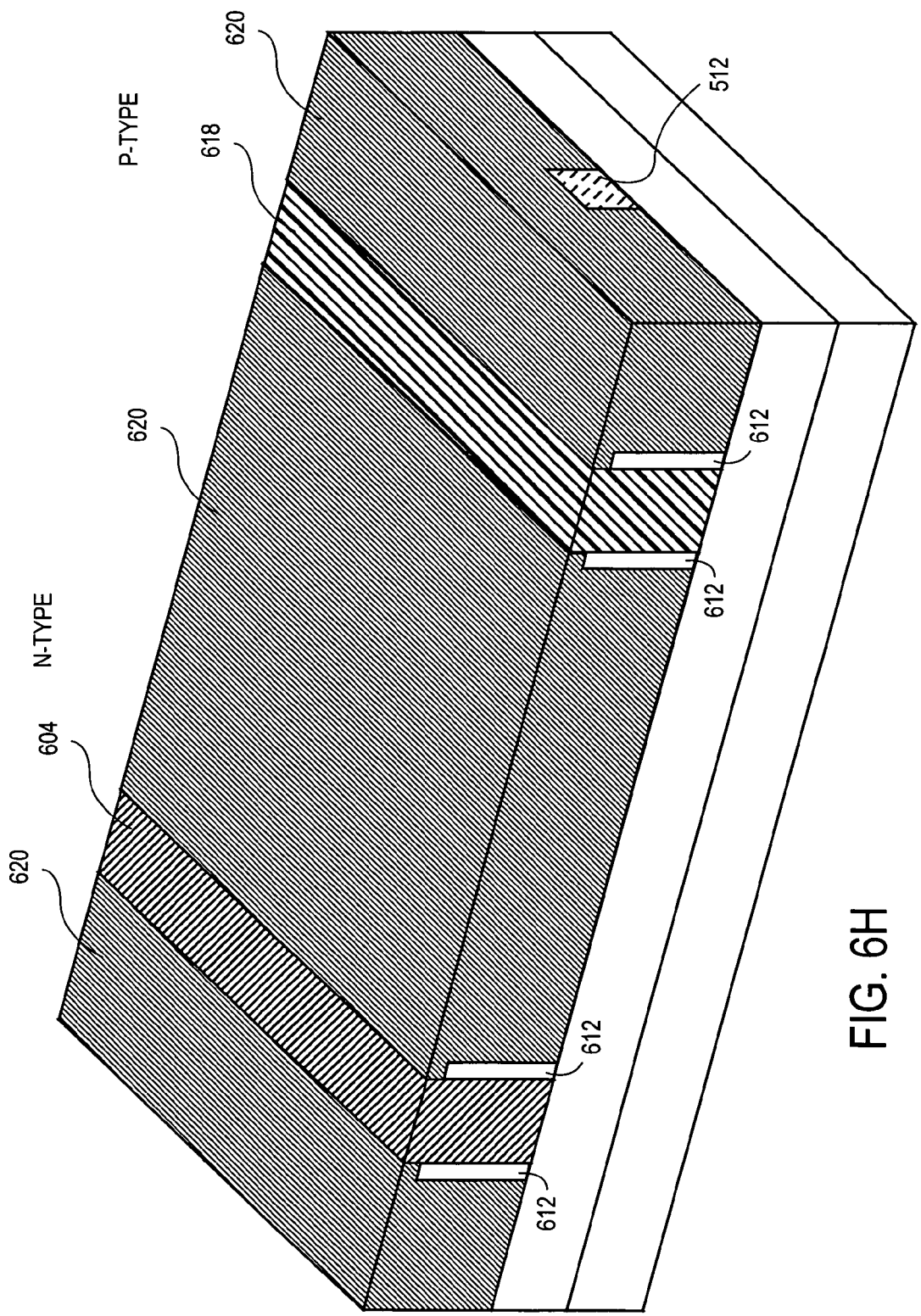
Figure 6I:
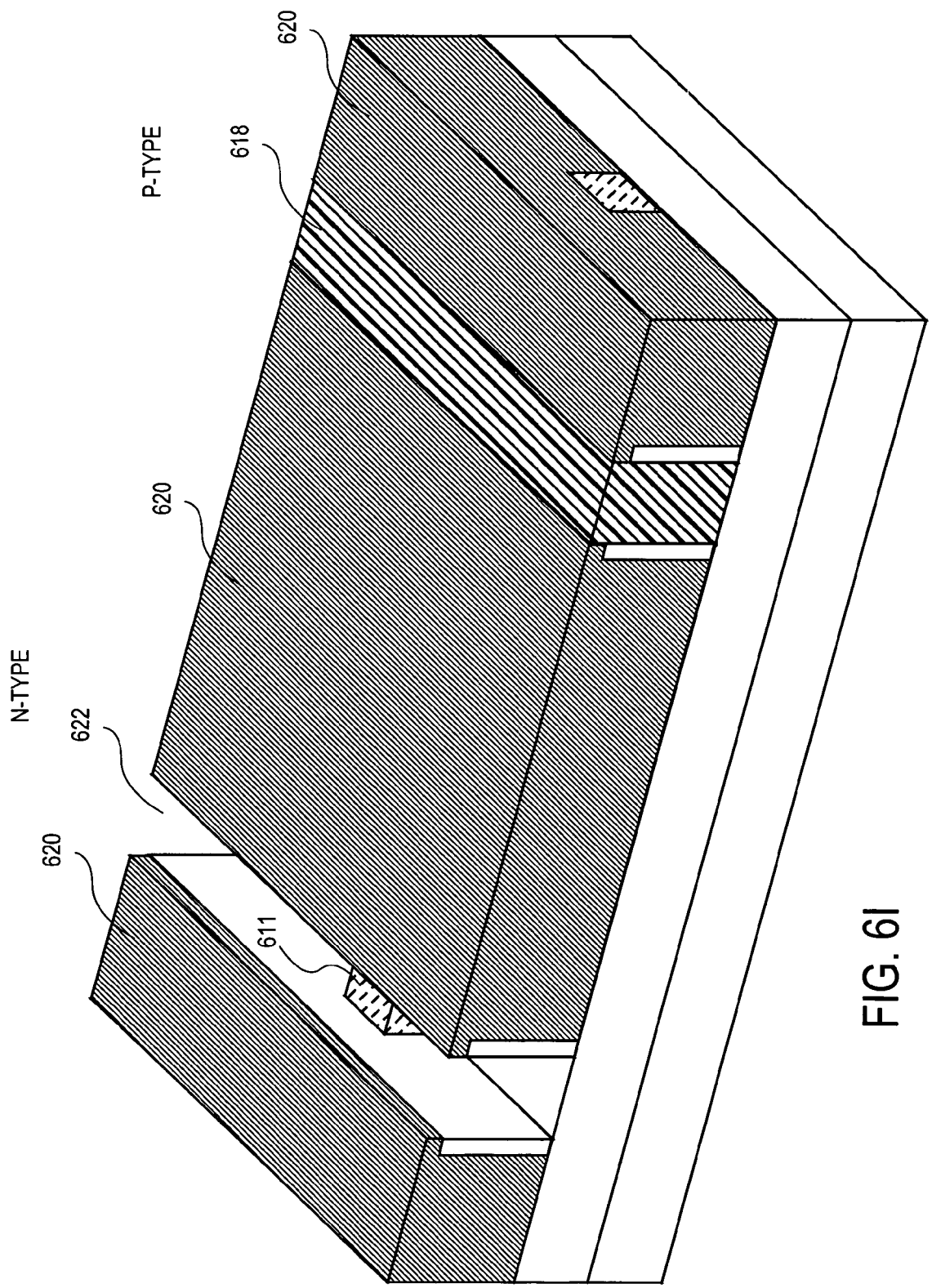
Figure 6J:
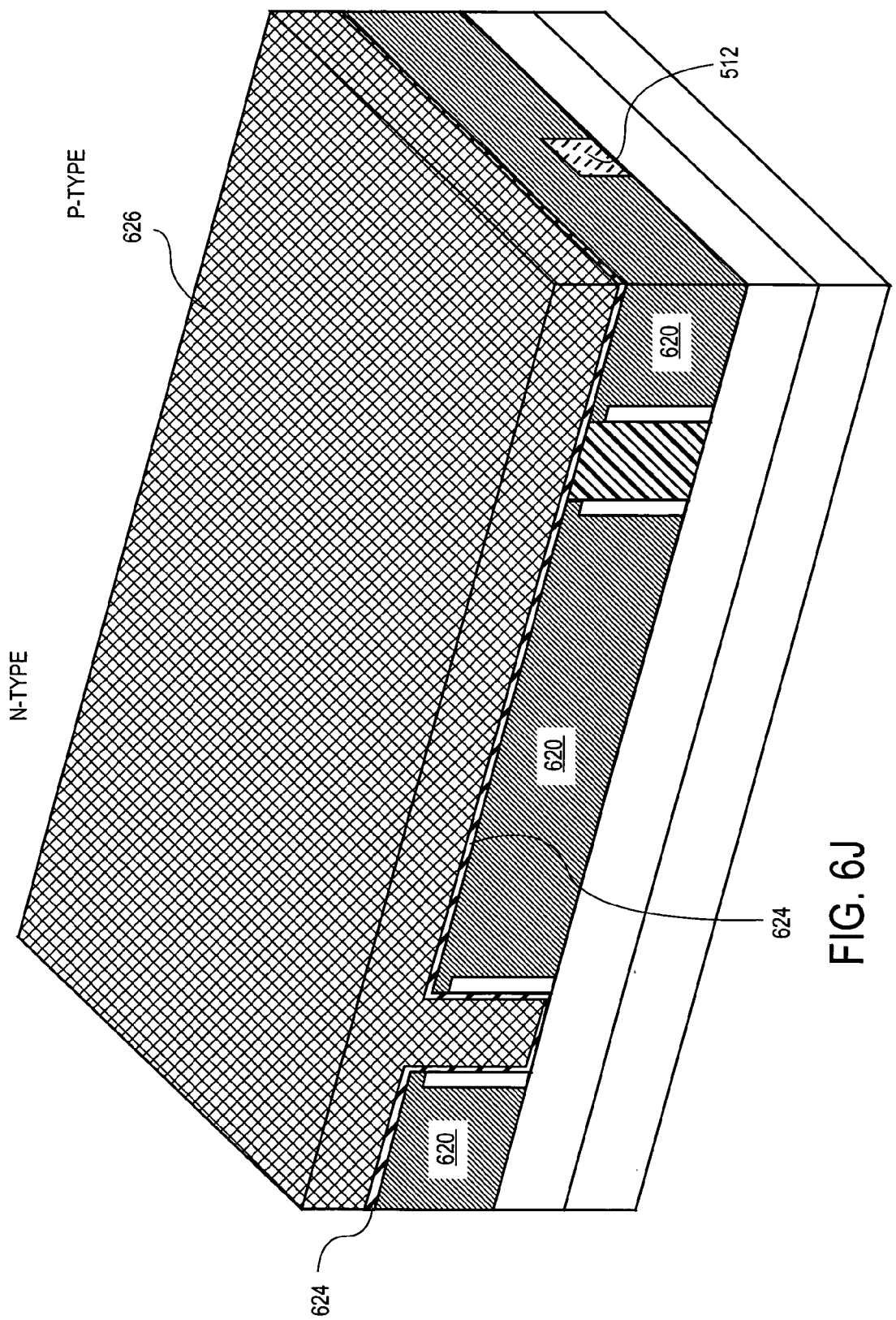
Figure 6K:
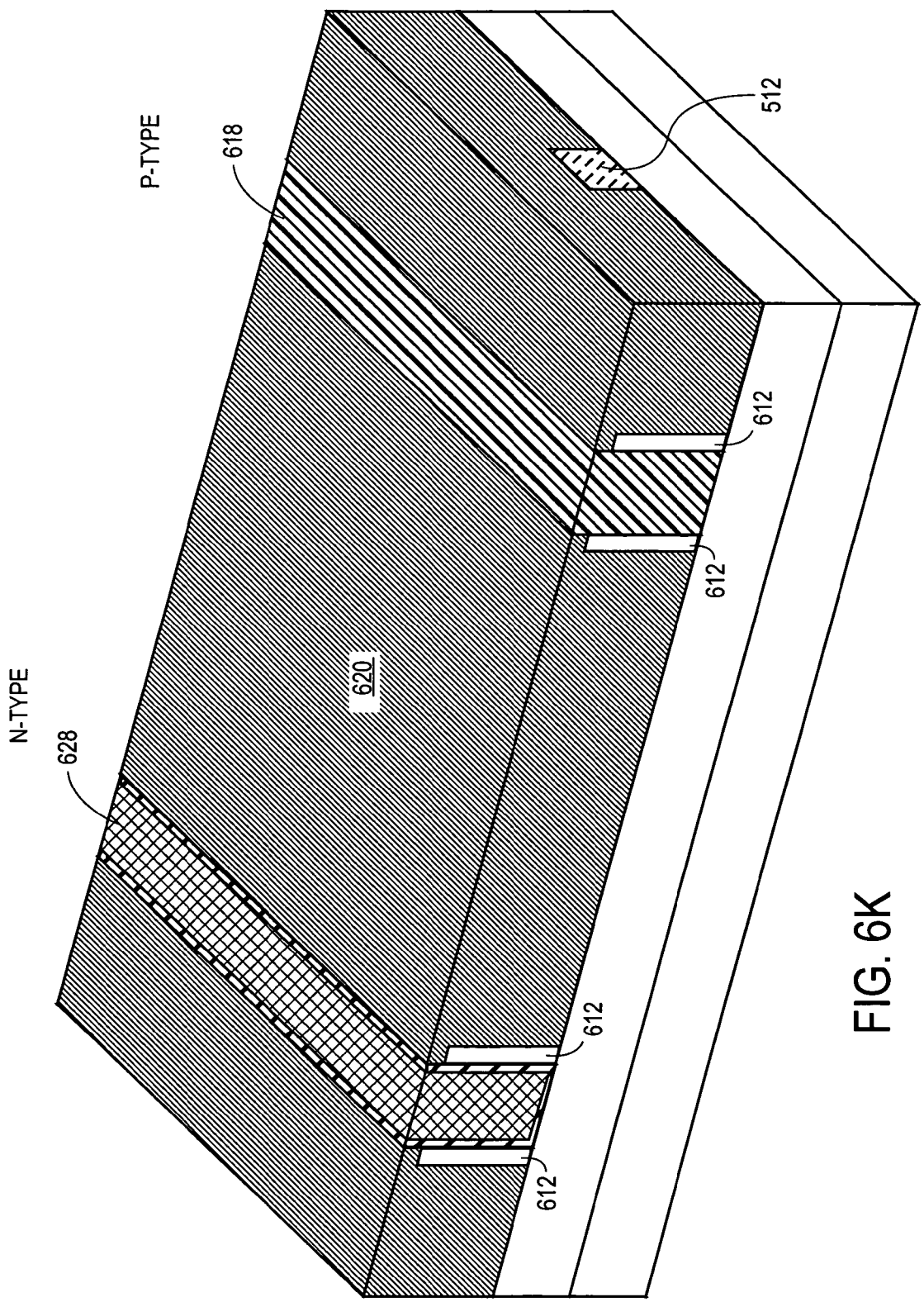
Figure 6L:
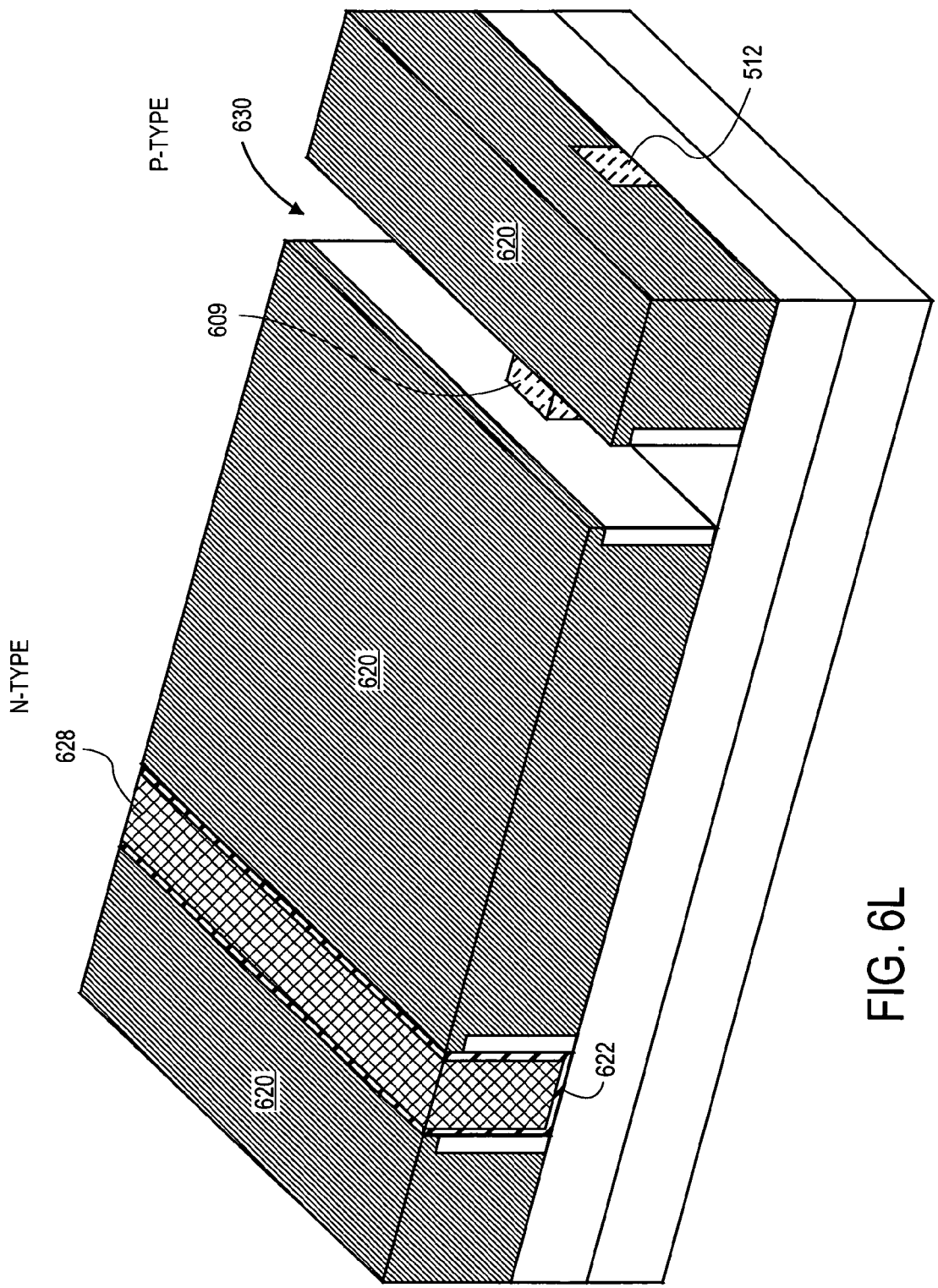
Figure 6M:
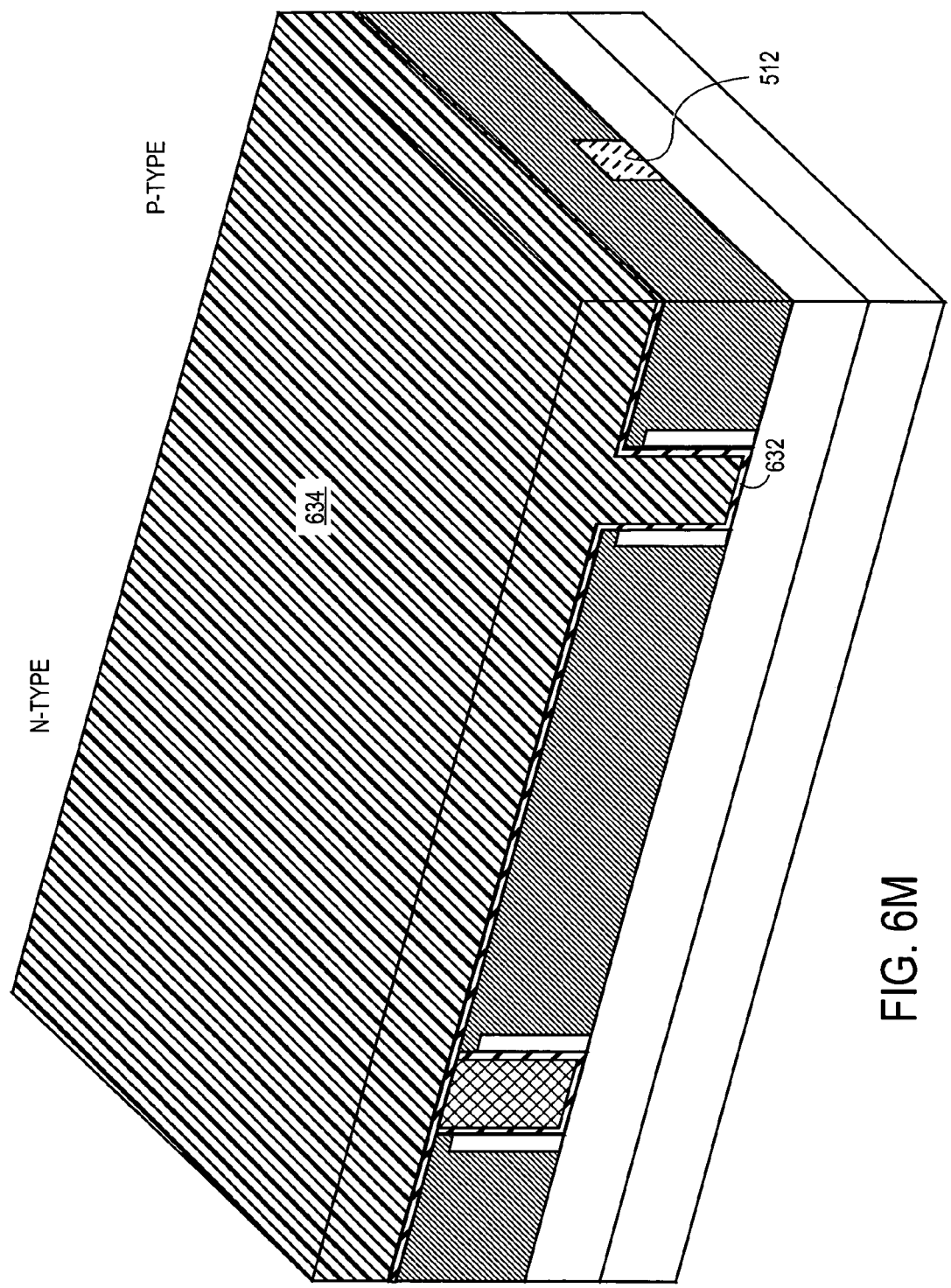
Figure 6N:
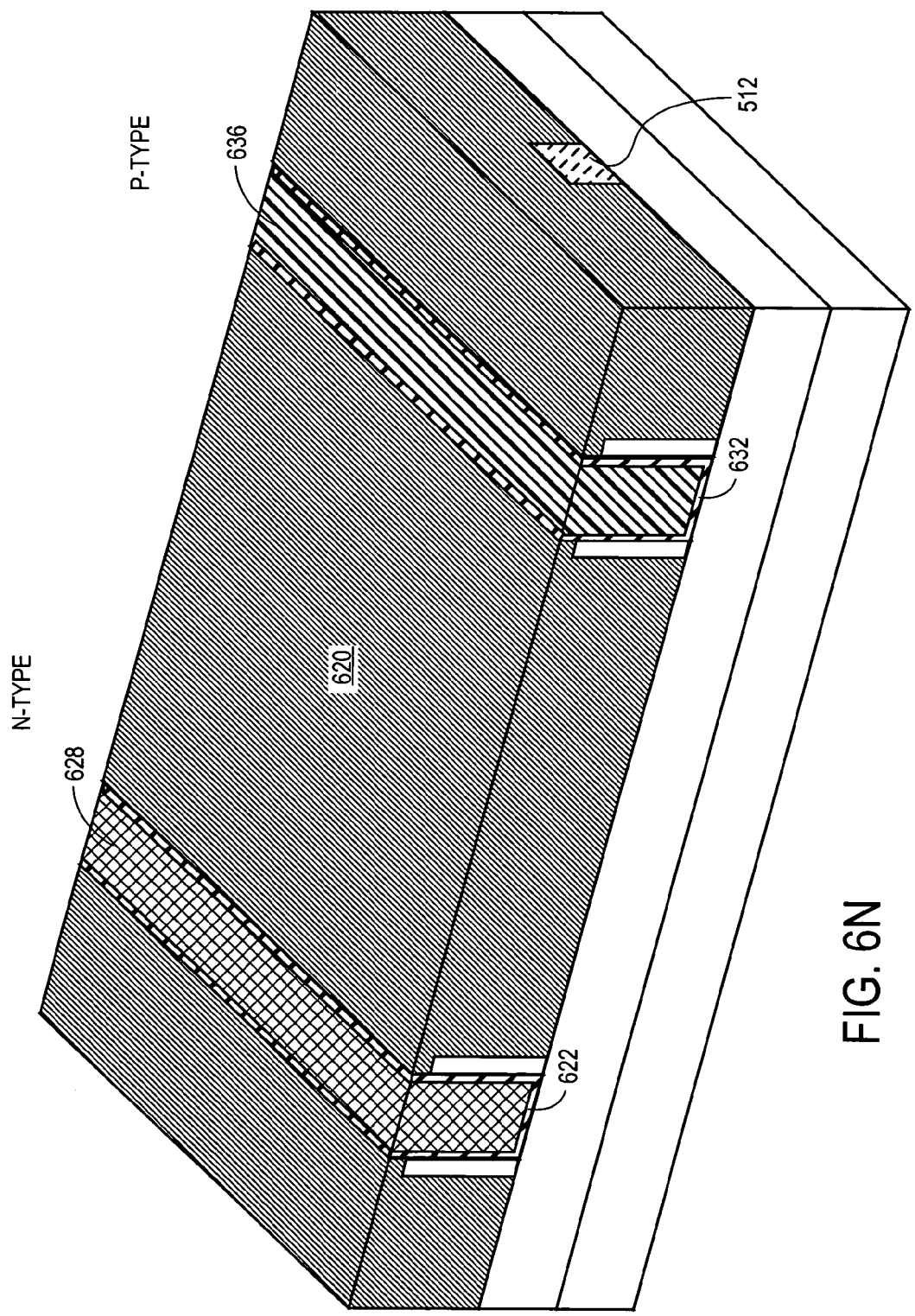
Figure 6O:
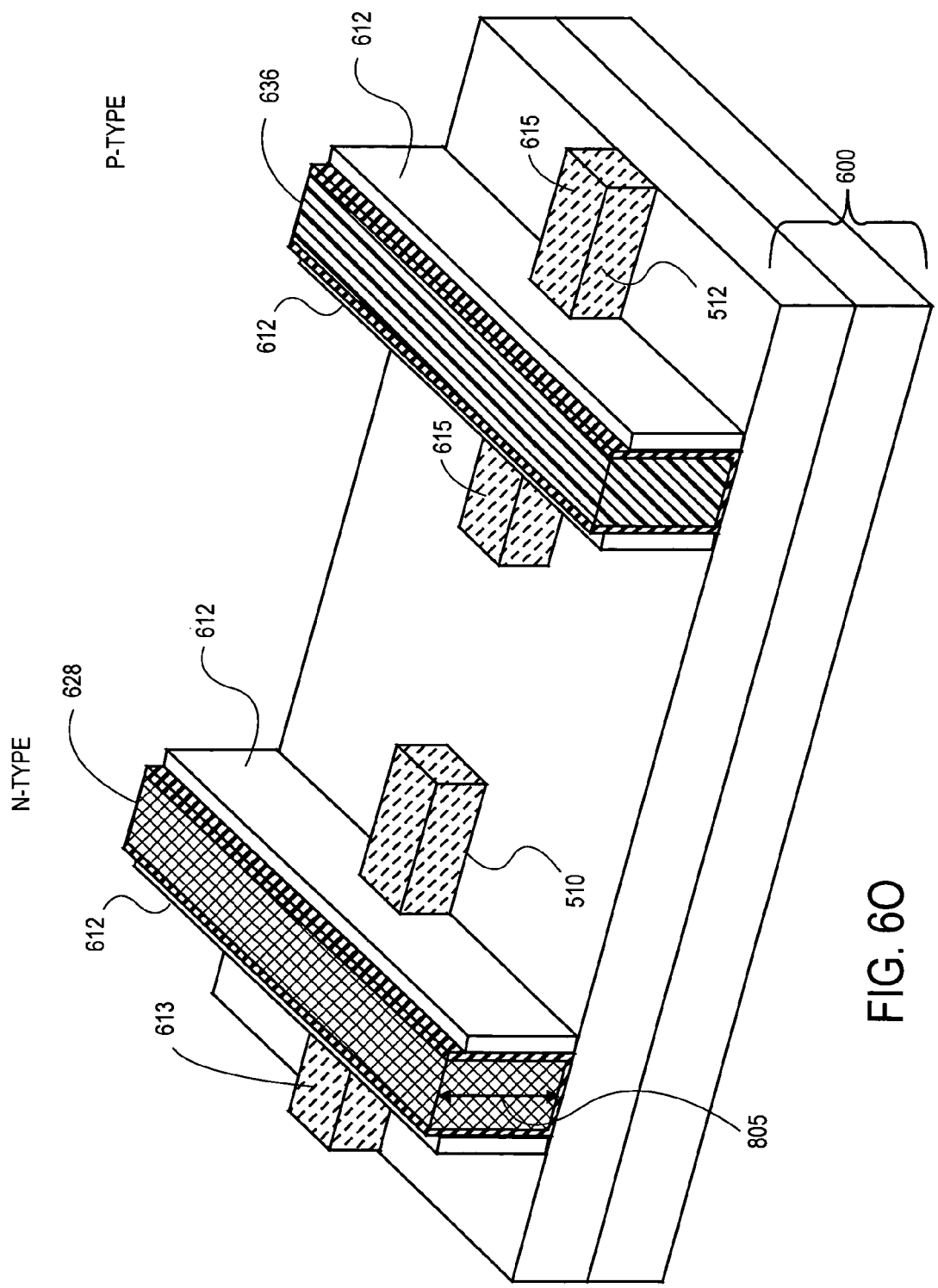

FIGS. 6A–6O illustrate a method of forming a p type nonplanar device with a metal gate electrode and a n type nonplanar device with a metal gate electrode utilizing a replacement gate technique. The replacement gate technique enables the gate electrodes for the p type device and the n type device to be formed of different materials. In this way, the gate electrode for the p type device can have a work function tailored for the p type device and the gate electrode for the n type device can have a work function tailored for the n type device. By tailoring the work functions of the gate electrodes for the particular device type, the performance of the CMOS integrated circuit can be dramatically improved.

The replacement gate process begins with the formation of a semiconductor body or bodies 510 for the n type device and a semiconductor body or bodies 512 for the p type device as discussed above. After the patterning of a semiconductor film to form the semiconductor bodies 510 and 512 (and source/drain landing pads, if desired) a sacrificial gate dielectric layer 602 and a sacrificial gate electrode 604 are formed over the top surface and sidewalls of the silicon bodies 510 and 512 as shown in FIG. 6A. In order to form the sacrificial gate dielectric 602 and sacrificial gate electrode 604 and 606, first a sacrificial gate dielectric layer 602 over the top surface of the sidewalls of the semiconductor bodies 510 and 512. The sacrificial gate dielectric 602 is ideally formed from a material which will not sufficiently etch during the removal or etching of the sacrificial gate electrode material so that it can protect the underlying semiconductor body when the sacrificial gate electrode is subsequently removed. This is especially important when the sacrificial gate electrode material and semiconductor body are formed from the same material, such as silicon. In an embodiment of the present invention, the sacrificial gate dielectric is an oxide, such as silicon dioxide formed to a thickness between 10-30 Å. If the sacrificial gate dielectric is a grown dielectric it will form only on the exposed surfaces of the semiconductor body 510 and not on the insulating substrate 502. If the sacrificial gate dielectric is a deposited film it will be blanket deposited onto the insulating substrate 502 as well as the semiconductor bodies 510 and 512.

Next, a sacrificial gate electrode material is blanket deposited over the sacrificial gate dielectric, the sacrificial gate electrode material is deposited to a thickness desired for the height of the subsequently formed gate electrodes for the nonplanar devices. The sacrificial gate electrode material and the sacrificial gate dielectric are then patterned by well known techniques, such as photolithography and etching to form the sacrificial gate electrode 604 for the n type device and the sacrificial gate electrode 606 for the p type device as shown in FIG. 6A. The sacrificial gate electrode 604 and 606 are patterned into the same shape and at the same location where the subsequently formed gate electrodes for the p type device and the n type device are desired.

The sacrificial gate electrode material is a material which can be altered into an altered sacrificial material so that either the sacrificial material or the altered sacrificial material can be selectively etched or removed without etching or removing the other. That is, the sacrificial gate electrode material is formed of a material which can be altered so that either: 1) the altered sacrificial material can be etched or removed without etching the unaltered sacrificial material or 2) the unaltered sacrificial material can be removed of etched away without etching or removing the altered sacrificial material. As will be discussed below, this differentiating of the p type sacrificial gate electrode and n type sacrificial gate electrode will enable the different sacrificial gate electrodes to be removed at separate times enabling the openings to be subsequent filled with different materials.

In an embodiment of the present invention, the sacrificial material is a material having a crystalline structure, such as a polycrystalline film or single crystalline film which can be altered by increasing the activation energy necessary to etch the film. In an embodiment of the present invention, the sacrificial film is crystalline film which can be altered by changing the crystal lattice so that altered crystal lattice has a sufficiently different activation energy than the unaltered crystal lattice. In an embodiment of the present invention, the sacrificial material is crystalline film which is altered by substituting dopant atoms with atoms in the crystal lattice in the film to thereby form an altered crystal lattice which has a higher activation energy than the unaltered crystal lattice. In other words, dopants are placed in the crystal lattice to alter the sacrificial film and give it a higher activation barrier than does the unaltered sacrificial film. In this way, an etchant which has an sufficiently high activation energy to etch away the unaltered film but not a high enough activation energy to etch the altered film, will only etch the unaltered film and will not etch the altered film. As such, an embodiment of the present invention utilizes a sacrificial material which can be altered to create a sufficiently different lattice energy so that the difference can be exploited to selectively remove of one without the other. In an embodiment of the present invention, the difference between the activation energy of the sacrificial gate electrode over the n type region and the altered sacrificial gate electrode over the p type region is sufficient to enable the etching of one without the etching of the other. Additionally, in an embodiment of the present invention, the sacrificial gate electrode material for the p type device and the sacrificial gate electrode material for the n type device are both altered, but are altered in such a manner that a difference between the altered films is sufficient to enable a selective etching one over the other. In an embodiment of the present invention, the sacrificial film is a polycrystalline silicon film. In other embodiments of the present invention, the sacrificial film is monocrystalline silicon film or an epitaxial silicon film. In an embodiment of the present invention, the polycrystalline silicon sacrificial gate electrode material is altered by substituting boron atoms for silicon atoms in the crystal lattice.

Next, if desired, tip or source/drain extensions can be formed by doping the semiconductor bodies 510 and 512 on opposites sides of the sacrificial gate electrodes 604 and 606 with impurities of the same conductivity type to be used to form the source and drain regions. In an embodiment of the present invention, the tip regions are formed utilizing well known ion implantation techniques. First, as shown in FIG. 6B a photoresist mask 608 can be formed over the regions for the n type device and the region for the p type device left unmasked. P type impurities can then be ion implanted into the semiconductor body 512 in alignment with the outside edges of the sacrificial gate electrode 606 for the p type device. The sacrificial gate electrode 606 prevents the channel region 609 of the semiconductor body 512 from being doped with p type dopants during the tip formation step. The sacrificial gate electrode becomes doped with p type dopants this at this time. The implantation process places p type dopants, such as boron, into the sacrificial gate electrode 606. However, because the dopants have not yet been activated at this time by a high temperature process, the dopants atoms reside at interstitial sites of the lattice, and are not yet substituted with atoms in the lattice. In an embodiment of the present invention, when semiconductor body 512 and sacrificial gate electrode 606 are silicon, they can be doped with boron ions at does and with energies well known in the art to subsequently form a boron concentration between $1\times10^{19}$ to $1\times10^{21}$ atoms/cm$^3$. Photoresist mask 608 prevents the n type device from being doped with p type conductivity ions.

Next, as shown in FIG. 6C, the photoresist mask 608 is removed and a photoresist mask 610 formed over the p type device and the n type device left unmasked. Next, n type impurity ions are implanted into the semiconductor body 510 on opposite sides of the sacrificial gate electrode 604. Sacrificial gate electrode 604 prevents the channel region 611 of a semiconductor body 510 from being doped during the tip formation step. The sacrificial gate electrode also becomes doped at this time with n type dopants. Because the dopants have not yet been activated by a high temperature process the dopants reside at intersitial sites in the lattices of the sacrificial gate electrode 604 and the semiconductor body 510, and have not yet substituted with atoms in the lattice. In an embodiment of the present invention, when semiconductor body 510 and sacrificial gate electrode 604 are silicon, arsenic or phosphorous atoms can be implanted at a dose with an energy well known in the art to create n type concentration of between $1\times10^{19}$ to $1\times10^{21}$ atoms/cm$^3$. The photoresist mask 610 is then removed.

Next, if desired, dielectric sidewall spacers 612 can be formed along opposite sidewalls of the sacrificial gate electrodes 604 and 606 as shown in FIG. 6D. The sidewall spacers can be formed by any well known techniques, such as by blanket depositing the conformal sidewall spacer dielectric over the substrate including the top surface and sidewalls of the sacrificial gate electrodes 604 and 606 as well as on the top surface and sidewalls of semiconductor bodies 510 and 512 as well as onto the exposed surface of the insulating substrate. The dielectric spacer material is deposited to a thickness which is approximately equal to the width desired for spacers 612. In an embodiment of the present invention, the dielectric spacer material is deposited to a thickness between 20–200 Å. The spacer material can be a dielectric, such as silicon nitride, silicon oxide, silicon oxynitride or combinations thereof. In an embodiment of the present invention, the spacer material is silicon nitride formed by a hot wall low-pressure chemical vapor deposition (LPCVD) process. The dielectric spacer material is then anisotropically etched back to remove the dielectric spacer material from a horizontal surface (e.g., top surface) of the sacrificial gate electrodes 604 and 606 and the top surface of semiconductor bodies 510 and 512 and insulating substrate 602, while leaving spacer material on the vertical surfaces (e.g., sidewalls) of sacrificial gate electrodes 604 and 606 to form sidewall spacers 612 as shown in FIG. 6D. By making the height 805 of the sacrificial gate electrodes 804 and 806 sufficiently taller (e.g., 3×) then the thickness of the height of the semiconductor bodies 510 and 512 and over (etch) of the anisotropic etch back can be used to remove the spacer materials from the sidewalls of the semiconductor bodies 510 and 512 while leaving sufficient spacer material to provide spacer 612 on the sidewalls of the sacrificial gate electrodes 604 and 606.

At this time, if desired, additional silicon can be formed onto the exposed top surface and sidewalls of the semiconductor bodies 510 and 512 in order to form raised source and drain regions. The additional silicon, such as epitaxial silicon, can be formed on the exposed surface of the semiconductor bodies 510 and 512 utilizing well known selective deposition process. A selective silicon deposition process will deposit silicon, such as epitaxial silicon onto silicon containing regions, such as silicon bodies 510 and 512 and will not deposit silicon onto non-silicon containing areas, such as sidewall spacers 612.

Next, heavy source/drain contact regions may be formed in the semiconductor bodies 510 and 512 on opposite sides of the sacrificial gate electrodes 604 and 606. In an embodiment of the present invention, the heavy source/drain regions are formed by ion implantation. In such a process, a photoresist mask 614 can be formed over the n type transistor region and the p type transistor region left unmasked. P type dopants are then ion implanted into the semiconductor body 512 in alignment with opposite side of sacrificial gate electrode 606. Additionally, the ion implantation process implants p type dopants, into the sacrificial gate electrode 606. When the semiconductor body 512 is silicon and the sacrificial gate electrode is polycrystalline silicon, boron ions can be implanted at a dose and at an energy well known in the art to subsequently form a boron concentration between $1\times10^{19}$ to $1\times10^{21}$ atoms/cm$^3$ in the polycrystalline silicon sacrificial gate electrode 606 and silicon body 512. Because the dopants have not yet been activated at this time by a high temperature process, the dopants reside at interstitial sites in the lattice, and have not yet substituted with atoms in the lattice. The sacrificial gate electrode 606 masks the channel region 609 of the p type device from being doped with p type impurities during the heavy source/drain implant. Additionally, the sidewall spacers 612 prevent the underlying previously formed tip regions in the semiconductor body 512 from being doped by the heavy source/drain implant.

Next, the photoresist mask 614 is removed. A photoresist mask 616 is then formed over the p type transistor region and the n type transistor region left unmasked as shown in FIG. 6F. Next, n type conductivity ions are ion implanted into the semiconductor body 510 on opposite sides of sacrificial gate electrode 604 in order to form heavily doped source and drain regions. The sacrificial gate electrode 604 masks the channel region of the n type device from being doped during the heavy source/drain formation step. Additionally, the sidewall spacers 612 prevent the underlying previously formed tip regions in the semiconductor body 510 from being doped by the heavy source/drain implants. The heavy source/drain implant also dopes polysilicon sacrificial gate electrode 604 with n type impurities. The polysilicon sacrificial gate electrode becomes doped at this time with n type dopants. Because the dopants have not yet been activated by a high temperature process the dopants reside at interstitial sites in the lattices of the sacrificial gate electrode 604 and the semiconductor body 510, and have not yet substituted with atoms in the lattice. In an embodiment of the present invention, when the semiconductor body 510 and the sacrificial gate electrode are silicon, arsenic or phosphorous atoms can be implanted at a dose and an energy well known in the art to subsequently form an arsenic or phosphorous concentration between $1\times10^{19}$ to $1\times10^{21}$ atoms/cm$^3$.

Next, as shown in FIG. 6G, the substrate is annealed to activate the dopants placed in the semiconductor bodies 510 and 512. Additionally, the activation anneal also activates the dopants placed into the sacrificial gate electrodes 604 and 606. That is, the substrate is now annealed to a temperature and for a time sufficient to cause the n type dopants in semiconductor body 510 and the p type dopants in semiconductor body 512 to move from interstitial sites an substitute with atoms in the lattice to form n type source and drain regions 613 in semiconductor body 510 and p type source and drain regions 615 in semiconductor body 512. In an embodiment of the present invention, the anneal causes a formation of tip regions and heavy source/drain contact regions with a concentration in the range of $1\times10^{19}$ atoms/ cm$^3$ to 1×10$^{21}$ atoms/cm$^3$. The anneal also causes the n type dopants placed into the sacrificial gate electrode 604 to move from interstitial sites and substitute with atoms in the lattice of the sacrificial gate electrode 604. Additionally, the anneal also causes the p type dopants to move from interstitial sites in the sacrificial gate electrode 606 and substitute with atoms in the lattice of the sacrificial gate electrode 606.

In an embodiment of the present invention, when the sacrificial gate electrodes are polycrystalline silicon, boron atoms substitute with silicon atoms in the lattice of sacrificial gate electrode 606 and phosphorous atoms substitute with silicon atoms in the lattice of sacrificial gate electrode 604. Because boron atoms are smaller than silicon atoms, boron atoms form closer and tighter bonds with silicon atoms in the lattice than do silicon atoms. The result is that the silicon lattice is no longer symmetrical throughout resulting in "an energy dump" of the lattice. When the silicon lattice in the polycrystalline sacrificial gate electrode 618 less symmetrical or distorted the crystal lattice can be said to be "non-degenerate". The making of the crystal lattice "non-degenerate" and resulting energy dump makes the boron doped polycrystalline sacrificial silicon film more stable and requires a higher activation energy in order to etch than an undoped polysilicon film or a polysilicon film that is symmertric or "degenerate". As such, as shown in FIG. 6G, the thermal activation of the boron dopants in the sacrificial polysilicon gate electrode 606 converts the sacrificial gate electrode 606 into an altered sacrificial gate electrode 618 which has a different etching characteristics than the unaltered sacrificial gate electrode. It is to be noted that the activation of the phosphorous atoms in the polycrystalline sacrificial gate electrode 604 also causes the silicon lattices to become distorted or "non-degenerate" but to a much lesser extent than the boron atoms in the sacrificial polysilicon gate electrode 606. Since the phosphorous dopants cause only a slight distortion of the silicon lattice of the polysilicon sacrificial gate electrode 604 (i.e. only slightly make the lattices "non-degenerate"), the sacrificial gate electrode 604 can be considered unaltered. The result of the implantation and activation is the formation of an altered sacrificial gate electrode 618 and an unaltered sacrificial gate electrode 604 which have different lattice energies and energy barriers which can be exploited to enable the selective etching of the unaltered sacrificial gate electrode without etching of the altered sacrificial gate electrode.

Next, as shown in FIG. 6H, a dielectric layer 620 is blanket deposited over the substrate. The dielectric layer is formed to a thickness sufficient to completely cover the substrate including sacrificial gate electrodes 604 and altered sacrificial gate electrode 618. A dielectric layer 620 is formed of a material which can be selectively etched with respect to the altered and unaltered sacrificial gate materials 618 and 604. That is, a dielectric material is formed of a material whereby the sacrificial gate electrode 604 and the altered sacrificial gate electrode 618 can be removed without significantly etching away the dielectric layer 620. After blanket depositing the dielectric layer, the dielectric layer is planarized, such as by chemical mechanical planarization, until the top surface of the dielectric film is planar with the sacrificial gate electrode 604 and altered sacrificial gate electrode 618, and the top surface of the sacrificial gate electrode 604 and the altered sacrificial gate electrode 618 exposed as shown in FIG. 6H.

Next, as shown in FIG. 6I, the sacrificial gate electrode 604 is now removed without removing altered sacrificial gate electrode 618. After sacrificial gate electrode 604 is removed, the sacrificial gate dielectric layer 602 is also removed. Removal of the sacrificial gate electrode 604 forms an opening 622 where the gate electrode for the n type device will be formed. Removing the sacrificial gate electrode 604 and the sacrificial dielectric layer 602 exposes the channel region 611 of the semiconductor body 510 of the nonplanar n type device as shown in FIG. 6I.

The sacrificial gate electrode 604 is removed with an etchant which can etch away sacrificial gate electrode material 604 without significantly etching away the altered sacrificial gate electrode materials 618. In an embodiment of the present invention, the sacrificial gate electrode 604 is removed with a wet etchant. In an embodiment of the present invention, the wet etchant has a sacrificial gate electrode material to altered sacrificial gate electrode material selectivity of great than 100:1 (i.e., the wet etchant etches the sacrificial gate electrode material at least 100 times faster than the altered sacrificial gate electrode material). In an embodiment of the present invention, the n type polycrystalline silicon sacrificial gate electrode material 604 is removed with a wet etchant. In an embodiment of the present invention, megasonic energy is applied while the sacrificial gate electrode 604 is removed with the wet etchant. In an embodiment of the present invention, an n type polysilicon sacrificial gate electrode material 604 is removed with a wet etchant comprising a metallic hydroxide, such as but not limited to potassium hydroxide (KOH) or ammonium hydroxide (NH$_4$OH). In an embodiment of the present invention, the sacrificial polycrystalline sacrificial silicon gate electrode 604 is removed with a wet etchant comprising ammonium hydroxide and water comprising between 1–30% ammonium hydroxide by volume. In an embodiment of the present invention, the ammonium hydroxide and water etchant is heated to a temperature of between 15–45° C. and megasonic or ultrasonic energy is applied to the solution during the etch process. In an embodiment of the present invention, the substrate is spun while removing sacrificial gate electrode 604. In an embodiment of the present invention, the sacrificial gate electrode 604 is removed with an etchant which does not have a sufficient activation energy or chemical energy to overcome the activation energy barrier for crystal lattice of the altered sacrificial gate electrode 618. In this way, the altered sacrificial gate electrode 618 remains unetched during the etching of the sacrificial gate electrode 604. The present invention enables the removal of the sacrificial gate electrode 604 for the n type device without removing the sacrificial gate electrode for the p type device and does so without requiring a mask or other photolithographic processing steps. As such, the sacrificial gate electrode 604 is removed with a maskless approach thereby saving expensive lithographic process steps and making the present invention manufacturable. Once the sacrificial gate electrode material 604 has been removed, the etchant stops on the sacrificial dielectric layer 602. In an embodiment of the present invention, the sacrificial dielectric layer 602 is an oxide and has a selectivity to the sacrificial gate electrode of at least 10:1. Next, the sacrificial gate dielectric layer 602 is removed with an etchant, such as but not limited to aqueous hydrofluoric acid.

Next, the gate dielectric layer and the gate electrode material for the n type device are formed in the openings 622 as shown in FIG. 6J. First the gate dielectric film 624 is blanket deposited over the substrate. The gate dielectric material covers the top surface of the sidewalls of the channel region of semiconductor body 510 as described above. The gate dielectric material can be formed by any well known process. In an embodiment of the present invention, thermal oxidation process, such as a dry/wet oxidation is used to grow the gate dielectric layer, such as a silicon dioxide or silicon oxynitride delectric. In another embodiment of the present invention a conformal deposition process, such as CVD or ALD is used to deposit a high K gate dielectric layer. Next, a gate electrode material for the n type device is blanket deposited over the gate dielectric. The gate electrode material 626 may be any well known gate electrode material. In an embodiment of the present invention, the gate electrode material has a work function tailored for an n type device. In an embodiment of the present invention, the gate electrode has a work function between 3.9 eV to 4.2 eV. In an embodiment of the present invention, when the semiconductor body 510 is p type silicon, the gate electrode material is selected from the group consisting of hafnium, zirconium, titanium, tantalum, aluminum, with a work function between about 3.9 eV and about 4.2 eV. Next, the gate electrode material 626 is planarized until the top surface of the dielectric layer 620 is revealed as shown in FIG. 6K. Once a gate electrode material and the gate dielectric material are polished back or removed from the top dielectric film 620, a gate electrode 628 is formed for the n type nonplanar device.

Next, as shown in FIG. 6L, altered sacrificial gate electrode 618 is now removed without removing gate electrode 628 for the n type device. After the altered sacrificial gate electrode 618 is removed the sacrificial gate oxide 602 is removed. Removal of altered sacrificial gate electrode 618 and the sacrificial gate dielectric layer 602 exposes the channel region 609 of the semiconductor body 512 of the nonplanar p type device as shown in FIG. 6L. Additionally, removal of the altered sacrificial gate electrode 618 forms an opening 630 in dielectric layer 620 where the gate electrode for the p type device will subsequently be formed. In an embodiment of the present invention, the boron doped polysilicon sacrificial gate electrode 618 is removed utilizing a wet etchant comprising tetramethylammonium hydroxide and water. In an embodiment of the present invention, tetramethylammonium hydroxide comprises between 10–35% of the solution by volume. In an embodiment of the present invention, the tetramethylammonium hydroxide solution is heated to a temperature between 60–95° C. during the etching. In an embodiment of the present invention, sonic energy such as, ultrasonic or megasonic energy, is applied during the etch process. Sonic energy provides agitation to the etchant which enables etch residue from altered sacrificial gate electrode to be removed from opening 630 and allows new etchant to enter into trench 630 to etch the sacrificial gate 618.

In an embodiment of the present invention, the sacrificial gate electrode etchant is selective to the sacrificial gate dielectric layer (i.e., does not etch or only slightly etches sacrificial gate dielectric) so that the sacrificial gate dielectric 602 acts as an etch stop for the sacrificial gate electrode 618 etch. In this way, the underlying semiconductor body 512 is protected from the etchant. A sacrificial gate electrode 618 to sacrificial gate dielectric etch selecting of at least 10:1, is desired.

Next, the sacrificial gate dielectric is removed. In an embodiment of the present invention, the sacrificial gate dielectric is an oxide and can be removed with an etchant comprising aqueous hydrofluoric acid.

Next, as shown in FIG. 6M, a gate dielectric film 632 for the p type device is blanket deposited over the substrate. The gate dielectric film 632 covers the top surface and sidewalls of the channel region 609 of semiconductor body 512 as described above. The gate dielectric layer 630 can be formed by any well known process. In an embodiment of the present invention, the gate dielectric is a thermally grown oxide, such as silicon oxide or silicon oxynitride. In an embodiment of the present invention, the gate dielectric is a deposited oxide deposited by a conformal process, such as CVD or ALD. The gate dielectric layer can comprise a high k insulating film selected from the group consisting of tantalum oxide, titanium oxide, hafnium oxide, zirconium oxide, PZT, BST, aluminum oxide, and silicate thereof. The blanket deposition of the gate dielectric layer 632 forms the gate dielectric layer over the insulating layer 620 as well as on top of the exposed portion of gate electrode. Next, the gate electrode material 634 for the p type device is blanket deposited over the gate dielectric layer 632. The gate electrode material 634 may be any well known gate electrode material. In an embodiment of the present invention, the gate electrode material is a metal film which has a work function tailored for a p type device. In an embodiment of the present invention, when the semiconductor body 512 is n type silicon the gate electrode material comprises ruthenium, palladium, platinum, cobalt, nickel, and conductive metal oxides, with a work function between about 4.9 eV and 5.2 eV. In an embodiment of the present invention, the gate electrode has a work function between 4.9 to 5.2 eV.

Next, as shown in FIG. 6N, the gate electrode material 634 and gate dielectric layer 636 formed on the top surface of dielectric film 620 are removed from a top surface dielectric film 620 to form the gate electrode 636 for the p type device and expose gate electrode 628 for the n type device. The gate dielectric layer and gate electrode material 632 formed on top of the dielectric layer 620 can be removed by, for example, chemical mechanical polishing or other suitable means. At this point, fabrication of an n type device with a metal gate electrode and a p type device with a metal gate electrode utilizing a replacement gate process has been formed. If desired, dielectric layer 620 may now be removed to expose the p type and n type nonplanar device as shown in FIG. 6O. Processing can now be utilized to form, for example, silicide on the source and drain regions and to interconnect the n type nonplanar transistor and p type nonplanar transistor together into functional integrated circuits to form a complimentary metal oxide semiconductor (CMOS) integrated circuit.

Thus, an n type nonplanar transistor with a metal gate electrode and a p type nonplanar transistor with a metal gate electrode and their methods of fabrication CMOS process have been described.

The invention claimed is:

1. A method of forming a semiconductor device comprising:
   forming a semiconductor body having a top surface and laterally opposite sidewalls on a substrate wherein said semiconductor body has a channel region with a p type conductivity;
   forming a gate dielectric on said top surface of said semiconductor body and on said laterally opposite sidewalls of said semiconductor body;
   forming a gate electrode on said gate dielectric and adjacent to said gate dielectric on said laterally opposite sidewalls of said semiconductor body, wherein said gate electrode comprises a metal film formed directly adjacent to said gate dielectric wherein said gate electrode has a work function between 3.9–4.2 eV; and
   forming a pair of source/drain regions formed in said semiconductor body on opposite sides of said gate electrode.

2. The method of claim 1 wherein said gate electrode comprises only said metal film.

3. The method of claim 1 wherein said gate electrode further comprises a doped silicon film formed on said metal film.

4. The method of claim 3 wherein said metal film is formed to a thickness between 25–100 Å and said doped silicon film is formed to a thickness between 500–3000 Å.

5. The method of claim 1 wherein said gate dielectric is selected from the group consisting of tantalum oxide, titanium oxide, hafnium oxide, zirconium oxide, PZT, BST, aluminum oxide, and silicates thereof.

6. A method of forming a CMOS integrated circuit comprising:
   forming a first and a second semiconductor body on an insulating substrate said first and second semiconductor bodies each having a top surface and a bottom surface and a pair of laterally opposite sidewalls;
   forming a first silicon sacrificial gate electrode above said top surface of said first semiconductor body and adjacent to said laterally opposite sidewalls of said semiconductor body, and forming a second silicon sacrificial gate electrode above said top surface of said second semiconductor body and adjacent to said laterally opposite sidewalls of said second semiconductor body;
   placing n type dopants into said first silicon sacrificial gate electrode and into said semiconductor body on opposite sides of said first silicon sacrificial gate electrode;
   placing p type dopants into said second sacrificial silicon gate electrode and into said second semiconductor body on opposite sides of said second sacrificial gate electrode;
   activating said n type and p type dopants so that said n type and p type dopants become substitutional with silicon atoms in said first and second sacrificial silicon gate electrodes;
   forming a dielectric layer over said first and second sacrificial gate electrode and over said first and second semiconductor bodies and over said insulating substrate;
   planarizing said dielectric layer until the top surface of said dielectric layer is planar with the top surface of said first and second silicon sacrificial gate electrodes and said first and second sacrificial gate electrodes exposed;
   removing said first sacrificial gate electrode without removing said second sacrificial gate electrode to form a first opening which exposes the channel region of said first semiconductor body;
   forming a gate dielectric layer in said first opening on said top surface and said sidewalls of the channel region of said first semiconductor body;
   blanket depositing a first gate electrode material on said gate dielectric layer in said opening on said top surface of said semiconductor body and adjacent to said gate dielectric on said sidewalls of said semiconductor body, wherein said first gate electrode material comprises a first metal film formed directly on and adjacent to said first gate dielectric layer;
   removing said first gate electrode material from the top surface of said dielectric film to form a first gate electrode;
   removing said second sacrificial gate electrode to form a second opening which exposes the second channel region of said second semiconductor body;
   forming a second gate dielectric layer in said second opening on said top surface and sidewalls of said channel region of said second semiconductor body;
   blanket depositing a second gate electrode material on said second gate dielectric layer in said second opening on said top surface of said second semiconductor body and adjacent to said second gate dielectric layer on said sidewalls of said semiconductor body, wherein said second gate electrode material comprises a second metal film formed directly on said gate dielectric layer wherein said second metal film is different than said first metal film; and
   removing said second gate electrode material from the top surface of said dielectric film to form a second gate electrode.

7. The method of claim 6 wherein said first and second semiconductor bodies are formed from single crystalline silicon.

8. The method claim 6 wherein said insulating substrate comprises a lower monocrystalline silicon substrate and a top silicon oxide insulating film.

9. The method of claim 6 wherein said first metal film is selected from the group consisting of hafnium, zirconium, titanium, tantalum, aluminum, with a workfunction between about 3.9 eV and about 4.2 eV.

10. The method of claim 6 wherein said second metal film is selected from the group consisting of ruthenium, palladium, platinum, cobalt, nickel, and conductive metal oxides, with a workfunction between about 4.9 eV and 5.2 eV.

11. The method of claim 6 wherein said first sacrificial gate electrode is removed without masking said second sacrificial gate electrode.

12. The method of claim 6 wherein said first gate electrode is removed utilizing an etchant selected from the group consisting of ammonium hydroxide and potassium hydroxide.

13. The method of claim 6 wherein said second sacrificial gate electrode is removed utilizing a wet etchant comprising tetra methyl ammonia hydroxide.

14. The method of claim 6 further comprising forming a first pair of sidewall spacers adjacent to said laterally opposite sidewalls of said first sacrificial gate electrode and forming a second pair of sidewall spacers adjacent to laterally opposite sidewalls of said second sacrificial gate electrode.

15. The method of claim 6 further comprising forming silicon on said first and second semiconductor bodies adjacent to said sidewall spacers.

16. The method of claim 15 further comprising forming silicide on said silicon formed on said first semiconductor body adjacent to said first sidewall spacers and forming silicide on said silicon film formed on said second semiconductor body adjacent to said second sidewall spacers.

17. A method of forming an integrated circuit comprising:
   forming a first sacrificial gate electrode over a channel region of a first semiconductor body and forming a second sacrificial gate electrode over a second channel region of a second semiconductor body;
   altering said first sacrificial gate electrode and/or said second sacrificial gate electrode such that said first sacrificial gate electrode can be etched with an etchant without etching said second sacrificial gate electrode;
   forming a dielectric layer over said first sacrificial gate electrode, and said second sacrificial gate electrode, and said first semiconductor body and said second semiconductor body;
   planarizing said dielectric layer so as to expose said top surface of said first sacrificial gate electrode and said second sacrificial gate electrode;

after altering said first sacrificial gate electrode and/or said second sacrificial gate electrode etching said first sacrificial gate electrode with said etchant without etching said second sacrificial gate electrode to form an opening and expose said channel region of said first semiconductor body;

depositing a first metal film in said opening and over the top of said semiconductor body and adjacent to the sidewalls of said semiconductor body and on the top surface of said dielectric layer;

removing said first metal film from the top of said dielectric layer to form a metal gate electrode;

removing said second sacrificial gate electrode material to form a second opening;

forming a second metal film different than said first metal film over said dielectric layer and into said second opening; and removing said second metal film from the top surface of said dielectric layer to form a second metal gate electrode.

18. The semiconductor device of claim 17 wherein first metal film has a work function between 3.9 eV and 4.2 eV.

19. The method of claim 17 wherein said second metal film has a work function between 4.9 eV to 5.2 eV.

20. The method of claim 17 wherein said first sacrificial gate electrode and/or said second sacrificial gate electrode are altered by placing dopants therein.

21. The method of claim 17 wherein both said first and said second sacrificial gate electrode materials are exposed to said etchant.

22. A method of forming a semiconductor device comprising:

forming a semiconductor body having a top surface and laterally opposite sidewalls on a substrate wherein said semiconductor body has a channel region with a n type conductivity;

forming a gate dielectric on said top surface of said semiconductor body and on said laterally opposite sidewalls of said semiconductor body;

forming a gate electrode on said gate dielectric and adjacent to said gate dielectric on said laterally opposite sidewalls of said semiconductor body, wherein said gate electrode comprises a metal film formed directly adjacent to said gate dielectric wherein said gate electrode has a work function between 4.9–5.2 eV; and forming a pair of source/drain regions formed in said semiconductor body on opposite sides of said gate electrode.

23. The method of claim 22 wherein said gate electrode comprises only said metal film.

24. The method of claim 22 wherein said gate electrode further comprises a doped silicon film formed on said metal film.

25. The method of claim 24 wherein said metal film is formed to a thickness between 25–100 Å and said doped silicon film is formed to a thickness between 500–3000 Å.

26. The method of claim 22 wherein said gate dielectric is selected from the group consisting of tantalum oxide, titanium oxide, hafnium oxide, zirconium oxide, PZT, BST, aluminum oxide, and silicates thereof.

27. A method of forming a CMOS integrated circuit comprising:

forming a first semiconductor body having a top surface and laterally opposite sidewalls on a substrate, wherein said first semiconductor body has a channel region with an p type conductivity and forming a second semiconductor body having a top surface and laterally opposite sidewalls on said substrate, wherein said second semiconductor body has a channel region with an n type conductivity;

forming a first gate dielectric layer on said channel region of said first semiconductor body and forming a second gate dielectric layer on said channel region of said second semiconductor body;

forming a first gate electrode on said first gate dielectric layer wherein said first gate electrode includes a first metal film formed directly on said first gate dielectric layer and wherein said first gate electrode has a work function between 3.9–4.2 eV and forming a second gate electrode on said second gate dielectric layer wherein said second gate electrode has a second metal film formed directly on said second gate dielectric layer and wherein said second gate electrode has a work function between 4.9–5.2 eV; and forming a first pair of source/drain region in said first semiconductor body on opposite sides of said first gate electrode and forming a second pair of source/drain regions in said second semiconductor body on opposite sides of said second gate electrode.

28. The method of claim 27 wherein said first gate electrode comprises only said first metal film and said second gate electrode comprises only said second metal film.

29. The method of claim 27 wherein said first gate electrode and said second gate electrode further comprise a doped silicon film formed on said first metal film and said second metal film.

30. The method of claim 29 wherein said first metal film and said second metal film are formed to a thickness between 25–100 Å and said doped silicon film is formed to a thickness between 500–300 Å.

31. The method of claim 27 wherein said first gate dielectric layer and second gate dielectric layer are selected from the group consisting of tantalum oxide, titanium oxide, hafnium oxide, zirconium oxide, PZT, BST, aluminum oxide and silicates thereof.

32. A method of forming a CMOS integrated circuit comprising:

a first semiconductor body having a top surface and laterally opposite sidewalls of a substrate wherein said first semiconductor body has a channel region with a p type conductivity, and forming a second semiconductor body having a top surface and laterally opposite sidewalls on said substrate, wherein said second semiconductor body has a channel region with an n type conductivity;

forming a first gate dielectric layer on said channel region of said first semiconductor body and forming a second gate dielectric layer on said channel region of said second semiconductor body;

forming a first gate electrode on said first dielectric layer wherein said first gate electrode includes a first metal film formed directly on said first gate dielectric layer, and forming a second gate electrode on said second gate dielectric layer, wherein said second gate electrode has a second metal film formed directly on said second gate dielectric layer, wherein said second gate electrode has a work function of approximately 1.0 eV or greater than the work function of said first gate electrode.

33. The method of claim 32 wherein said first gate electrode comprises only said first metal film and said second gate electrode comprises only said second metal film.

34. The method of claim 33 wherein said first gate electrode and said second gate electrode further comprise a doped silicon film formed on said first metal film and said second metal film.

35. The method of claim 34 wherein said first metal film and said second metal film are formed to a thickness between 25–100 Å and said doped silicon film is formed to a thickness between 500–300 Å.

36. The method of claim 32 wherein said first gate dielectric layer and second gate dielectric layer are selected from the group consisting of tantalum oxide, titanium oxide, hafnium oxide, zirconium oxide, PZT, BST, aluminum oxide and silicates thereof.

* * * * *